United States Patent
Dang et al.

(10) Patent No.: US 12,502,460 B2
(45) Date of Patent: Dec. 23, 2025

(54) THERAPEUTIC HYDROGEL DEVICE

(71) Applicant: Nanyang Technological University, Singapore (SG)

(72) Inventors: Thuy Tram Dang, Singapore (SG); Yang Chen, Singapore (SG); Tri Dang Nguyen, Singapore (SG); Yicong Zuo, Singapore (SG)

(73) Assignee: Nanyang Technological University, Singapore (SG)

( * ) Notice: Subject to any disclaimer, the term of this patent is extended or adjusted under 35 U.S.C. 154(b) by 863 days.

(21) Appl. No.: 17/600,048

(22) PCT Filed: Mar. 30, 2020

(86) PCT No.: PCT/SG2020/050193
§ 371 (c)(1),
(2) Date: Sep. 29, 2021

(87) PCT Pub. No.: WO2020/204829
PCT Pub. Date: Oct. 8, 2020

(65) Prior Publication Data
US 2022/0184280 A1   Jun. 16, 2022

(30) Foreign Application Priority Data
Mar. 29, 2019 (SG) .............. 10201902844S

(51) Int. Cl.
*A61L 27/38* (2006.01)
*A61K 35/39* (2015.01)
(Continued)

(52) U.S. Cl.
CPC .......... *A61L 27/3804* (2013.01); *A61K 35/39* (2013.01); *A61K 35/44* (2013.01); *A61L 27/3886* (2013.01); *A61L 27/52* (2013.01)

(58) Field of Classification Search
CPC .. A61L 27/52; A61L 27/3886; A61L 27/3804; A61K 9/0019; A61K 9/5036;
(Continued)

(56) References Cited

U.S. PATENT DOCUMENTS 7,427,415 B2   9/2008  Scharp et al.
9,422,524 B2   8/2016  Apeldoorn et al.
(Continued)

FOREIGN PATENT DOCUMENTS

WO      2018055452 A1      3/2018
WO   WO 2018091677 A1 *   5/2018
(Continued)

OTHER PUBLICATIONS

Foreign Communication from a Related Counterpart Application, International Search Report and Written Opinion dated Sep. 16, 2020, International Application No. PCT/SG2020/050193 filed on Mar. 30, 2020.

(Continued)

*Primary Examiner* — Hong Yu
(74) *Attorney, Agent, or Firm* — Conley Rose, P.C.

(57) ABSTRACT

The present invention generally relates to a therapeutic hydrogel device. More particularly, the present invention describes various embodiments of a hydrogel macrodevice, such as a planar hybrid hydrogel macrodevice that can achieve spatially controlled distribution of microtissues and support establishment of intra-device vasculature for enhanced cell survival, and individually encapsulated microtissues, and methods of use.

23 Claims, 32 Drawing Sheets

Figure 25

(51) Int. Cl.
*A61K 35/44* (2015.01)
*A61L 27/52* (2006.01)

(58) Field of Classification Search
CPC ........ A61K 35/39; A61K 35/44; A61K 47/36; A61P 3/10
See application file for complete search history.

(56) References Cited

U.S. PATENT DOCUMENTS

| | | | |
|---|---|---|---|
| 9,555,007 | B2 | 1/2017 | Ma et al. |
| 9,867,781 | B2 | 1/2018 | Anderson et al. |
| 2012/0251587 | A1* | 10/2012 | Van Apeldoorn .... C12N 5/0068 424/400 |
| 2017/0065746 | A1* | 3/2017 | Nikkhah ............ A61K 38/1866 |
| 2018/0085494 | A1 | 3/2018 | Fawdry et al. |
| 2018/0119106 | A1* | 5/2018 | Millman ................ A61K 45/06 |

FOREIGN PATENT DOCUMENTS

| | | |
|---|---|---|
| WO | 2020168327 A1 | 8/2020 |
| WO | 2020204829 A1 | 10/2020 |

OTHER PUBLICATIONS

M. Iwase, et al., "Formation of Cell Aggregates Using Microfabricated Hydrogel Chambers for Assembly into Large Tissue", J. Robot, Mechatron, Aug. 20, 2013, vol. 25, No. 4, pp. 682-689, <DOI: 10.20965/JRM.2013.P0682>.

A. P. Napolitano, et al., "Dynamics of the Self-Assembly of Complex Cellular Aggregates on Micromolded Nonadhesive Hydrogels", Tissue Engineering, Aug. 14, 2007, vol. 12, No. 8, pp. 2087-2094, <DOI: 10.1089/TEN.2006.0190>.

Y. Chen, et al., "Microencapsulated islet-like microtissues with toroid geometry for enhanced callular viability", Acta Biomaterialia, Aug. 9, 2019, vol. 97, pp. 260-271, <DOI: 10.1016/J.ACTBIO.2019.08.018>.

Paull, et al., "Automated, high-throughput derivation, characterization and differentiation of induced pluripotent stem cells", Nature Methods, vol. 12 (9), Sep. 2015, 885-892.

Pellegrini, et al., "The state of the art of islet transplantation and cell therapy in type 1 diabetes", Acta Diabetol, vol. 53 (5), 2016, 683-691, DOI 10.1007/s00592-016-0847-z.

Rago, et al., "Encapsulated Arrays of Self-Assembled Microtissues: An Alternative to Spherical Microcapsules", Tissue Engineering: Part A, vol. 15 (2), 2009, 387-395, DOI: 10.1089=ten.tea.2008.0107.

Ramachandran, et al., "Engineering Islets for Improved Performance by Optimized Reaggregation in a Micromold", Tissue Engineering: Part A, vol. 19 (5-6), 2012, 604-612, DOI: 10.1089/ten.tea.2012.0553.

Reynolds, et al., "Investigation of the Effect of Tablet Surface Area/Volume on Drug Release from Hydroxypropylmethylcellulose Controlled-Release Matrix Tablets", Drug Development and Industrial Pharmacy, vol. 28 (4), 2002, 457-466, https://doi.org/10.1081/DDC-120003007.

Rouiller, et al., "Uvomorulin Mediates Calcium-Dependent Aggregation of Islet Cells, Whereas Calcium-Independent Cell Adhesion Molecules Distinguish Between Islet Cell Types", Developmental Biology, vol. 148 (1), Jul. 1991, 233-242.

Rouwkema, et al., "Vascularization and Angiogenesis in Tissue Engineering: Beyond Creating Static Networks", Trends in Biotechnology, Sep. 2016, vol. 34(9), 733-745.

Saelens, et al., "Toxic proteins released from mitochondria in cell death", Oncogene, vol. 23 (16), 2004, 2861-2874, doi:10.1038/sj.onc.1207523.

Saisho, "Pancreas Volume and Fat Deposition in Diabetes and Normal Physiology: Consideration of the Interplay Between Endocrine and Exocrine Pancreas", The Review of Diabetic Studies, vol. 13 (2-3), 2016, 16 pages.

Schell, et al., "Harnessing cellular-derived forces in self-assembled microtissues to control the synthesis and alignment of ECM", Biomaterials, vol. 77, 2016, 120-129, http://dx.doi.org/10.1016/j.biomaterials.2015.10.080.

Shapiro, et al., "Clinical pancreatic islet transplantation", Nature Reviews | Endocrinology, vol. 13 (5), 2017, 268-277, doi:10.1038/nrendo.2016.178.

Sigmundsson, et al., "Culturing functional pancreatic islets on alpha5-laminins and curative transplantation to diabetic mice", Matrix Biology, vol. 70, 2018, 5-19.

Song, et al., "Progress and Challenges in Macroencapsulation Approaches for Type 1 Diabetes (T1D) Treatment: Cells, Biomaterials, and Devices", Biotechnology and Bioengineering, Jul. 2016, vol. 113(7), 1381-1402.

Tuch, et al., "Safety and Viability of Microencapsulated Human Islets Transplanted Into Diabetic Humans", Diabetes Care, vol. 32 (10), Oct. 2009, 1887-1889.

Ungphaiboon, et al., "Materials for microencapsulation: what toroidal particles ("doughnuts") can do better than spherical beads", Soft Matter, vol. 6 (17), 2010, 4070-4083, DOI: 10.1039/c0sm00150c.

Veiseh, et al., "Size- and shape-dependent foreign body immune response to materials implanted in rodents and non-human primates", Nature Materials, vol. 14 (6), May 2015, 643-651, DOI: 10.1038/NMAT4290.

Wilson, et al., "Challenges and emerging technologies in the immunoisolation of cells and tissues", Advanced Drug Delivery Reviews, vol. 60 (2), 2008, 124-145, doi: 10.1016/j.addr.2007.08.034.

Nafea, et al., "Immunoisolating semi-permeable membranes for cell encapsulation: Focus on hydrogels", Journal of Controlled Release, vol. 154, 2011, 110-122, doi:10.1016/j.jconrel.2011.04.022.

Kusuma, et al., "Self-organized vascular networks from human pluripotent stem cells in a synthetic matrix", PNAS, Jul. 30, 2013, vol. 110, No. 31, 12601-12606, www.pnas.org/cgi/doi/10.1073/pnas.1306562110.

Xu, et al., "Complex heterogeneous tissue constructs containing multiple cell types prepared by inkjet printing technology", Biomaterials, vol. 34, 2013, 130-139, http://dx.doi.org/10.1016/j.biomaterials.2012.09.035.

Drzewiecki, et al., "A thermoreversible, photocrosslinkable collagen bio-ink for free-form fabrication of scaffolds for regenerative medicine", Technology, vol. 5, No. 4, Dec. 2017, 11 pages, doi:10.1142/S2339547817500091.

Accardo, et al., "Two-photon lithography and microscopy of 3D hydrogel scaffolds for neuronal cell growth", Biomedical Physics and Engineering Express 4, 2018, 9 pages, https://doi.org/10.1088/2057-1976/aaab93.

Song, et al., "Engineering transferrable microvascular meshes for subcutaneous islet transplantation", Nature Communications, 2019, vol. 10:4602, 12 pages, https://doi.org/10.1038/s41467-019-12373-5.

An, et al., "Designing a retrievable and scalable cell encapsulation device for potential treatment of type 1 diabetes", PNAS Early Edition, 2017, 38 pages, www.pnas.org/cgi/doi/10.1073/pnas.1708806115.

Clua-Ferre, et al., "Collagen-Tannic Acid Spheroids for B-cell Encapsulation Fabricated Using a 3D Bioprinter", Advanced Materials Technology, 2022, 12 pages, DOI: 10.1002/admt.202101696.

David, et al., "Immunoisolation to prevent tissue graft rejection: Current knowledge and future use", Experimental Biology and Medicine, 2016; vol. 241, 955-961, DOI: 10.1177/1535370216647129.

Harrington, et al., "PEGDA microencapsulated allogeneic islets reverse canine diabetes without immunosuppression", PLOS One, May 2022, 20 pages, https://doi.org/10.1371/journal.pone.0267814.

Hu, et al., "Polymeric Approaches to Reduce Tissue Responses Against Devices Applied for Islet-Cell Encapsulation", Frontiers in Bioengineering and Biotechnology, Jun. 2019, vol. 7, Article 134, 21 pages, doi: 10.3389/fbioe.2019.00134.

Huang, et al., "Co-transplantation of Islets-Laden Microgels and Biodegradable O2-Generating Microspheres for Diabetes Treatment", ACS Applied Materials and Interfaces, 2022, 14, 38448-38458, https://doi.org/10.1021acsami.2c07215.

(56) References Cited

OTHER PUBLICATIONS

Kobayashi, et al., "Indefinite Islet Protection From Autoimmune Destruction in Nonobese Diabetic Mice by Agarose Microencapsulation Without Immunosuppression", Transplantation, vol. 75, 619-625, No. 5, Mar. 15, 2003, DOI: 10.1097/01.TP.0000053749.36365.7E.

Lee, et al., "Uniform-sized neurosphere-mediated motoneuron differentiation in microwell arrays", Electrophoresis, 2017, vol. 38, 3161-3167, DOI 10.1002/elps.201700118.

Lee, et al., "Visible light-crosslinkable tyramine-conjugated alginate-based microgel bioink for multiple cell-laden 3D artificial organ", Carbohydrate Polymers, vol. 313, 2023, https://doi.org/10.1016/j.carbpol.2023.120895.

Li, et al., "Preparation and characterization of photocurable composite extracellular matrix-methacrylated hyaluronic acid bioink", Journal of Materials Chemistry B, 2022, vol. 10, 4242-4253, DOI: 10.1039/d2tb00548d.

Liu, et al., "Matrix-specific activation of Src and Rho initiates capillary morphogenesis of endothelial cells", The FASEB Journal, vol. 18, Mar. 2004, 12 pages, doi: 10.1096/fj.03-0948com.

Orive, et al., "Cell encapsulation: Promise and progress", Nature Medicine, vol. 9, No. 1, Jan. 2003, 5 pages, DOI: 10.1038/nm0103-104.

Wang, et al., "An encapsulation system for the immunoisolation of pancreatic islets", Nature Biotechnology, vol. 15, Apr. 1997, 5 pages.

Yang, et al., "Long-term Efficacy and Biocompatibility of Encapsulated Islet Transplantation With Chitosan-Coated Alginate Capsules in Mice and Canine Models of Diabetes", Transplantation, Feb. 2016, vol. 100, No. 2, 10 pages, DOI: 10.1097/TP.0000000000000927.

Foreign Communication from a Related Counterpart Application, Partial European Search Report dated Oct. 28, 2022, European Application No. 20784801.1 filed on Feb. 9, 2022.

Moon, et al., "Biomimetic hydrogels with pro-angiogenic properties", Biomaterials, vol. 31, 2010, 3840-3847, doi: 10.1016/j.biomaterials.2010.01.104.

Albelda, et al., "Molecular and cellular properties of PECAM-1 (endoCAM/CD31): A Novel Vascular Cell-Cell Adhesion Molecule", The Journal of Cell Biology, Sep. 1991, vol. 114(5), 1059-1068.

Avgoustiniatos, et al., "Effect of External Oxygen Mass Transfer Resistances on Viability of Immunoisolated Tissue", Annals of New York Academy of Sciences, 1997, 831(1 Bioartificial Organs: Science, Medicine, and Technology), 145-166.

Ballinger, et al., "Transplantation of intact pancreatic islets in rats", Surgery 72 (2), 1972, 175-186.

Baranski, et al., "Geometric control of vascular networks to enhance engineered tissue integration and function", Proceedings of the National Academy of Sciences, 2013, vol. 110(19), 7586-7591.

Barkai, et al., "Enhanced Oxygen Supply Improves Islet Viability in a New Bioartificial Pancreas", Cell Transplantation, vol. 22 (8), 2013, 1463-1476.

Berridge, et al., "Trans-plasma membrane electron transport: a cellular assay for NADH-and NADPH-oxidase based on extracellular, superoxide-mediated reduction of the sulfonated tetrazolium salt WST-1", Protoplasma 205 (1-4): (1998) 74-82.

Bertuzzi, et al., "Tissue factor and CCL2/monocyte chemoattractant protein-1 released by human islets affect islet engraftment in type 1 diabetic recipients", The Journal of Clinical Endocrinology & Metabolism, 89(11), Nov. 2004, 5724-5728.

Bhujbal, et al., "A novel multilayer immunoisolating encapsulation system overcoming protrusion of cells", Scientific Reports, 2014; 4: 6856, 8 pages, DOI: 10.1038/srep06856.

Bochenek, et al., "Alginate encapsulation as long-term immune protection of allogeneic pancreatic islet cells transplanted into the omental bursa of macaques", Nature Biomedical Engineering, 2018; vol. 2(11), 16 pages.

Boettler, et al., "Pancreatic Tissue Transplanted in TheraCyte Encapsulation Devices is Protected and Prevents Hyperglycemia in a Mouse Model of Immune-Mediated Diabetes", Cell Transplantation, 2016, vol. 25(3), 609-614.

Bosco, et al., "Homologous but Not Heterologous Contact Increases the Insulin Secretion of Individual Pancreatic B-cells", Experimental Cell Research, 184 (1), 1989, 72-80.

Bruni, et al., "Islet cell transplantation for the treatment of type 1 diabetes: recent advances and future challenges", Diabetes, Metabolic Syndrome and Obesity: Targets and Therapy, 2014:7, 211-223.

Chang, "Therapeutic Applications of Polymeric Artificial Cells", Nature Reviews, Drug Discovery, vol. 4, Mar. 2005, 221-235.

Chen, et al., "Prevascularization of a Fibrin-Based Tissue Construct Accelerates the Formation of Functional Anastomosis with Host Vasculature", Tissue Engineering: Part A, 2008, vol. 15(6), 1363-1371, DOI: 10. 1089=tentea.2008.0314.

Colton, "Oxygen supply to encapsulated therapeutic cells", Advanced Drug Delivery Reviews, 2014, 67-68, 93-110.

Conway, et al., "Scalable 96-well Plate Based iPSC Culture and Production Using a Robotic Liquid Handling System," Journal of Visualized Experiments, (99): e52755 (2015), doi: 10.3791/52755.

Coronel, et al., "Oxygen generating biomaterial improves the function and efficacy of beta cells within a macroencapsulation device", Biomaterials 210, (2019), 1-11.

Dahl, et al., "Cadherins regulate aggregation of pancreatic beta-cells in vivo", Development 122 (9), (1996), 2895-2902.

Dang, et al., "Enhanced function of immuno-isolated islets in diabetes therapy by co-encapsulation with an anti-inflammatory drug", Biomaterials 34 (23), (2013), 5792-5801.

Dean, et al., "Rods, tori, and honeycombs: the directed self-assembly of microtissues with prescribed microscale geometries", The FASEB Journal, vol. 21, Dec. 2007, 4005-4012.

DeLisser, et al., "Involvement of Endothelial PECAM-1/CD31 in Angiogenesis", American Journal of Pathology, Sep. 1997, vol. 151(3), 671-677.

Glicklis, et al., "Modeling Mass Transfer in Hepatocyte Spheroids via Cell Viability, Spheroid Size, and Hepatocellular Functions", Biotechnology Bioengineering, vol. 86 (6), 2004, 672-680, DOI: 10.1002/bit.20086.

De Groot, et al., "Causes of Limited Survival of Microencapsulated Pancreatic Islet Grafts", Journal of Surgical Research, vol. 121 (1), Sep. 2004, 141-150, doi:10.1016/j.jss.2004.02.018.

Desai, et al., "Advances in islet encapsulation technologies", Nature Reviews: Drug Discovery, vol. 16 , May 2017, 338-350.

De Vos, et al., "Association Between Capsule Diameter, Adequacy of Encapsulation, and Survival of Microencapsulated Rat Islet Allografts", Transplantation, 1996, vol. 62(7), 893-899.

Elliott, et al., "Live encapsulated porcine islets from a type 1 diabetic patient 9.5 yr after xenotransplantation", Xenotransplantation, vol. 14, 2007, 157-161, doi: 10.1111/j.1399-3089.2007.00384.x.

Enmon, Jr., et al., "Dynamics of Spheroid Self-Assembly in Liquid-Overlay Culture of DU 145 Human Prostate Cancer Cells", Biotechnology and Bioengineering, vol. 72 (6), Mar. 2001, 579-591.

Gao, et al., "Potential long-term treatment of hemophilia A by neonatal co-transplantation of cord blood-derived endothelial colony-forming cells and placental mesenchymal stromal cells", Stem Cell Research & Therapy, Jan. 2019, vol. 10(1): 34, 15 pages.

Gionet-Gonzales, et al., "Engineering principles for guiding spheroid function in the regeneration of bone, cartilage, and skin", Biomedical Materials, Mar. 2018, 13(3), 034109, 16 pages, https://doi.org/10.1088/1748-605X/aab0b3.

Grigoryan, et al., "Multivascular networks and functional intravascular topologies within biocompatible hydrogels", Science 364, 2019, 8 pages.

Henquin, "Triggering and Amplifying Pathways of Regulation of Insulin Secretion by Glucose", Diabetes 49, Nov. 2000, 1751-1760.

Hering, et al., "Clinical Islet Transplantation, Phase 3 Trial of Transplantation of Human Islets in Type 1 Diabetes Complicated by Severe Hypoglycemia", Diabetes Care, vol. 39, Jul. 2016, 11 pages.

(56) References Cited

OTHER PUBLICATIONS

Hilderink, et al., "Controlled aggregation of primary human pancreatic islet cells leads to glucose-responsive pseudoislets comparable to native islets", Journal of Cellular and Molecular Medicine, vol. 19 (8), 2015, 11 pages.

Ionescu-Tirgoviste, et al., "A 3D map of the islet routes throughout the healthy human pancreas", Scientific Reports 5: 4634, 2015, DOI: 10.1038/srep14634.

Jansson, et al., "Glucose-induced changes in pancreatic islet blood flow mediated by central nervous system", American Journal of Physiology-Endocrinology and Metabolism, vol. 251, Issue 6—Pt 1, 1986, E644-647.

Kilimnik, et al., "Quantification of islet size and architecture", Islets, vol. 4 (2), 2012, 167-172, https://doi.org/10.4161/isl.19256.

Kim, et al., "Islet architecture: A comparative study", Islets, vol. 1 (2), 2009, 129-136, doi: 10.4161/isl.1.2.9480.

Köllmer, et al., "Long-Term Function of Alginate-Encapsulated Islets", Tissue Engineering Part B, vol. 22 (1), 2015, 34-46.

Komatsu, et al., "Oxygen environment and islet size are the primary limiting factors of isolated pancreatic islet survival", PLOS One 12, Aug. 2017, e0183780, 17 pages, https://doi.org/10.1371/journal.pone.0183780.

Lee BR, et al., "In situ formation and collagen-alginate composite encapsulation of pancreatic islet spheroids", Biomaterials, 2012, vol. 33(3), 837-845.

Levenberg, et al., "Engineering vascularized skeletal muscle tissue", Nature Biotechnology, 2005, vol. 23(7), 6 pages.

Lim, et al., "Microencapsulated Islets as Bioartificial Endocrine Pancreas", Science AAAS, vol. 210 (4472), 1980, 908-910, https://www.jstor.org/stable/1684447.

Livoti, et al., "Self-Assembly and Tissue Fusion of Toroid-Shaped Minimal Building Units", Tissue Engineering Part A, vol. 16 (6), 2010, 2051-2061, DOI: 10.1089=ten.tea.2009.0607.

Ma, et al., "Core-shell Hydrogel Microcapsules for Improved Islets Encapsulation", Adv Healthc Mater, vol. 2 (5), 2013, 667-672.

Mendelsohn, et al., "Size-controlled insulin-secreting cell clusters", Acta Biomaterialia, vol. 8 (12), 2012, 4278-4284, http://dx.doi.org/10.1016/j.actbio.2012.08.010.

Merglen, et al., "Glucose Sensitivity and Metabolism-Secretion Coupling Studied during Two-Year Continuous Culture in INS-1E Insulinoma Cells", Endocrinology, vol. 145 (2), 2004, 667-678, doi: 10.1210/en.2003-1099.

Napolitano, et al., "Scaffold-free three-dimensional cell culture utilizing micromolded nonadhesive hydrogels", BioTechniques, vol. 43 (4), Oct. 2007, 494-500, doi 10.2144/000112591.

Napolitano, et al., Dynamics of the Self-Assembly of Complex Cellular Aggregates on Micromolded Nonadhesive Hydrogels, Tissue Engineering, vol. 13 (8), 2007, 2087-2094, DOI: 10.1089/ten.2006.0190.

O'Sullivan, et al., "Rat islet cell aggregates are superior to islets for transplantation in microcapsules", Diabetologia, vol. 53 (5), 2010, 937-945, DOI 10.1007/s00125-009-1653-8.

O'sullivan, et al., "Islets Transplanted in Immunoisolation Devices: A Review of the Progress and the Challenges that Remain", Endocrine Reviews, vol. 32(6), Dec. 2011, 827-844, doi: 10.1210/er.2010-0026.

\* cited by examiner

FIG. 26A FIG. 26B
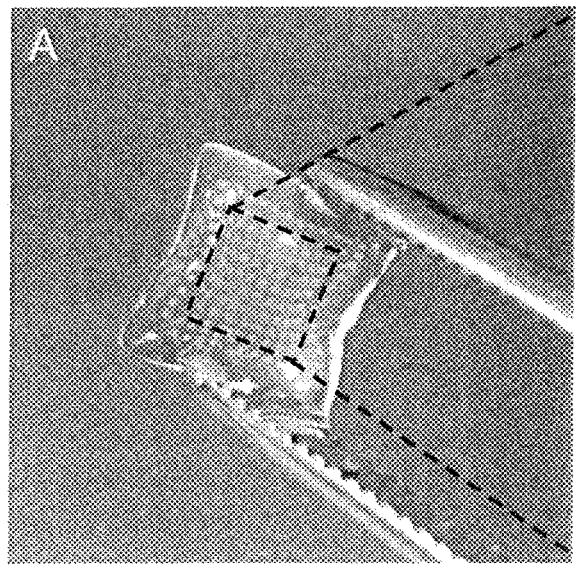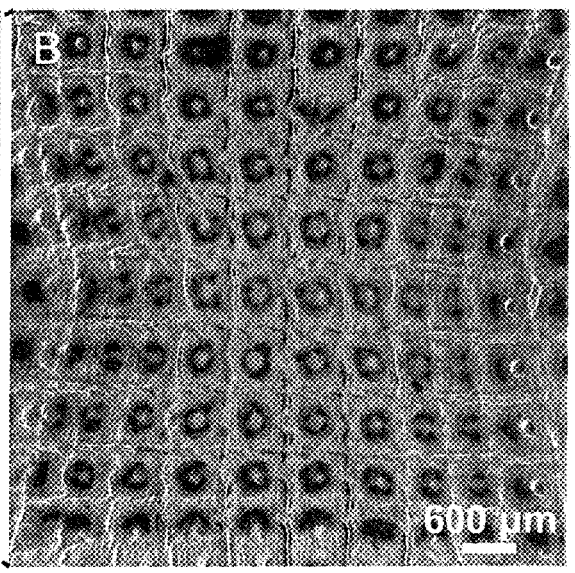
Figure 27
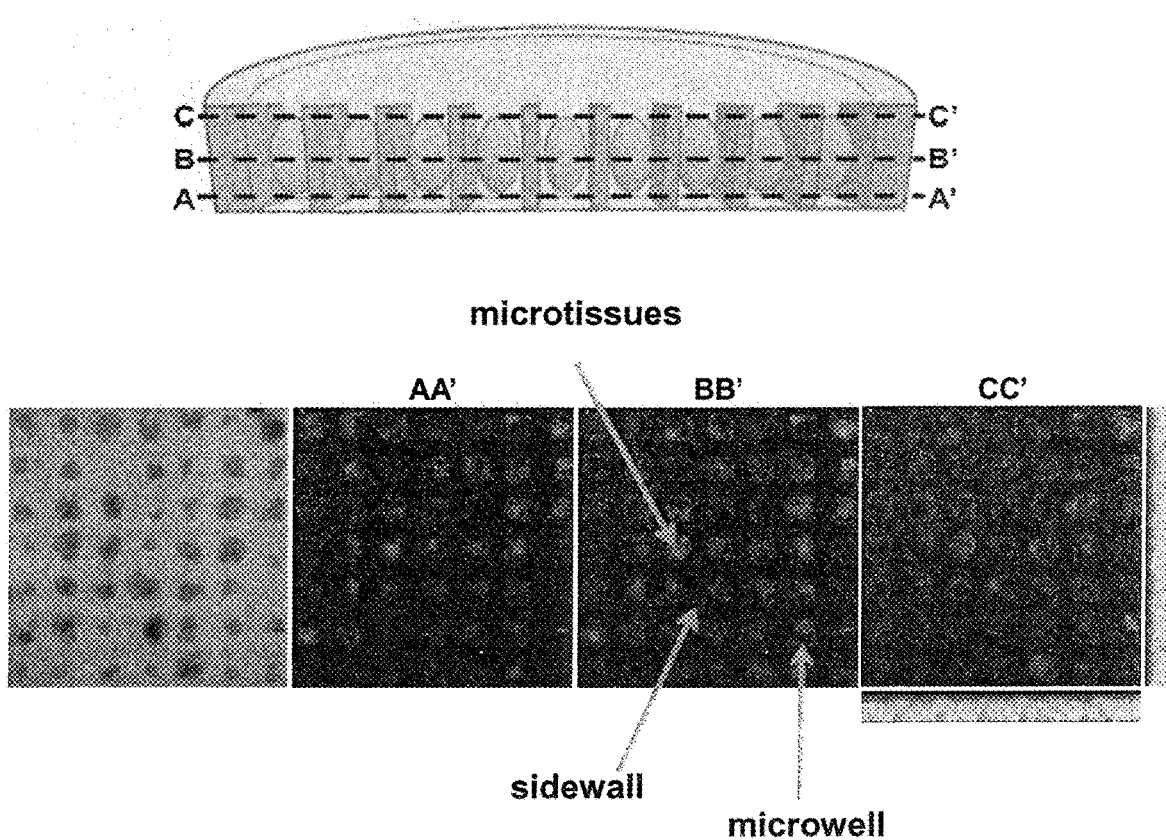

Figure 28
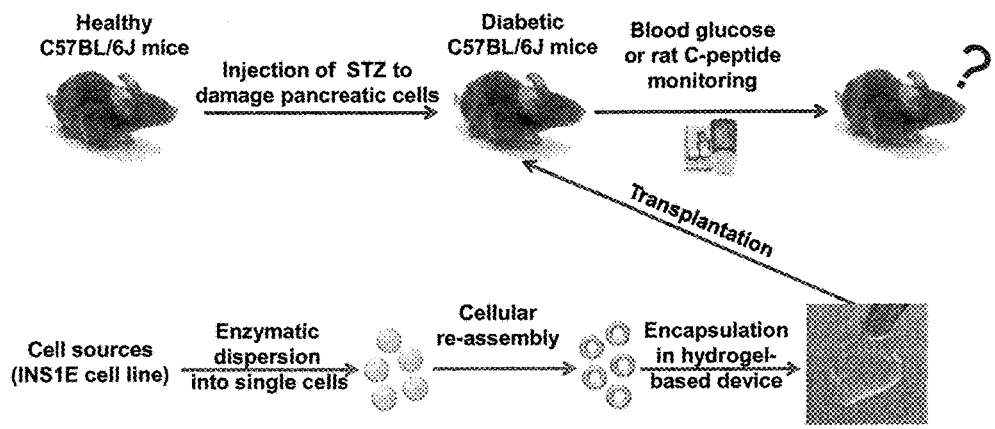
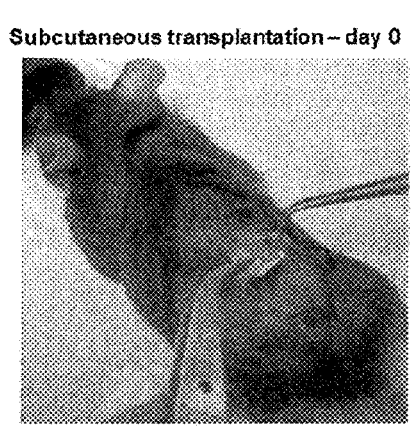
FIG. 29A
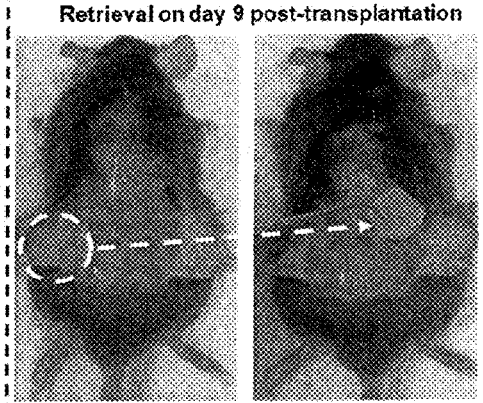
FIG. 29B
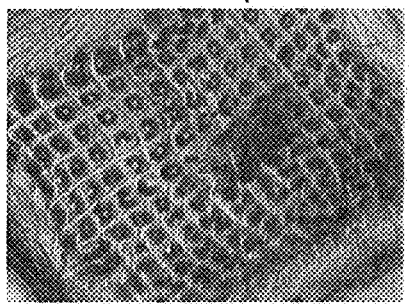
FIG. 29C
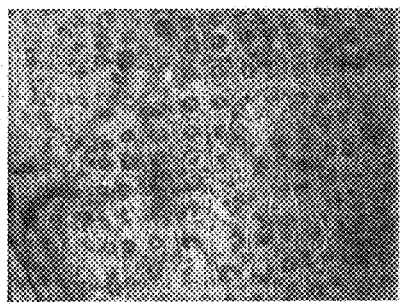
FIG. 29D FIG. 32A
Before alginate coating
FIG. 32B
After alginate coating
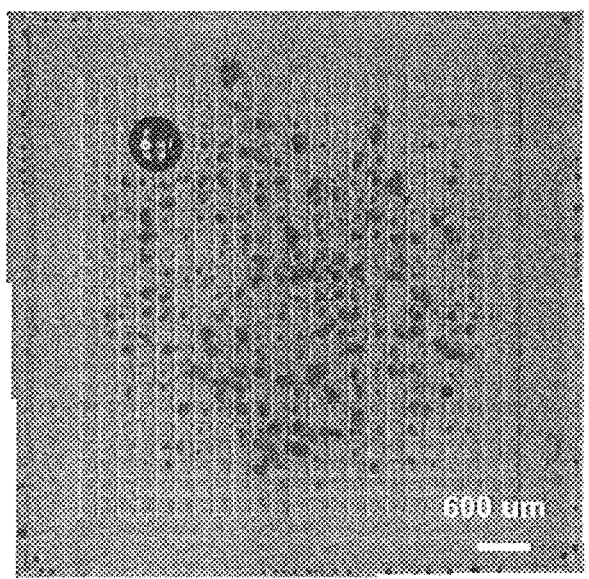
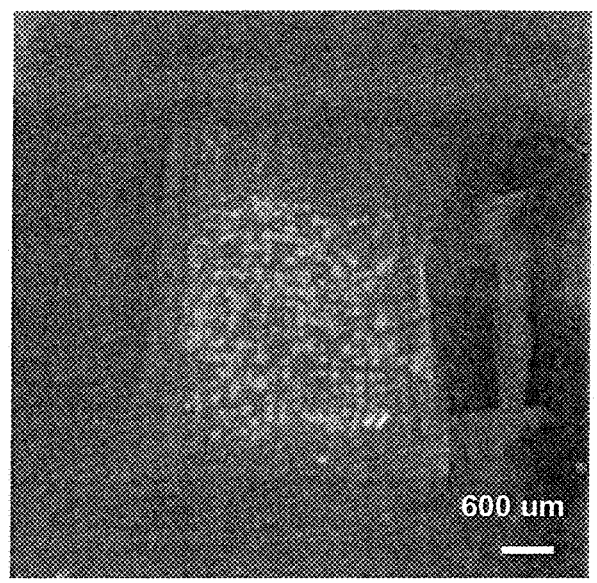

THERAPEUTIC HYDROGEL DEVICE

FIELD OF THE INVENTION

The present invention generally relates to a therapeutic hydrogel device. More particularly, the present invention describes various embodiments of a hydrogel macrodevice, such as a planar hybrid hydrogel macrodevice that can achieve spatially controlled distribution of microtissues and support establishment of intra-device vasculature for enhanced cell survival, and individually encapsulated microtissues, and methods of use.

BACKGROUND OF THE INVENTION

Clinical islet transplantation is a potential strategy to recapitulate the physiological dynamics of glucose-responsive insulin secretion from native pancreatic β cells for the treatment of type 1 diabetes [Hering, B. J. et al., *Diabetes Care* 39 (7): 1230-1240 (2016); Shapiro, A. M. et al., *Nat Rev Endocrinol* 13 (5): 268-277 (2017)]. Encapsulating islet grafts in semi-permeable hydrogel membrane has been postulated as a promising approach to protect the donor cells from immunological attack by the host immune system [Desai, T. et al., *Nat Rev Drug Discov* 16 (5): 338-350 (2017); Lim, F. and Sun, *A. M. Science* 210 (4472): 908-910 (1980)]. This encapsulation approach allows for effective nutrient and waste exchange as well as the delivery of insulin to the host systemic circulation while enabling the expanded use of non-autologous cell sources to reduce the requirement for donor organs and eliminating the need for immunosuppressants [Desai, T. et al., *Nat Rev Drug Discov* 16 (5): 338-350 (2017)]. However, poor viability and limited long-term function of encapsulated islets hindered the clinical translation of this treatment strategy [Tuch, B. E. et al., *Diabetes care* 32 (10): 1887-1889 (2009); de Groot, M. et al., *J Surg Res* 121 (1): 141-150 (2004)]. Native islets, which account for 1-2% of the human adult pancreas volume [Saisho, Y. *Rev Diabet Stud* 13 (2-3): 132 (2016)] but receive ~10% of its blood flow [Jansson, L. and Hellerstrom, C. *Am J Physiol* 251 (6 Pt 1): E644-647 (1986)], are spheroidal cell clusters with mean diameters ranging from 50-500 μm [Kim, A. et al., *Islets* 1 (2): 129-136 (2009); Kilimnik, G. et al., *Islets* 4 (2): 167-172 (2012)]. In the pancreatic niche, which is actively supported by a rich capillary network, native islet size and geometry are sufficient to support islet survival and function [Ionescu-Tirgoviste, C. et al., *Sci Rep* 5: 14634 (2015)]. However, after transplantation into a recipient, encapsulated islets are deprived of their supporting blood vessels and rely mainly on passive diffusion for metabolic exchange [de Groot, M. et al., *J Surg Res* 121 (1): 141-150 (2004)]. Consequently, after transplantation, encapsulated pancreatic islets often suffer from poor diffusion-limited transport of nutrients and oxygen, resulting in hypoxia and associated tissue death at the islet core [de Groot, M. et al., *J Surg Res* 121 (1): 141-150 (2004)]. This significant decrease in islet viability leads to the eventual failure of glycemic control and loss of insulin independence in the long term [Köllmer, M. et al., *Tissue Eng Part B Rev* 22 (1): 34-46 (2015); Elliott, R. B. et al., *Xenotransplantation* 14 (2): 157-161 (2007)].

Diffusion chambers or cell-laden hydrogel sheets have been evaluated in various preclinical studies for islet transplantation with variable outcome [Desai, T. Shea, L D. *Nat. Rev. Drug Discov.* 16(5): 338 (2017); Boettler, T. et al., *Cell Transplant.* 25(3): 609-614 (2016); Bruni, A. et al., *Diabetes, metabolic syndrome and obesity: targets and therapy.* 7: 211 (2014); Lee, B R. et al., *Biomaterials.* 33(3): 837-845 (2012)]. However, the high cell packing density, which is required to achieve sufficient dosage for therapeutic correction, increases the possibility of cell or microtissue aggregation and their nonhomogeneous spatial distribution leading to limited mass transfer, subsequent hypoxia and associated tissue necrosis as well as eventual impaired function of the therapeutic cells [Colton, C K. *Advanced drug delivery reviews.* 67: 93-110 (2014); Avgoustiniatos, E S. Colton, C K. *Annals of the New York Academy of Sciences.* 831 (1 Bioartificial Organs: Science, Medicine, and Technology): 145-166 (1997)].

Another factor implicated in the limited success of these existing devices is the loss of native vasculature supporting the transplanted cells after they were isolated from donor sources, resulting in poor oxygen and nutrient supply and eventual tissue necrosis [Song, S. Roy, S. *Biotechnol Bioeng.* 113(7): 1381-1402 (2016)]. Generally, after device implantation, a new vascular network will start to invade the device as part of the host wound healing response. However, this process of forming new blood vessels from an existing vascular network, also known as angiogenesis, is slow and often produces less blood vessels than the vascular network surrounding the islets in the native pancreatic niche [Rouwkema J, Khademhosseini A. *Trends Biotechnol.* 34(9): 733-745 (2016)]. This problem is exacerbated by the monolithic structure and macroscopic dimension of the devices preventing new host vasculature from reaching the encapsulated islets, particularly those at the center.

Multiple strategies have been attempted to overcome hypoxia-induced cell death [Barkai, U. et al., *Cell Transplant* 22 (8): 1463-1476 (2013); Ramachandran, K. et al., *Tissue Eng Part A* 19 (5-6): 604-612 (2012)]. For example, revascularization approaches involve the co-encapsulation of islets with angiogenic genes, growth factors and vascular-inductive cell types to facilitate the formation of new vasculature and subsequently improve transport of oxygen to the transplanted grafts [Barkai, U. et al., *Cell Transplant* 22 (8): 1463-1476 (2013)]. More recently, a 3D bio-printing technique, involving photopolymerizable hydrogels and projection stereolithography, to generate a vasculature system was developed [Grigoryan, B. et al., Science 364: 458 (2019)]. This design was employed to engineer a vascular network-embedded device for delivery of hepatocyte aggregates to a rodent model of chronic liver injury, and the engraftment was proved to survive and be functional after 14 days post-transplantation. Another alternative strategy is to infuse exogenous oxygen gas into islet-containing macro-encapsulation device via subdermally implanted access ports [Ramachandran, K. et al., *Tissue Eng Part A* 19 (5-6): 604-612 (2012)]. These approaches are limited by the requirements for additional biochemical agents and operational accessories, which complicate the islet delivery system and render its clinical translation more difficult. In addition, several studies have proposed to re-aggregate single cells obtained by collagenase dispersion of isolated islets to form spheroidal cell clusters with smaller diameters of approximately 50-100 μm [O'Sullivan, E. et al., *Diabetologia* 53 (5): 937-945 (2010); Hilderink, J. et al., *J Cell Mol Med* 19 (8): 1836-1846 (2015); Bosco, D. et al., *Exp Cell Res* 184 (1): 72-80 (1989)]. Even though smaller aggregates exhibited enhanced cellular viability compared to that of large islets, they suffer from decreased glucose-responsiveness due to poorer cell-cell interaction [Mendelsohn, A. D. et al., *Acta Biomater* 8 (12): 4278-4284 (2012); Wilson J. T. and Chaikof, E. L. *Adv Drug Del Rev* 60 (2): 124-145 (2008)]. Furthermore, for the same number of transplanted cells, using small aggregates necessitates a higher number of microtissues and subsequently an increased number of hydrogel microcapsules for encapsulation, resulting in a larger transplant volume [Reynolds, T. D. et al., *Drug Dev Ind Pharm* 28 (4): 457-466 (2002)]. Nonetheless, these studies have focused solely on microtissues with spheroidal geometry while the potential role of other non-spheroidal geometry on microtissue viability remains largely unexplored.

Of all convex shapes, spheroidal geometry has been theoretically proven to have the lowest SA/Vol for a given volume [Komatsu, H. et al., *PloS one* 12 (8): e0183780 (2017)]. Furthermore, Mullen et al has proven that a spheroidal human islet has a theoretical maximum limit on its radius to maintain cell viability [Enmon Jr, R. M. et al., *Biotechnol Bioeng* 72 (6): 579-591 (2001); Dean, D. M. et al., *FASEB J* 21 (14): 4005-4012 (2007)], rendering spheroidal geometry less favorable for diffusion-driven metabolic exchange. In contrast, it has been postulated that a rod-like microtissue has no theoretical limit of its length as long as its radius is within the critical diffusion limit required to support cell survival [Rago, A. P. et al., *Tissue Eng Part A* 15 (2): 387-395 (2008)]. Another appealing geometry is the toroid due to its lumen-containing structure which decreases the distance for the oxygen and media to diffuse into the interior cells [Livoti C. M. and Morgan, J. R. *Tissue Eng Part A* 16 (6): 2051-2061 (2010); Merglen, A. et al., *Endocrinology* 145 (2): 667-678 (2004)]. There remains a need to develop a therapeutic encapsulated microtissue system in which there is at least an improvement and/or advantage over the prior art.

SUMMARY OF THE INVENTION

A dedicated platform was developed to encapsulate therapeutic microtissues with controlled spatial distribution while optionally concurrently supporting an organized intra-device network of vascular-inductive cells. This platform comprises two modules with complementary topography features that fit together in a lock-and-key configuration (FIG. 10). Inspired by the grid-like pattern on the surface of a waffle, the "lock" component consists of an interconnected vascular-supporting hydrogel network, which serves as dividing sidewalls separating evenly spaced microwells. The "key" component consists of therapeutic microtissues encapsulated in an immuno-isolatory hydrogel that is added to the microwells of the lock component and cross-linked, thereby essentially fixing or locking the components together as a unit. The waffle-inspired micropattern of the lock component was designed to direct the spatially homogenous distribution of therapeutic microtissues such that each microtissue can be ideally entrapped in one microwell to prevent undesirable aggregation. Furthermore, the interlocking design of the device minimizes the risk of the two components detaching and to ensure the proximity of optional vascular-inductive cells in the walls of the lock component and the encapsulated therapeutic microtissues in the key component.

According to a first aspect of the present invention, there is a planar biocompatible hydrogel-based macrodevice comprising an array of microwells and a therapeutic microtissue within each of a plurality of said microwells, wherein;

a) said macrodevice comprises a component comprising an interconnected network of cross-linked hydrogel, which serves as dividing sidewalls separating evenly spaced microwells, wherein each microwell in the array comprises at least one side wall and is configured to encapsulate a single therapeutic microtissue; and b) said macrodevice comprises a component comprising therapeutic microtissues in an immuno-isolatory hydrogel that, when cross-linked, are entrapped in the microwells, and wherein said immuno-isolatory hydrogel component of b) interlocks with the interconnected hydrogel network component of a).

In some embodiments the planar biocompatible hydrogel-based macrodevice further comprises an encapsulating coating of an immuno-isolatory hydrogel.

In some embodiments the at least one side wall of each of a plurality of said microwells further comprise vascular endothelial cells.

In some embodiments the therapeutic microtissues are toroid-shaped.

According to a second aspect of the present invention, there is a method of manufacturing a planar biocompatible hydrogel-based macrodevice, comprising the steps;

a) hydrogel prepolymer is dispensed onto a surface;
   i) a photomask with an array of holes or transparent features of specified geometry and dimensions is placed over the dispensed mixture, and
   ii) the mixture is exposed to UV light or solution containing cross-linker to cross-link an exposed portion of the hydrogel prepolymer, to form a micropatterned network of sidewalls, and
   iii) the crosslinked hydrogel pattern is rinsed to remove non-crosslinked hydrogel residue, leaving behind microwells; or b) hydrogel prepolymer is dispensed onto a surface using 3D printing and cross-linked to form a micropatterned network of sidewalls defining microwells;

c) adding a mixture of microtissues and cross-linkable immuno-isolating hydrogel onto the crosslinked hydrogel micropattern of a) or b), and crosslinking the immuno-isolating hydrogel; or d) adding a suspension of cells to the microwells and culturing the cells under suitable conditions until the cells aggregate into desired microtissue shape depending on the chosen cross-linked hydrogel micropattern, and
   (i) adding cross-linkable immuno-isolating hydrogel onto the cross-linked hydrogel micropattern, and
   (ii) crosslinking the immuno-isolating hydrogel,
wherein the planar biocompatible hydrogel-based macrodevice comprises a single microtissue per microwell.

In some embodiments the method further comprises a step e) i) of encapsulating the planar biocompatible hydrogel-based macrodevice with a coating of a cross-linkable immuno-isolating hydrogel and e) ii) crosslinking the immuno-isolating hydrogel.

According to a third aspect of the present invention, there is a composition comprising cells for implantation, wherein the composition comprises a biocompatible hydrogel-based microcapsule having a single toroid-shaped microtissue encapsulated therein, wherein said microtissue secretes a therapeutically effective substance, such as a hormone or protein. In some embodiments the hydrogel is alginate According to a fourth aspect of the present invention, there is a method of treatment comprising implanting into a subject in need of such treatment a planar biocompatible hydrogel-based macrodevice of any aspect of the invention or a composition of any aspect of the invention.

According to a fifth aspect of the present invention, there is a use of a planar biocompatible hydrogel-based macrodevice of any aspect of the invention or a composition of any aspect of the invention as an implant for treating a subject.

According to a sixth aspect of the present invention, there is a kit comprising a planar biocompatible hydrogel-based macrodevice of any aspect of the invention and a plurality of microtissues and/or alginate.

BRIEF DESCRIPTION OF THE FIGURES

FIG. 1A is a schematic diagram of the procedure to fabricate INS-1E microtissues using micromolded nonadhesive agarose hydrogels. Homogeneous suspension of dispersed cells was seeded into each micromolded nonadhesive agarose hydrogel by pipetting. After at least 55 hours of cellular assembly, microtissues were retrieved using a micropipette. FIG. 1B is a schematic diagram of the procedure to encapsulate islet-like microtissues using electrostatic droplet generator. A mixture of microtissues/alginate solutions was extruded through the 20 G blunt needle into the bath of $Ba^{2+}$ ions to form hydrogel microcapsules.

FIG. 2A-C: Optical images of microtissues with toroid, rod and spheroid geometries before (i-iv) and after (v-viii) retrieval from the micromolded agarose hydrogels. The arrows indicate dark regions of dead cells at the core of microtissues; FIG. 2D-F: Quantitative assay using automated cell counter and trypan blue exclusion indicated that for each geometry, the number of cells per microtissue and the percentage of dead cells increased with initial cell seeding density. FIG. 2G: Toroid microtissues with approximately 13% dead cells had a higher number of cells per microtissue than that of rod and spheroid microtissues with a similar percentage of dead cells. Data is shown as mean±SEM (n=3 replicate samples). (***) denotes p<0.005. The scale bars representing 300 μm apply to all images acquired at the same magnification.

FIG. 3A: Quantitative assay with automated cell counter confirmed the average number of cells per microtissue was similar for all three geometries (n=6 replicate samples); FIG. 3B Toroid and rod microtissues had a lower percentage of dead cells compared to that of spheroid microtissues (n=6 replicate samples); FIG. 3C-E Optical images of microtissues with a standardized number of cells (12000 cells) per microtissue. The arrows indicate dark regions of dead cells at the core of rod and spheroid microtissues; FIG. 3F Quantification of metabolic activity of intact microtissues with WST-1 assay (n=10 replicate samples) indicated that toroid microtissues were more metabolically active than rod and spheroid microtissues; FIG. 3G Volume and SA/Vol ratio of microtissues (n=3 batches of microtissues, 53 microtissues per batch). Data is shown as mean±SEM (***) denotes p<0.005. All scar bars represent 300 μm.

FIG. 4A-C: Bright-field images of microtissues. FIG. 4D-F: Fluorescence indicated live cells of microtissues; FIG. 4G-I: Fluorescence indicates dead cells of microtissues; FIG. 4J-L: Merged images of live and dead cells of microtissues. White arrows in FIGS. 4B and H indicate regions of dead cells in the interior of rod microtissues while black arrows in FIG. 4C indicate spheroid microtissues with dislodged dead cells after staining; All scale bars represent 300 μm.

FIG. 8 shows optical images illustrating the structural changes of encapsulated and bare toroid microtissues over 3 days in culture.

FIG. 11 shows snapshots of the 3D confocal visualization of the microtissues after live/dead staining.

FIG. 15A: Bright filed images of macrodevices after encapsulation of microtissues. FIG. 15B: Total number of encapsulated microtissue per macrodevice (1 cm×1 cm) (n=18 devices, 3 batches, error bar represents SD). FIG. 15C: Quantitative analysis of microtissue entrapment efficiency and total area of microwells per type of macrodevice (n=1 device from N=3 independent experiment, error bar represents SD). Microtissue entrapment efficiency is defined as the ratio of the total number of microtissues entrapped in the microwells to the total number of microtissues encapsulated in the entire macrodevice. FIG. 15D: Quantitative analysis of microtissue distribution ratio in S-300, S-400 and C-400 macrodevices. Microtissue distribution ratio is defined as the ratio of the combined number of microtissues in all microwells of type Mn, where n is the number of microtissue(s) per microwell and ranges from 1 to 6, to the total number of microtissues encapsulated in the entire macrodevice (n=1 devices from N=3 independent experiment, error bar represents SD). (*) denotes statistical difference ($p<0.05$) determined using one-way ANOVA. Scale bars: 1 mm.

FIG. 17A: Bright filed and fluorescent live/dead images of microtissues encapsulated in the device; FIG. 17B: Static glucose stimulated insulin secretion test by consecutively subjecting the sample to three consecutive incubation in 2.8, 16.8 and 2.8 mM glucose solutions. (n=3 devices, error bar represents SD). (*) denotes statistical difference ($p<0.05$) determined using Student's t-test.

FIG. 18A: Bright filed and live/dead images of waffle-like macrodevice with HUVEC in its GelMA sidewall; FIG. 18B: Immunofluorescent images of the device after staining of endothelial marker CD31; FIG. 18C: Bright field and fluorescent live/dead images of macrodevice device co-encapsulating INS-1E microtissues in microwells and HUVECs in GelMA sidewall; FIG. 18D: Static glucose-stimulated insulin secretion test by subjecting the device encapsulating both therapeutic microtissues and HUVECs to three consecutive incubation in 2.8 mM, 16.8 mM and 2.8 mM glucose solutions. (n=3 devices, error bar represents SD). (*) denotes statistical difference ($p<0.05$) determined using student's t-test.

FIG. 19A: Schematic fabrication of assembly of monodispersed cells for in situ formation of therapeutic microtissues on micropattern S-300; FIG. 19B: Bright field and live/dead images of the microtissues formed on micropattern from 0.8 million of seeded cells; FIG. 19C: Bright field image of microtissues formed on micropattern from 0.4 million of seeded cells.

FIG. 24 shows graphs illustrating the effect of initial cell loading on cell viability and yield at 24 hours post-seeding.

FIG. 26A-B show photographs of a waffle-inspired macrodevice containing toroid microtissues. FIG. 26A: The macrodevice had strong mechanical property to sustain handling with tweezers. FIG. 26B: Minimal deformation of the waffle arrangement was observed under magnification.

FIG. 27 shows a schematic and bright field image and confocal cross sections (AA', BB', CC') at three different depths of a waffle-inspired macrodevice. "Lock" or "interlocking" component of GelMA hydrogel network was visualized by mixing GelMA with green fluorescent microbeads (arrow marked as "side wall") while the second interlocking component of alginate-microtissue mixture was visualized by adding red fluorescent microbeads to the alginate (arrow marked as "microwell"). INS-1E microtissues in alginate "key" component was stained with blue Hoechst dye (arrows marked as "microtissues"). Appearance of all three signals in each confocal plane illustrated the interlocking nature of the two modular components.

FIG. 28 shows a schematic diagram of the procedures for generation of a chemically induced diabetic mouse model, fabrication of the waffle-inspired macrodevice and its transplantation into a diabetic mouse.

FIG. 29 shows photographs of the macrodevice before transplantation (FIG. 29A) and upon retrieval after 9 days post-transplantation from a diabetic mouse (FIG. 29B). The macrodevice retained its structural and mechanical stability to sustain handling with tweezers during device retrieval. In brightfield images under magnification (FIG. 29C-D), minimal deformation of the waffle arrangement is observed in the retrieved device (FIG. 29D) compared to pre-transplant device (FIG. 29C).

FIG. 32 shows brightfield images of waffle-like macrodevice encapsulating primary rat islets. FIG. 32A: Alginate-islet mixture was dispensed on GelMA hydrogel network on a glass slide illustrating the ability of the micropatterned design to distribute the therapeutic microtissues homogeneously by entrapping one microtissue per microwell. FIG. 32B: After further external coating with a barium-cross-linked alginate hydrogel layer, the macrodevice still maintained the homogenous islet distribution after its detachment from the glass slide.

Bibliographic references mentioned in the present specification are for convenience listed in the form of a list of references and added at the end of the examples. The whole content of such bibliographic references is herein incorporated by reference but their mention in the specification does not imply that they form part of the common general knowledge.

DETAILED DESCRIPTION OF THE INVENTION

Definitions

Certain terms employed in the specification, examples and appended claims are collected here for convenience.

The terms "a" and "an" are used herein to refer to one or to more than one (i.e. at least one) of the grammatical object of the article.

As used herein, the term "comprising" or "including" is to be interpreted as specifying the presence of the stated features, integers, steps or components as referred to, but does not preclude the presence or addition of one or more features, integers, steps or components, or groups thereof. However, in context with the present invention, the term "comprising" or "including" also includes "consisting of". The variations of the word "comprising", such as "comprise" and "comprises", and "including", such as "include" and "includes", have correspondingly varied meanings.

The term "component" as used herein is intended to describe each of the cross-linked hydrogels that define an array of microwells and the cross-linked immuno-isolatory hydrogel comprising microtissues. First and second component may also be used to define the respective hydrogels.

The term "composition" is defined as a combination of different materials, such as polymer and cells. The composition may comprise a planar matrix (also called a "waffle-inspired" structure), made of a transparent or translucent polymer. The cells may be arranged in a packing arrangement, such as a square packing arrangement consisting of columns and rows. The cells may be spaced at regular intervals. The cells may form clusters, such as rods, spheroids or toroid-shaped building units.

The term "cluster" or "cell cluster" is defined as a group of cells that are clumped together or self-assembled into a microtissue.

The term "toroid-shaped", "toroidal" or "toroid microtissue" used herein to describe a ring- or donut-shaped tissue having an open lumen.

Figure 14:
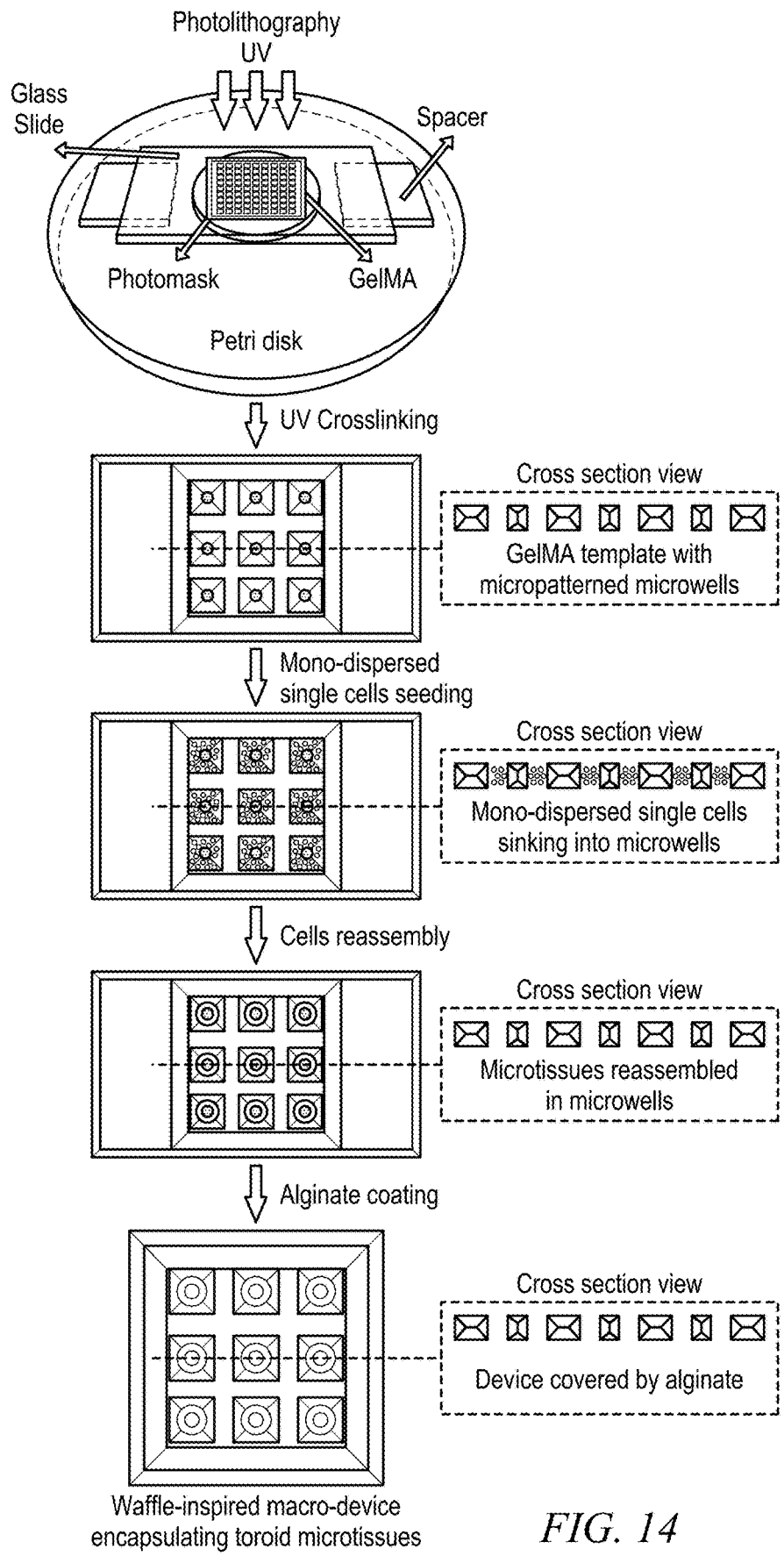
FIG. 14 shows a schematic diagram of the fabrication of waffle-inspired macrodevice comprising of multiple microwells each with a peg at its center and the in situ directed assembly of single cells in this device to form a toroid-shaped microtissue in each microwell.

The term "lock", "locking" or "interlock", "interlocking" as used herein is intended to describe the interdigitating of a) an interconnected network of cross-linked hydrogel, which serves as dividing sidewalls separating evenly spaced microwells, wherein each microwell in the array comprises at least one side wall and is configured to encapsulate a single therapeutic microtissue and b) therapeutic microtissues in an immuno-isolatory hydrogel that, when cross-linked, are entrapped in the microwells, and wherein said immuno-isolatory hydrogel component of b) interlocks with the interconnected hydrogel network component of a) to form essentially a unitary macrodevice. More simply it is the cross-linking of the immuno-isolatory hydrogel within, and over, the wells of the macrodevice, for example as shown in the schematic in FIGS. 12 and 14.

The term "polymer" or "biopolymer" is defined as a substance with repeated molecular units. The polymer may be a biocompatible polymer, selected from the group comprising polysaccharide (e.g. agarose), polyphosphazene, poly(acrylic acids), poly(methacrylic acids), copolymers of acrylic acid and methacrylic acid, poly(alkylene oxidese), poly(vinyl acetate), polyvinylpyrrolidone (PVP), and copolymers and blends thereof. The polymer may be polyacrylamide or a blend comprising polyacrylamide. The polymer may be a flexible polymer that is also mechanically and structurally stable and suitable for transplantation or implantation (e.g. subcutaneous transplantation or implantation). The polymer may or may not be biodegradable.

The term "mammalian cell" is defined as any cell derived from a mammalian subject. The cell may be secretory (e.g. pancreatic cells), structural (e.g. mesenchymal or epithelial cells), or metabolic. The cell may be selected from the group including but not limited to any of the following cell types: islets of Langerhans, bone marrow mononuclear cells, mesenchymal stem cells, mobilized peripheral blood mononuclear cells, endothelial progenitor cells, follicular cells, Leydig cells, ovarian cells, neural stem cells, human embryonic stem cells, pluripotent stem cells, skeletal myoblasts, cardiomyoblasts, etc. The cell may be xenogeneic, autologous or allogeneic. The cell can be a primary cell obtained directly from a mammalian subject. The cell may also be a cell derived from the culture and expansion of a cell obtained from a subject. The cell may be a stem cell. Immortalized cells (i.e. cell lines) are also included within this definition. In some embodiments, the cell has been genetically engineered to express a recombinant protein and/or nucleic acid.

The term "subject" is herein defined as vertebrate, particularly mammal, more particularly human. For purposes of research, the subject may particularly be at least one animal model, e.g., a mouse, rat and the like. In particular, for treatment or prophylaxis of a disease, such as type 1 diabetes, the subject may be a human.

The term 'treatment', as used in the context of the invention refers to prophylactic, ameliorating, therapeutic or curative treatment.

For purposes of brevity and clarity, descriptions of embodiments of the present invention are directed to hydrogel-encapsulated microtissues and a hybrid hydrogel macrodevice for therapeutic implantation, in accordance with the Examples. While aspects of the present invention will be described in conjunction with the embodiments provided herein, it will be understood that they are not intended to limit the present invention to these embodiments. On the contrary, the present invention is intended to cover alternatives, modifications and equivalents to the embodiments described herein, which are included within the scope of the present invention as defined by the appended claims. Furthermore, in the following detailed description, specific details are set forth in order to provide a thorough understanding of the present invention. However, it will be recognized by an individual having ordinary skill in the art, i.e. a skilled person, that the present invention may be practiced without specific details, and/or with multiple details arising from combinations of aspects of particular embodiments. In a number of instances, known systems, methods, procedures, and components have not been described in detail so as to not unnecessarily obscure aspects of the embodiments of the present invention.

The present invention provides a waffle-inspired hybrid hydrogel macrodevice that may be utilized to facilitate enhanced performance of cell-based therapeutics by facilitating distribution of encapsulated microtissues and formation of interconnected vasculature to improve microtissue performance in a wide range of applications.

According to a first aspect of the invention, there is a planar biocompatible hydrogel-based macrodevice comprising an array of microwells and a therapeutic microtissue within each of a plurality of said microwells, wherein;

a) said macrodevice comprises an interconnected network of cross-linked hydrogel, which serves as dividing sidewalls separating evenly spaced microwells, wherein each microwell in the array comprises at least one side wall and is configured to encapsulate a single therapeutic microtissue; and b) said macrodevice comprises therapeutic microtissues in an immuno-isolatory hydrogel that, when cross-linked, are entrapped in the microwells, and wherein said immuno-isolatory hydrogel of b) interlocks with the interconnected hydrogel network of a).

It would be understood that there are several biopolymers that could be used to generate the macrodevice. The polymer may be a biocompatible polymer, selected from the group comprising polysaccharide (e.g. agarose), polyphosphazene, poly(acrylic acids), poly(methacrylic acids), copolymers of acrylic acid and methacrylic acid, poly(alkylene oxidese), poly(vinyl acetate), polyvinylpyrrolidone (PVP), collagen, elastin, polyethylene glycol, alginate, hyaluronic acid or their derivatives and copolymers and blends thereof. The polymer may be polyacrylamide or a blend comprising polyacrylamide. The polymer may be a flexible polymer that is also mechanically and structurally stable and suitable for transplantation or implantation (e.g. subcutaneous transplantation or implantation). In some embodiments it is preferred that the hydrogel is gelatin methacryloyl (GeIMA).

In some embodiments, the at least one side wall of each of a plurality of said microwells further comprise vascular endothelial cells. The endothelial cells are embedded within the walls to promote vascularization and support for the microtissues within each well.

In some embodiments, the planar biocompatible hydrogel-based macrodevice further comprises a coating of an immuno-isolatory hydrogel, such as an alginate hydrogel, that encapsulates the macrodevice. The extra coating over the device provides additional structural support or mechanical strength to an implanted macrodevice.

Figure 19A:
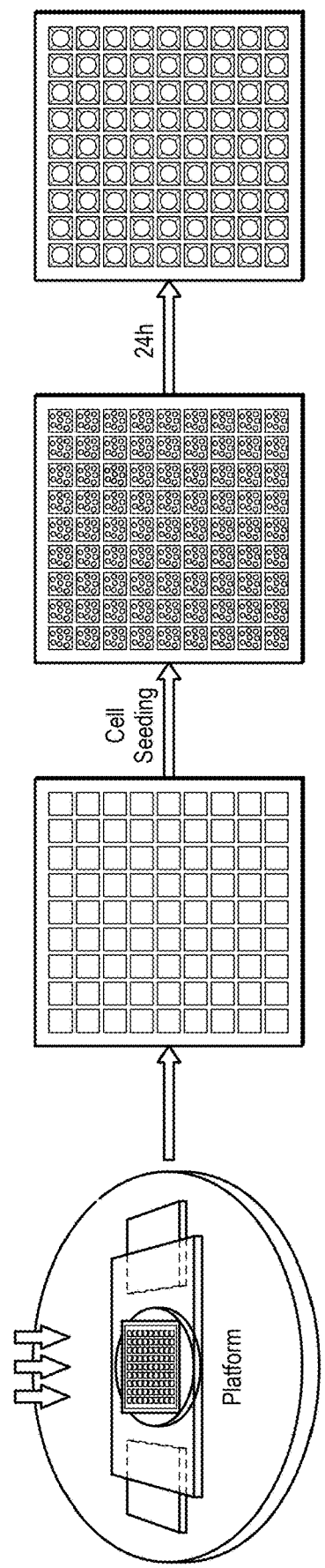
FIG. 19A-C show the formation of therapeutic microtissues in situ by guided assembly of mono-dispersed cells on a waffle-like GelMA hydrogel micropattern.
Figure 19B:
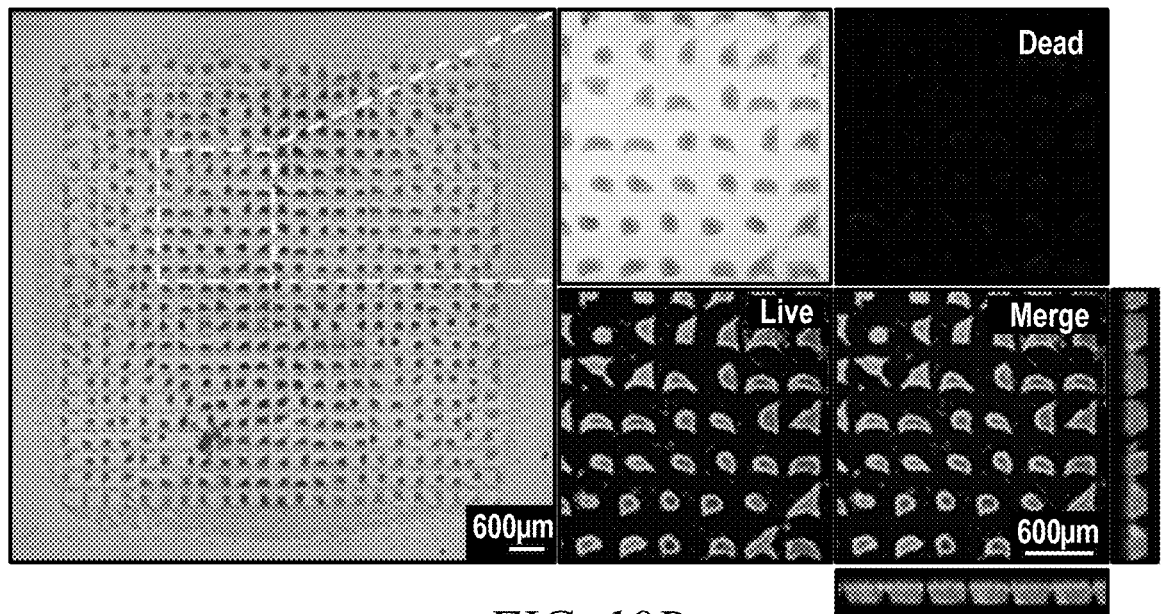
Figure 19C:
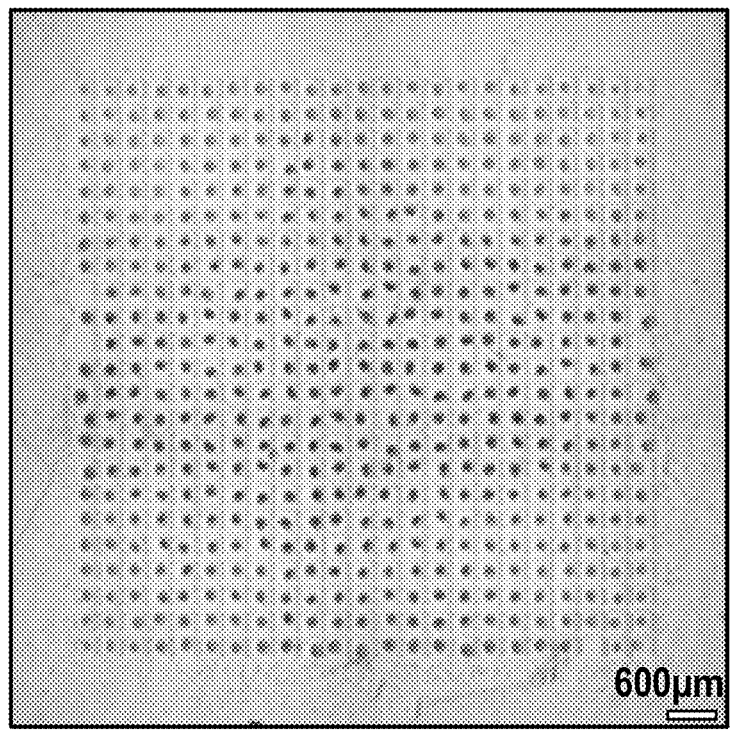

In some embodiments the microwells comprise a peg arranged to guide the formation of a toroid-shaped microtissue. Non-limiting Examples are shown in FIGS. 17 to 19. In some embodiments the peg has a diameter in the range of 50 μm to 200 μm, preferably a diameter of about 100 μm. In some embodiments of the planar biocompatible hydrogel-based macrodevice, the peg has a diameter of 100 μm and the width dimension of each of said microwells is 500 μm.

Figure 11C:
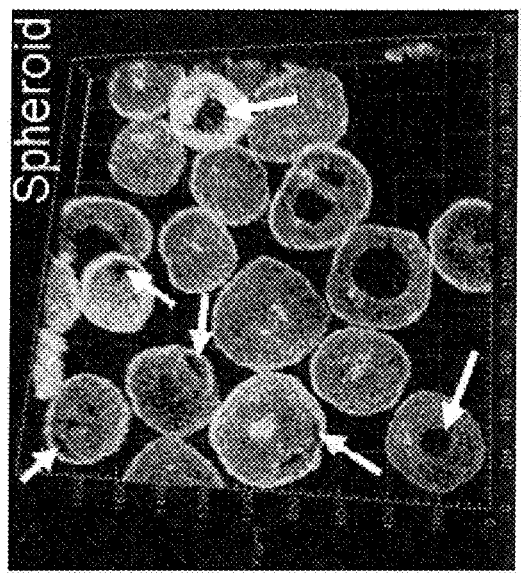
FIG. 11C: Spheroid microtissues. Arrows indicated holes through which cellular debris might have been discharged from the surface of spheroid microtissues.
Figure 11B:
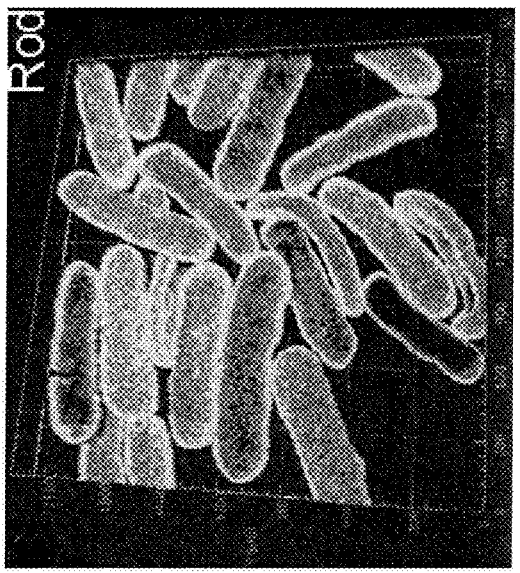
FIG. 11B: Rod microtissues.
Figure 11A:
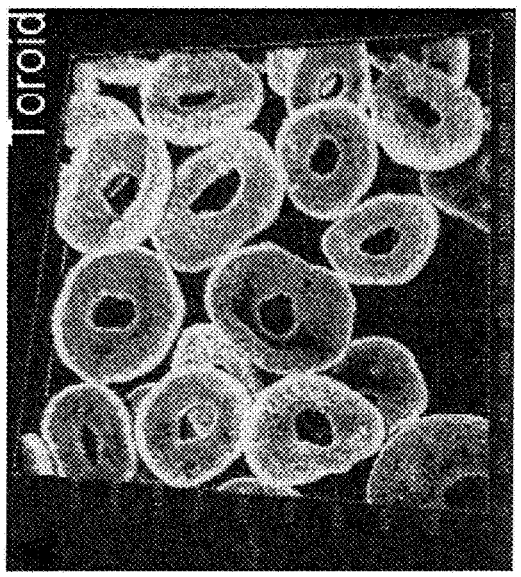
FIG. 11A: Toroid microtissues.

In some embodiments the microwells are square or circular in the horizontal plane, such as shown in FIG. 11.

The dimensions of the microwells are herein expressed in terms of width dimension, which means, for example, that for a square well, the width dimension is the length of one side in cross-section; for a circular microwell the width dimension is the diameter of the circle cross-section. Essentially, it is the distance from one side of the well to the other.

In some embodiments the width dimension of each of said microwells is in the range of 100 μm to 1000 μm, preferably 300 μm to 500 μm, more preferably about 500 μm. Preferably, the peg has a width dimension of 100 μm and the width dimension of each of said microwells is 500 μm.

In some embodiments the microwell side walls have a height in the range 100 μm to 1000 μm, preferably about 300 μm. The height or depth of the wells may vary depending on the nature of the implant, where it is implanted and the type of microtissues used. 3D-printed macrodevices of the invention may have deeper wells.

Figure 12:
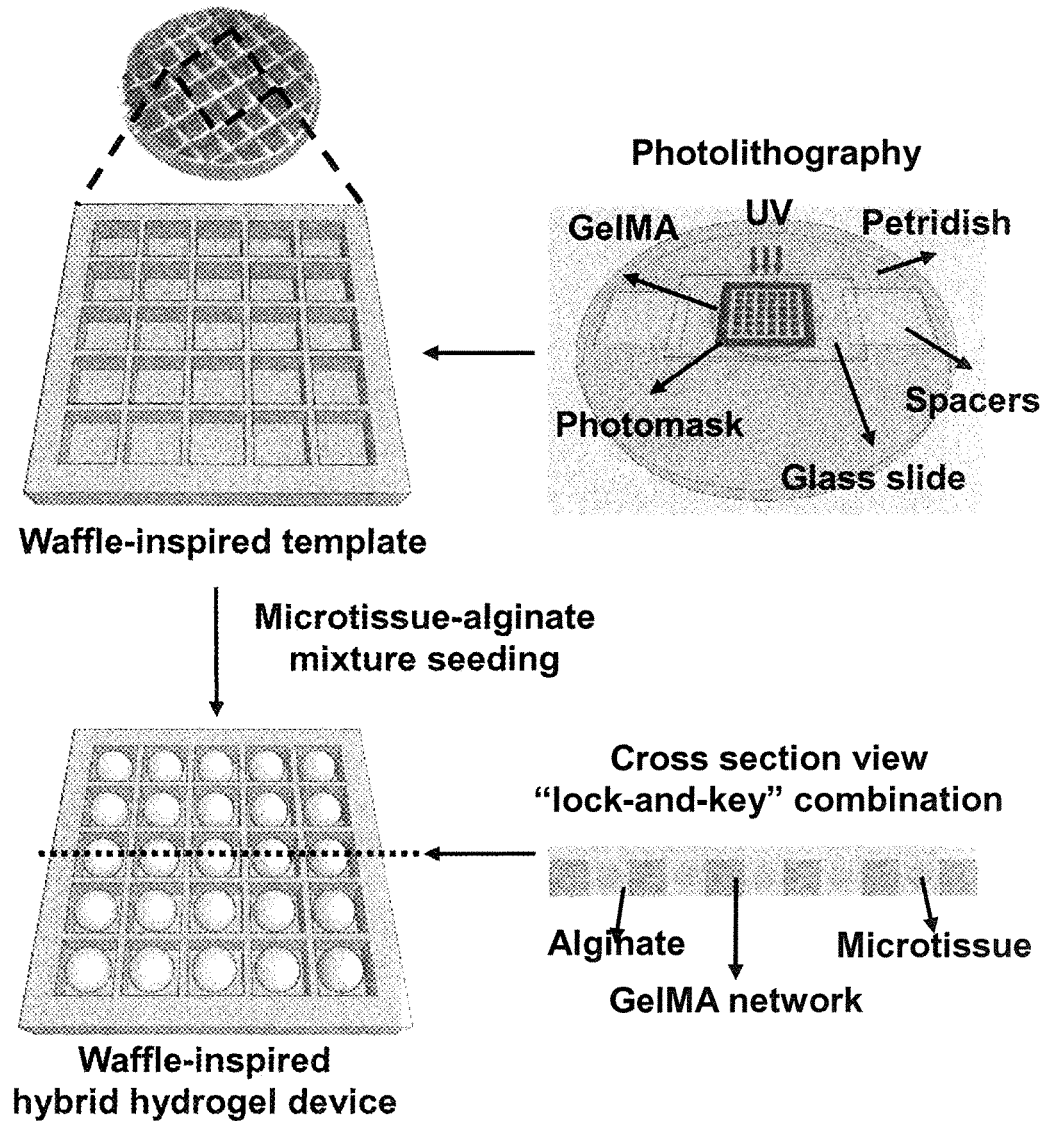
FIG. 12 shows a schematic diagram of the fabrication of waffle-inspired macrodevice comprising of multiple empty microwells for encapsulation of therapeutic microtissues that were fabricated ex situ prior to their addition into the macrodevice.

The size of the biocompatible hydrogel-based macrodevice is not intended to be limited other than by practical constraints determined by the particular application. Examples disclosed herein show that macrodevices comprising 144 wells, 324 wells, 529 wells and 1024 wells may be used for seeding with microtissues (FIG. 12). In some embodiments the planar biocompatible hydrogel-based macrodevice comprises at least 100 microwells, at least 300 microwells, at least 500 microwells or at least 1000 microwells.

In some embodiments the therapeutic microtissue is rod-shaped, spherical, or toroid-shaped, preferably toroid-shaped.

In some embodiments the microtissues comprise secretory, structural or metabolic cells. In some embodiments the microtissues comprise cells selected from the group comprising insulin-secreting islets of Langerhans cells [Song, S. and Roy, S. *Biotechnol Bioeng.* 113(7): 1381-1402 (2016)], albumin-secreting hepatocytes [Glicklis R, et al., *Biotechnol Bioeng.* 86(6): 672-680 (2004); Gionet-Gonzales, M A and Leach, J K. *Biomedical materials.* 13(3): 034109 (2018)], bone marrow mononuclear cells, mesenchymal stem cells, mobilized peripheral blood mononuclear cells, endothelial progenitor cells, follicular cells, Leydig cells, ovarian cells, neural stem cells, human embryonic stem cells, pluripotent stem cells, skeletal myoblasts and cardiomyoblasts or genetically engineered cells for growth hormone deficiency or haemophilia [Gao K, et al., *Stem cell research & therapy.* 10(1): 34 (2019)]. In some embodiments the microtissues secrete a therapeutically effective substance, such as a hormone or protein.

In some embodiments the cross-linked hydrogel in a) is preferably GeIMA and/or the immuno-isolatory hydrogel in b) is preferably alginate.

In some embodiments each of the said therapeutic microtissues:

a) was added to the said microwells, or b) was generated within the said microwells from a cell suspension.

In some embodiments the cell suspension comprises about 0.5 to 1.5 million cells per cm² of macrodevice.

According to a second aspect of the present invention, there is a method of manufacturing a planar biocompatible hydrogel-based macrodevice, comprising the steps;
a) hydrogel prepolymer is dispensed onto a surface;
   i) a photomask with an array of holes or transparent features of specified geometry and dimensions is placed over the dispensed mixture, and
   ii) the mixture is exposed to UV light or solution containing cross-linker to cross-link an exposed portion of the hydrogel prepolymer, to form a micropatterned network of sidewalls, and
   iii) the crosslinked hydrogel pattern is rinsed to remove non-crosslinked hydrogel residue, leaving behind microwells; or
b) hydrogel prepolymer is dispensed onto a surface using 3D printing and cross-linked to form a micropatterned network of sidewalls defining microwells;
c) adding a mixture of microtissues and cross-linkable immuno-isolating hydrogel onto the crosslinked hydrogel micropattern of a) or b), and crosslinking the immuno-isolating hydrogel; or
d) adding a suspension of cells to the microwells and culturing the cells under suitable conditions until the cells aggregate into desired microtissue shape depending on the chosen cross-linked hydrogel micropattern, and
   (i) adding cross-linkable immuno-isolating hydrogel onto the cross-linked hydrogel micropattern, and
   (ii) crosslinking the immuno-isolating hydrogel,
wherein the planar biocompatible hydrogel-based macrodevice comprises a single microtissue per microwell.

In some embodiments the method further comprises a step e) encapsulating the macrodevice and microtissues in a biocompatible hydrogel layer, such as an alginate hydrogel layer. This further encapsulation of the macrodevice provides extra support and protection of the macrodevice when used, for example, as an implant.

In some embodiments the cells are seeded onto the macrodevice at about 0.3 to 1.5 million cells per cm² of macrodevice.

In some embodiments the microtissue and/or cell suspension are selected from the group comprising islets of Langerhans cells, hepatocytes, bone marrow mononuclear cells, mesenchymal stem cells, mobilized peripheral blood mononuclear cells, endothelial progenitor cells, follicular cells, Leydig cells, ovarian cells, neural stem cells, human embryonic stem cells, pluripotent stem cells, induced pluripotent stem cells (iPSCs), skeletal myoblasts, cardiomyoblasts and genetically engineered cells for growth hormone deficiency or haemophilia.

In some embodiments, in step a) or b) a mixture of hydrogel prepolymer and vascular endothelial cells is dispensed onto said surface and wherein said vascular endothelial cells are embedded in the microwell side walls.

In some embodiments the hydrogel prepolymer in step a) or b) is GelMA and/or the cross-linkable immuno-isolating hydrogel in step c) or d) i) is alginate.

According to a third aspect of the present invention, there is a composition comprising cells for implantation, wherein the composition comprises a plurality of biocompatible hydrogel-based microcapsules each having a toroid-shaped microtissue encapsulated therein, wherein said microtissue secretes a therapeutically effective substance, such as a hormone or protein.

In some embodiments the hydrogel is a cross-linkable immuno-isolating hydrogel.

In some embodiments the hydrogel is preferably alginate.

In some embodiments the microtissue comprises cells selected from the group comprising islets of Langerhans cells, hepatocytes, bone marrow mononuclear cells, mesenchymal stem cells, mobilized peripheral blood mononuclear cells, endothelial progenitor cells, follicular cells, Leydig cells, ovarian cells, neural stem cells, human embryonic stem cells, pluripotent stem cells, induced pluripotent stem cells (iPSCs), skeletal myoblasts, cardiomyoblasts and genetically engineered cells for growth hormone deficiency or haemophilia.

According to a fourth aspect of the present invention, there is a method of treatment comprising implanting into a subject in need of such treatment a planar biocompatible hydrogel-based macrodevice of any aspect of the invention or a composition of any aspect of the invention.

In some embodiments the planar biocompatible hydrogel-based macrodevice or the composition comprises microtissues that secrete insulin to treat diabetes.

In some embodiments the microtissues comprise islet cells.

According to a fourth aspect of the present invention, there is use of a planar biocompatible hydrogel-based macrodevice of any aspect of the invention or a composition of any aspect of the invention as an implant for treating a subject.

According to a fifth aspect of the present invention, there is kit comprising a planar biocompatible hydrogel-based macrodevice of any aspect of the invention or a composition of any aspect of the invention.

In some embodiments the kit is used to treat a subject in need thereof. For example, a subject may need treatment for diabetes and said kit comprises a macrodevice or composition according to any aspect of the invention comprising insulin-secreting microtissues.

EXAMPLES

Figure 1A:
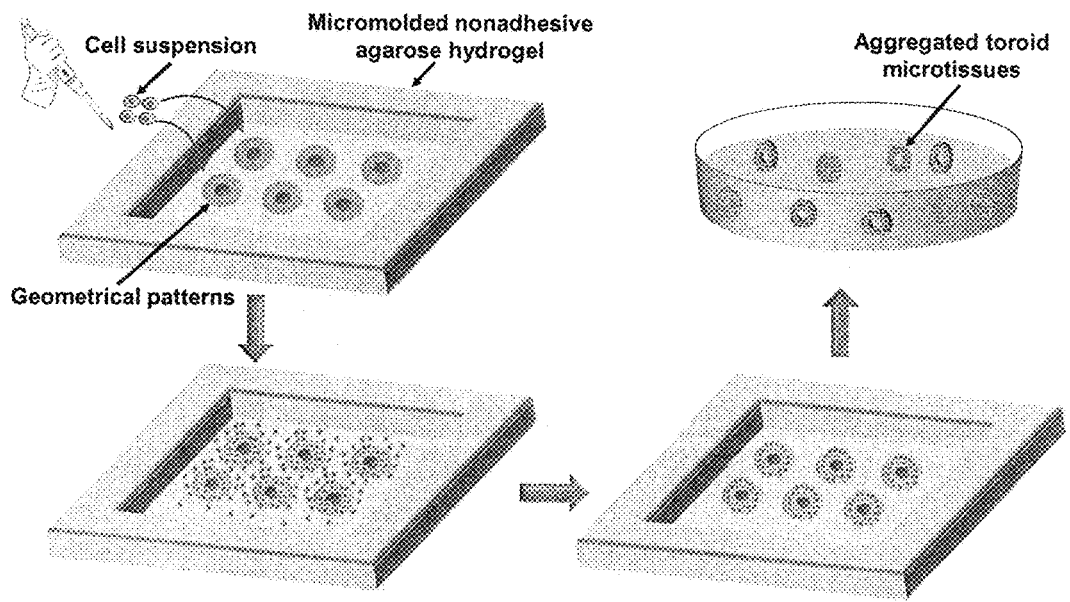
FIGS. 1A-B are schematic diagrams of the procedure to fabricate microtissues.

Example 1: Methods for Fabrication, Characterization of Microtissues and their Encapsulation in Alginate Microcapsules 1.1. Fabrication of Micromolded Agarose Hydrogels As illustrated in FIG. 1A, sSilicone templates 3D Petri Dish® (Sigma-Aldrich, USA) were utilized to prepare micropatterned agarose hydrogels consisting of multiple recesses with desired geometries [Napolitano, A. P. et al., *Biotechniques*, 43: 494, 496-500 (2007)]. Ultrapure© Agarose (Invitrogen, Carlsbad, USA) powder was autoclaved and dissolved by heating in sterile Mili-Q water to form a 2.3% (w/w) solution which was subsequently added into each silicon template and allowed to solidify at room temperature for 25 min. Afterwards, solidified micromolded agarose hydrogels were detached from the silicone template using a spatula and transferred to a sterilized 6-well tissue culture plate. Each micromolded agarose hydrogel was equilibrated with 3 mL of culture medium overnight before cell seeding. Toroid-fabricating recesses, arranged in a 6×6 array per agarose gel, were each 750 μm deep and 1400 μm wide. Their central pegs and surrounding circular tracks had diameters of 600 μm and 400 μm respectively. Rod-fabricating recesses, arranged in a 15×6 array per agarose gel, were each 2200 μm long, 400 μm wide and 750 μm deep.

Sphere-fabricating recesses, arranged in a 9×9 array per agarose gel, were each 800 μm deep with a round bottom of 800-μm diameter.

1.2. Cell Culture

Rat insulinoma cell line (INS-1E) was a generous gift from Dr. Yusuf Ali (Lee Kong Chian School of Medicine, Nanyang Technological University, Singapore) with permission from Professor Claes B. Wollheim (Lund University, Sweden). INS-1E cells at passages of 96-110 were cultured according to a published protocol [Napolitano, A. P. et al., Tissue Eng., 13: 2087-2094 (2007)]. Cells were cultured in RPMI complete medium which consisted of RPMI-1640 medium (Hyclone, USA) supplemented with 10% heat-inactivated fetal bovine serum (Gibco Laboratories, USA), 2 mM L-glutamine, 10 mM HEPES, 1 mM sodium pyruvate, 100 U/mL penicillin, 100 μg/mL streptomycin and 50 μM 2-mercaptoethanol. Cells were maintained in a humidified atmosphere containing 95% air and 5% $CO_2$ at 37° C. At a confluency of about 70%, cells were detached after treatment with 0.25% trypsin-EDTA (Gibco Laboratories, USA) for 2 min at 37° C. Subculture was performed at a 1:4 split ratio with a plating density of $2 \times 10^5$ cells/cm$^2$. Culture medium was replaced every 3 days.

1.3. Fabrication of Islet-Like Microtissues

Seeding of INS-1E cells onto micromolded agarose hydrogel was carried out as previously described [Dahl, U. et al., Development, 122: 2895-2902 (1996)]. Typically, a 175 μL volume of single cell suspension with desired density was pipetted into each micromolded agarose hydrogel. Cells were allowed to sink to the bottom of the recesses for 30 min before 2.5 mL of the culture medium was added to the micromolded agarose hydrogel. Typically, after 55 h from initial seeding of monodispersed INS-1E cells, microtissues were retrieved using pipette loaded with large orifice filter tips (VWR, USA) and rinsed 3 times with RPMI complete medium and kept in the same medium prior to further characterization. Microtissues were analysed immediately after retrieval for number of cells per microtissues, percentage of death cells, metabolic activity and live/dead staining. Retrieved microtissues were cultured in RPMI complete medium and kept in an incubator at 37° C., 5% $CO_2$ for 2.5 hour prior to GSIS assay.

1.4. Cell Counting and Trypan Blue Exclusion Assay of Dissociated Microtissues The number of cells per microtissue and the viability of the microtissues were characterized with trypan blue exclusion assay (Life Technologies, USA). A volume of 200 μL of the culture medium containing 10 microtissues was transferred into a 1.5 mL Eppendorf tube. After the microtissues settled into the bottom of the Eppendorf tube, 185 μL of the culture medium was removed, and the microtissues were rinsed with 200 μL of phosphate-buffered saline (PBS) (Hyclone, USA) twice. Subsequently, each tube was added with 40 μL of 0.25% trypsin-EDTA and incubated at room temperature for 10 min. Afterwards, 95 μL of the culture medium was added into the tubes to inactivate the trypsin, and the microtissues was then dissociated into single cell suspension by gentle pipetting. The cell suspension was stained with trypan blue at a 1:1 volume ratio and counted with a COUNTESS™ II automated cell counter (Thermal Fisher Scientific, Ill., USA) to determine the cell density and the percentage of dead cells. The percentage of dead cells was also calculated as the ratio of the number of dead cells to the number of cells in the suspension.

1.5. Live/Dead Fluorescent Staining of Microtissues

The viability of intact microtissues was characterized using LIVE/DEAD™ cell viability kit (Thermo Fisher, USA). Several microtissues were transferred into a 24-well plate. Excess medium was removed and the microtissues were rinsed with 2 mL of PBS three times. After 1 mL of PBS containing 1.6 μM of calcein-AM and 13 μM of ethidium homodimer-1 were added into each well, the microtissues were incubated at 37° C. for 45 min. During this incubation, microtissues were stirred once by gentle pipetting to achieve homogenous staining. Microtissues were rinsed with 2 mL of PBS three times and visualized using a confocal microscope (ZEISS LSM 800 with Airyscan, Carl Zeiss, Germany) with the excitation wavelengths of 488 nm and 543 nm for imaging of live and dead cells respectively. The images of stained microtissues were captured at different depths with the slice interval of 1 μm for a total thickness of approximately 200 μm.

1.6. Evaluating Metabolic Activity of Microtissues

The metabolic activity of microtissues was characterized using WST-1 proliferation assay (Abcam, USA). A volume of 200 μL of the culture medium containing 8 microtissues was transferred into a 96-well non-treated tissue culture plate. After 130 μL of the culture medium was removed, a 150 μL volume of a mixture containing the culture medium and WST-1 reagent at a 6.5:1 volume ratio was added into each well. The plate was incubated at 37° C. for 3 h. Afterwards, 110 μL of the supernatant was transferred to another 96-well plate and the sample absorbance at 450 nm was measured using a microplate reader (SPECTRAMAX® M5, Molecular Devices, USA).

1.7. Characterizing Surface-to-Volume Ratio of Microtissues

The dimensions of microtissues were measured from the optical images acquired with an inverted phase contrast microscope (CKX, Olympus, Japan). Toroid, rod and spheroid microtissues were approximated to the corresponding ideal shapes of torus, cylinder and sphere respectively. The volume and surface area of toroid microtissue were calculated as $V_T = 0.25\pi^2 \times (a+b) \times (b-a)^2$ and $S_T = \pi^2 \times (b^2 - a^2)$ respectively, where b is the outer radius and a is the inner radius of the torus. The volume and surface area of rod microtissue were calculated as $V_R = \pi r^2 L$ and $S_R = 2T\pi \times (r+L)$ respectively, where r is the radius and L is the length of the cylinder. The volume and surface area of spheroid microtissue were calculated as $V_s = (4/3)\pi \times r^3$ and $S_s = 4\pi \times r^2$ respectively, where r is the radius of the sphere.

1.8. Static Glucose-Stimulated Glucose Secretion

A volume of 200 μL of the culture medium containing 8 microtissues were transferred into a 96-well plate. After 130 μL of the culture medium was removed, microtissues were rinsed with 250 μL of glucose-free RPMI-1640 complete medium twice to remove residual insulin. The microtissues were preincubated with the glucose-free medium for 1.5 h at 37° C. After the microtissues were washed twice with Krebs Ringer buffer HEPES (KRBH) (135 mM NaCl, 5 mM NaHCO$_3$, 0.5 mM NaH$_2$PO$_4$, 3.6 mM KCl, 1.5 mM CaCl$_2$, 0.5 mM MgCl$_2$, and 10 mM HEPES, pH 7.4. BSA (0.1%)), the in vitro insulin secretion was evaluated by three consecutive incubations of the microtissues in 200 μL of KRBH containing 2.8 mM and then 16.8 mM glucose followed by 2.8 mM glucose at 37° C. for 1 h per incubation. The residual insulin was removed by rinsing the samples twice with glucose-free KRBH buffer between the two incubations. At the end of each incubation, 30 μL of the supernatant was removed and stored at −20° C. for subsequent analysis. The insulin concentrations were measured by Ultrasensitive Insulin ELISA (ALPCO Diagnostics, USA) and normalized by DNA content, which were quantified using CyQUANT® Cell Proliferation Assay (Invitrogen, USA). Briefly, microtissue samples collected after the third incubation with glucose solution were frozen at −80° C. overnight. After thawing, each microtissue sample was treated with 120 μL of cell lysis buffer containing 1 mM EDTA, 180 mM NaCl and RNAse A (Invitrogen, USA) at a concentration of 1.35 Kunitz units/mL, for 2 hours at room temperature. CyQUANT® GR dye was subsequently added to the RNAse-digested samples and the resulting fluorescence signals (excitation 480 nm, emission 520 nm) were measured to determine DNA concentrations with reference to a standard DNA calibration curve using a microplate reader (SPECTRAMAX® M5, Molecular Devices, USA).

1.9. Encapsulation of Microtissues in Alginate Hydrogel

Figure 1B:
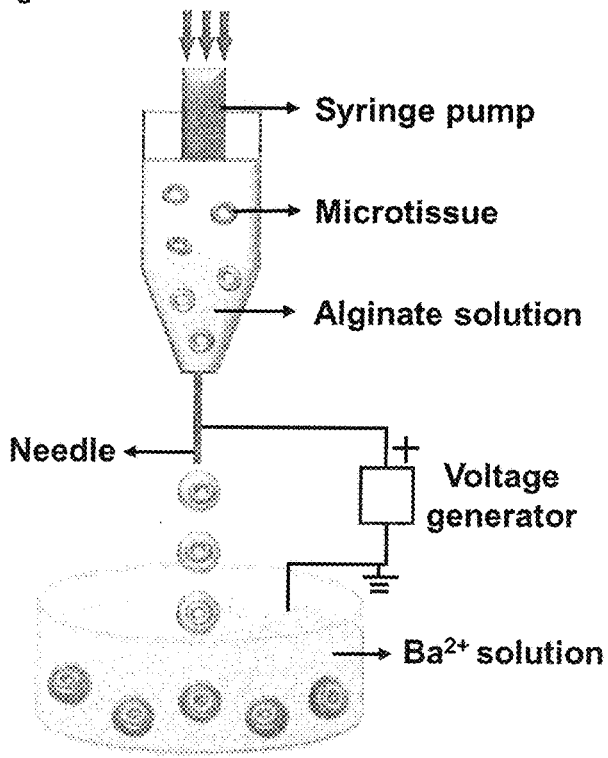

As illustrated in FIG. 1B, alginate microcapsules containing microtissues were produced using an electrostatic droplet generator following published protocols [Dang, T. T. et al., *Biomaterials* 34 (23): 5792-5801 (2013); Veiseh, O. et al., *Nat Mater* 14 (6): 643-651 (2015)]. Sodium alginate (PRONOVA UP LVG, FMC Biopolymer, Norway) was dissolved at 1.5% (w/v) in a 0.9 wt % NaCl solution. Microtissues were homogeneously suspended in 500 μL of the sodium alginate solution at a density of approximately 340-500 microtissues/mL and loaded into a 1 mL syringe. The microtissue-containing alginate suspension was extruded through a 20 G blunt needle (SAI Infusion Technologies, USA) of the droplet generator into a bath of 20 mM BaCl$_2$ solution at a flow rate of 0.2 mL/min and a voltage of in a range of 5.0-6.0 kV. Alginate microcapsules were left to crosslink for 2 min before they were rinsed three times with glucose-free KRBH buffer. The diameters of the alginate hydrogel microcapsules produced were in the range of 800-1000 μm. Images of all encapsulated microtissues were independently examined by three researchers to determine the average number of compromised microtissues for quantification of the fraction of microtissue breakage post-encapsulation. Ten encapsulated intact microtissues and ten bare microtissue of each geometry were individually cultured in RPMI complete medium in separate wells in a 96-well plate. The wells containing the bare microtissues were previously coated with 2.3 wt % agarose which solidified to form a hydrogel layer at the bottom of the well before microtissues were added. Optical images of these individual microtissues were acquired at various time points to monitor and compare any change in their structural appearance.

1.10. Statistical Analysis

All values are expressed as the mean±standard error of the mean. The statistical significance of percentage of dead cells, metabolic activity per microtissues, volume and SA/Vol ratio of microtissues were determined using one-way ANOVA analysis with Tukey's post-hoc test software. Secreted insulin levels after exposure to 2.8 mM and 16.8 mM glucose solutions were compared using one-way repeated measures ANOVA analysis with Tukey's post-hoc test. P-values less than 0.05 were considered significant.

Example 2

Formation of Islet-Like Toroidal Microtissues on Hydrogel Micromold

Microtissues with controlled geometries were fabricated using micromolded nonadhesive agarose hydrogel as shown in the schematic diagram of FIG. 1A. Agarose hydrogels have been used to produce three-dimensional (3D) multi-cellular aggregates due to its cytocompatibility, nonadherent property and ease of physical crosslinking at room temperature [Napolitano, A. P. et al., *Biotechniques* 43 (4): 494-500 (2007)]. In this example, agarose solution (2.3% w/w) was brought into contact with autoclaved silicone templates containing arrays of features with desired geometries and were left to solidify at room temperature to form micromolded agarose hydrogel. Upon removal, the agarose hydrogels contained precise negative replicates of the geometrical patterns on their corresponding silicone templates. Previous studies reported that dispersed rat hepatoma, human fibroblasts and human umbilical vein endothelial cells were able to aggregate into multi-cellular microtissues on micromolded nonadherent agarose hydrogels [Dean, D. M. et al., *FASEB J* 21 (14): 4005-4012 (2007); Napolitano, A. P. et al., *Tissue Eng* 13 (8): 2087-2094 (2007)]. In this study, rat insulinoma INS-1E cell line, due to its ability to secrete insulin in response to varying physiological glucose concentrations [Merglen, A. et al., *Endocrinology* 145 (2): 667-678 (2004)], was chosen to model β-cells which constitute the major cell type in native pancreatic islets. Suspension of monodispersed INS-1E cells was seeded into the recesses of micromolded agarose hydrogels where these cells sank due to gravity. The nonadhesive surface of agarose hydrogels prevented seeded cells from attaching to the bottom of the recesses, facilitating interaction between mono-dispersed cells which aggregates in the recess of the agarose mold to form 3D structures of desired geometry [Berridge, M. Tan, A. *Protoplasma*, 205: 74-82 (1998); Saelens, X. et al., *Oncogene*, 23: 2861-2874 (2004)]. This self-assembly of INS-1E cells was possibly regulated by extracellular calcium ions and E-cadherin, both of which had been reported to play an essential role in the modulation of cell-cell interaction to maintain the architecture of primary islets [Dahl, U. et al., *Development* 122 (9): 2895-2902 (1996); Rouiller, D. G. et al., *Dev Biol* 148 (1): 233-242 (1991)]. During the process of cellular aggregation, microtissues underwent contraction to form compact structures which were gently dislodged from the recesses of the agarose mold by pipetting and subsequently transferred into fresh culture medium.

Example 3

Effect of Initial Cell Seeding Density on Microtissue Size and Viability

Figure 2A:
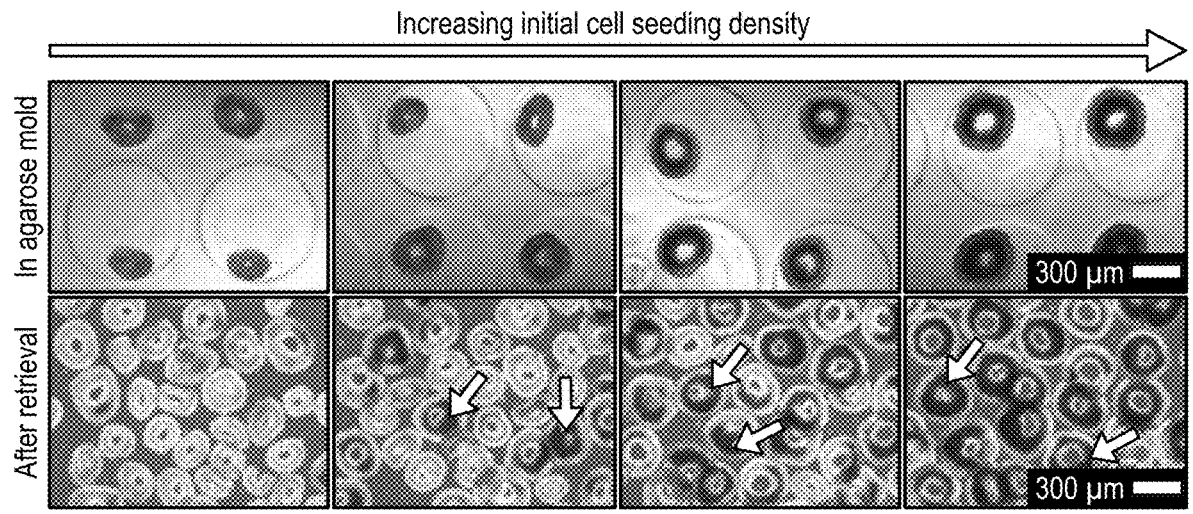
FIG. 2A-G shows the effect of initial cell seeding density on cell number and viability of microtissues.
Figure 2B:
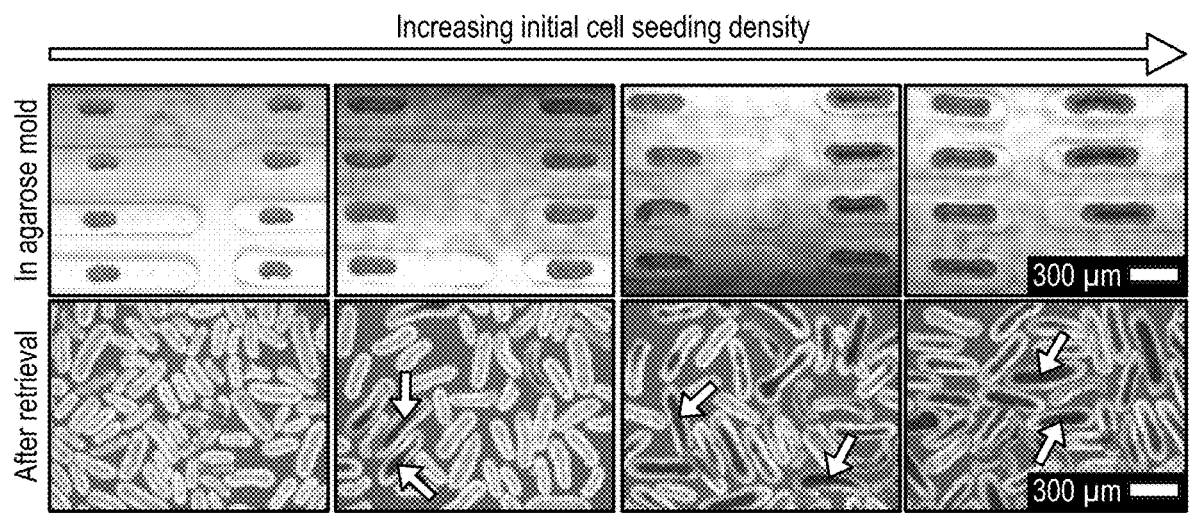
Figure 2C:
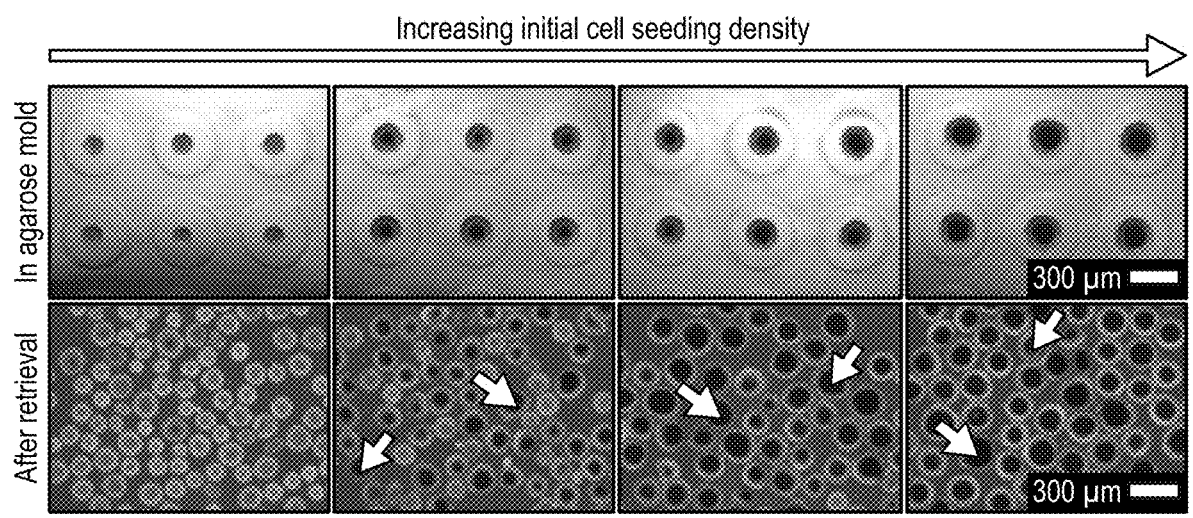

The inventors evaluated the feasibility of fabricating INS-1E islet-like microtissues with different geometries and the ability to tune microtissue size by varying initial cell seeding density. The optical images in FIGS. 2A(i-iv), B(i-iv) and C(i-iv) showed the formation of microtissues with toroid, rod and spheroid geometries in the micromolded agarose hydrogels as dictated by the shapes of the recesses. FIG. 2A(v-viii), B(v-viii), C(v-viii) are bright-field images of these microtissues after their retrieval from the agarose hydrogels by pipetting. The similar morphologies of the microtissues before and after retrieval confirmed that the structural integrity of most microtissues was not compromised by this process.

Figure 2D:
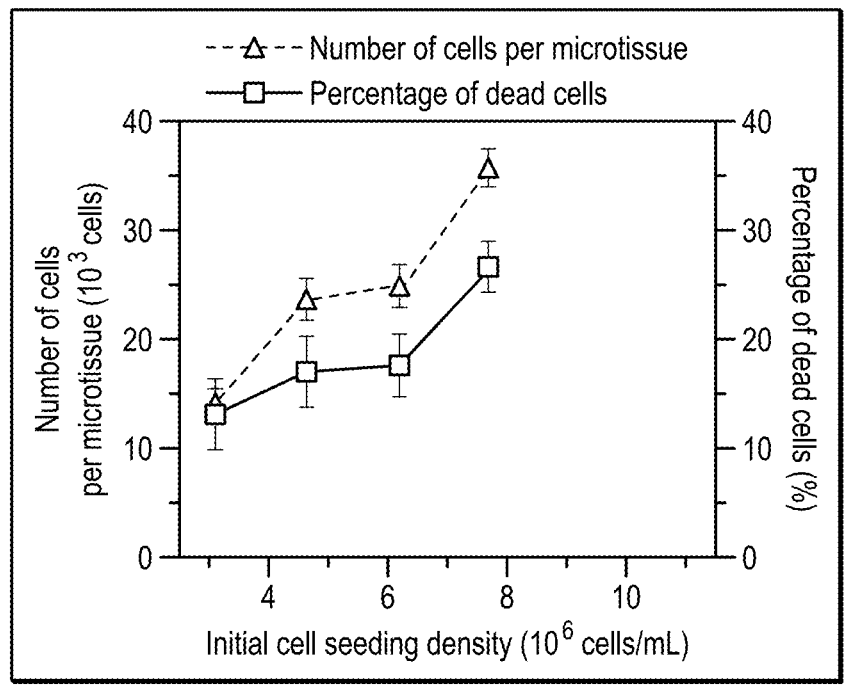
Figure 2E:
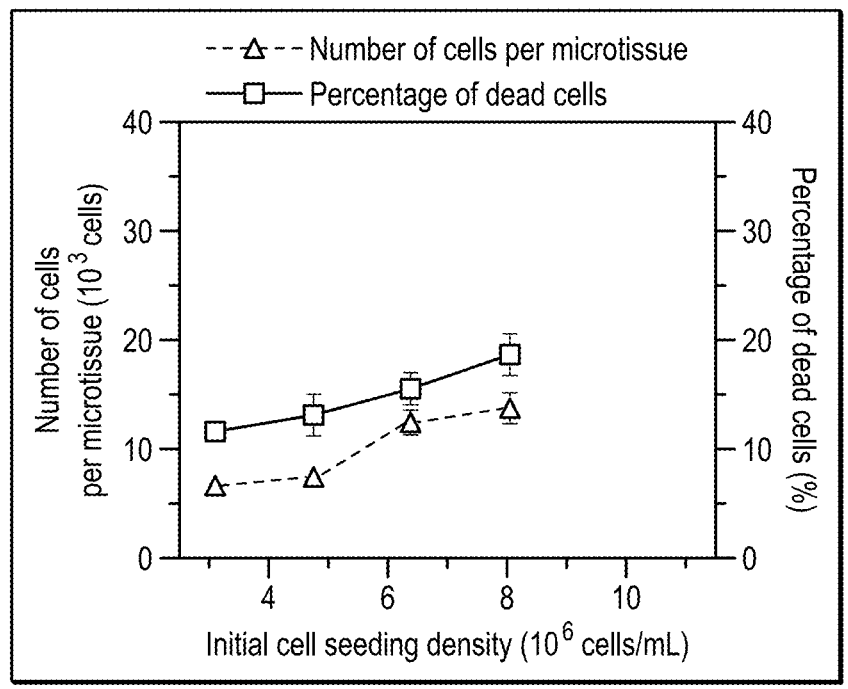
Figure 2F:
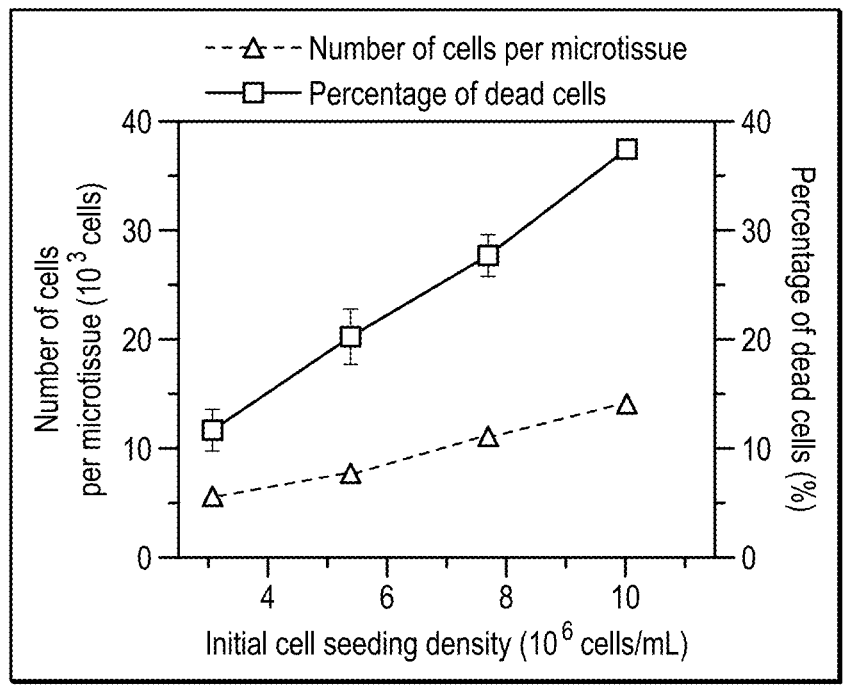
Figure 2G:
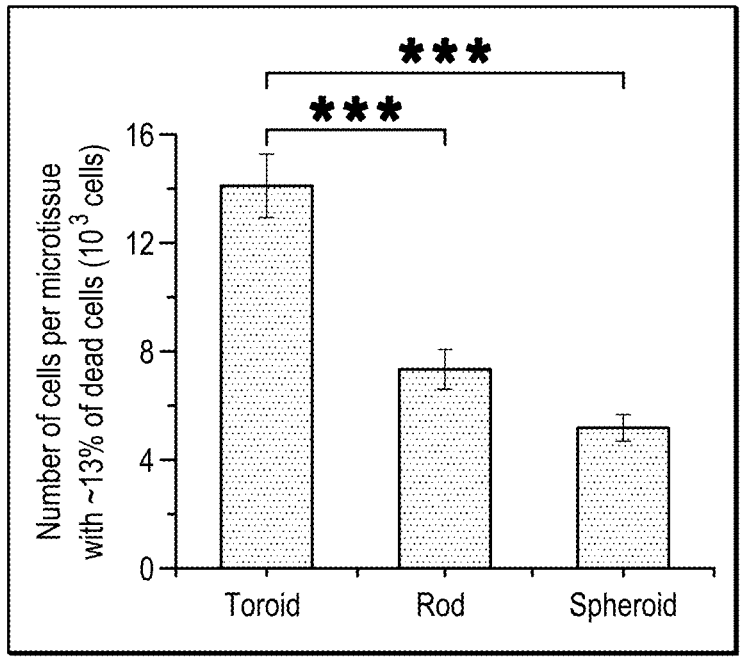

It was previously reported that cell viability decreased with increasing size of human islets [Komatsu, H. et al., *PloS one* 12 (8): e0183780 (2017)]. To quantitatively explore the relationship between the initial seeding density and the microtissue size, cells were seeded into the agarose hydrogels at various seeding densities between 3 to $10 \times 10^6$ cells/ml. Immediately after retrieval from micromolded agarose hydrogel, microtissues were enzymatically dispersed into single cell suspension by incubation with trypsin, followed by gentle pipetting and staining with trypan blue. Microtissues were enzymatically dispersed into single cells and characterized by trypan blue exclusion assay to quantify the percentage of dead cells. An automated cell was subsequently used to determine the number of cells in each microtissue. The percentage of dead cells was also calculated as the ratio of the number of dead cells to the total number of cells in the suspension. For each geometry, the cell number per microtissue increased with the initial cell seeding densities (FIG. 2D, E, F), demonstrating our ability to control microtissue size solely by changing initial seeding density. In addition, the percentage of dead cells in the microtissues increased with the cell number per microtissue (FIG. 2D, E, F). This quantitative result was consistent with the optical images visually demonstrating that, for each geometry, the dark region comprising dead cells at the centre of microtissues also increased with initial cell seeding density (FIG. 2A, B, C). This finding was in agreement with published studies reporting that cellular viability decreased with increasing size of human islets [Livoti, C. M. Morgan, J. R. *Tissue Eng Part A*, 16: 2051-2061 (2010)] and hepatocyte spheroids [Henquin, J. C. *Diabetes*, 49: 1751-1760 (2000)]. Both a computational stimulation model [Komatsu, H. et al., *PloS one* 12 (8): e0183780 (2017)] and a recent in vitro study [Sigmundsson, K. et al., *Matrix Biol* 70: 5-19 (2018)] suggested that hypoxia developed in human and mouse islets is the major factor implicated in the formation of dead cells at the core of these islets due to the low oxygen tension. Furthermore, in our experiments, for a similar percentage of cell death of about 13%, the number of cells per microtissue was approximately 14000, 7500 and 5500 for the toroid, rod and spheroid microtissues, respectively (FIG. 2G). This result demonstrated that, to achieve similar cell viability, toroid geometry supports cell packing into individual microtissues more efficiently than rod and spheroid geometries.

Example 4

Effects of Microtissue Geometry on Cell Viability

Figure 3A:
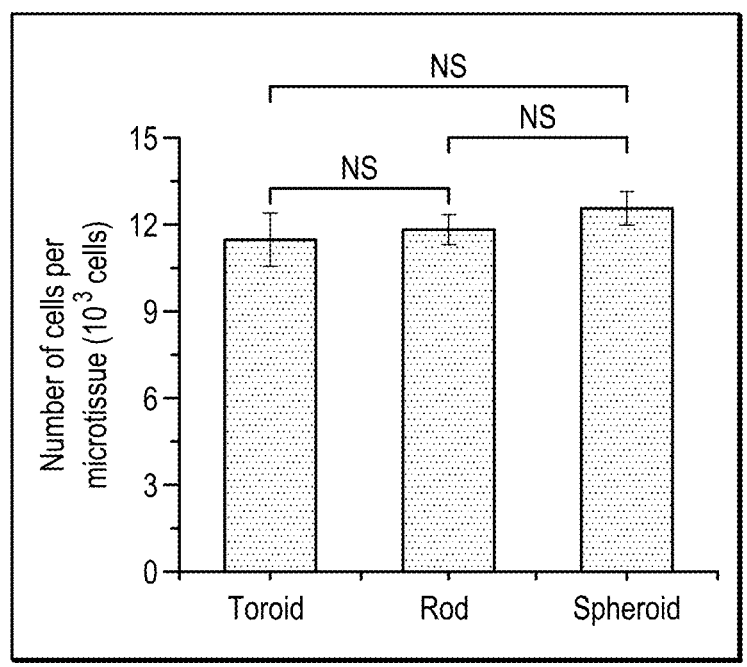
FIG. 3A-G shows the effect of microtissue geometry on cellular viability.
Figure 3B:
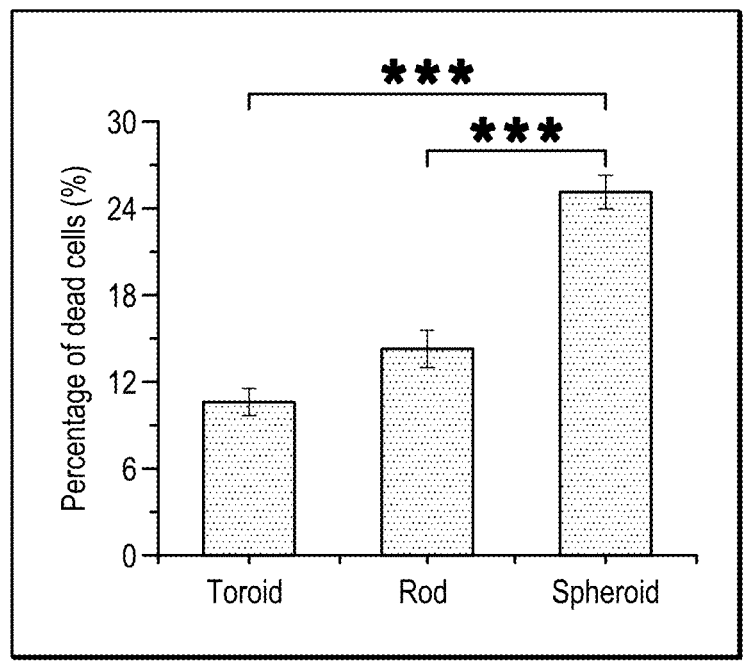
Figure 3C:
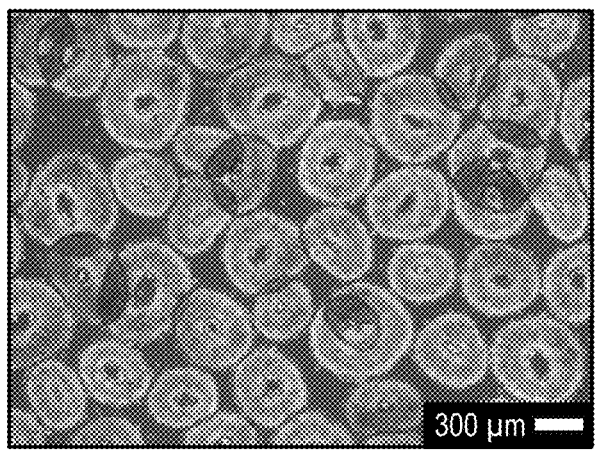
Figure 3D:
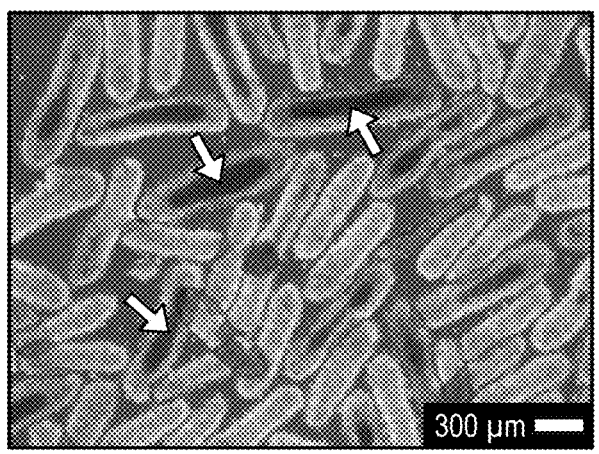
Figure 3E:
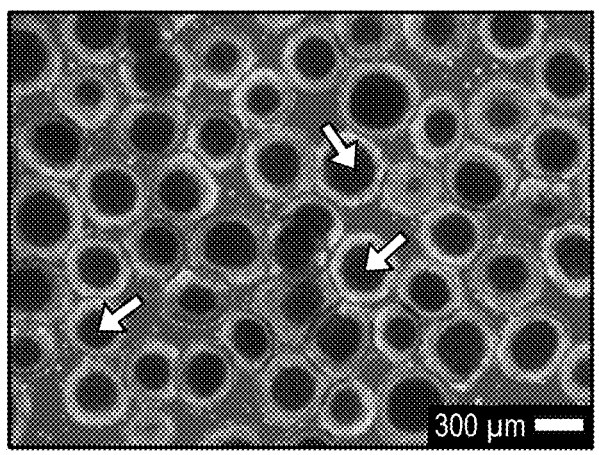
Figure 3F:
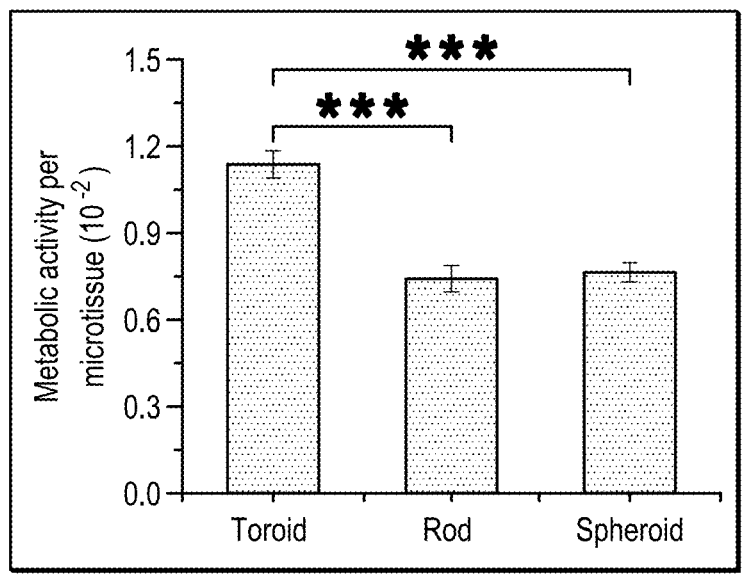

The effect of microtissues geometry on cell viability was further evaluated by characterizing the metabolic activity of microtissues with toroid, rod and spheroid shapes. The cell number per microtissue was first standardized while varying microtissue geometry. The relationship between initial cell seeding density and cell number per microtissue for each geometry (FIG. 2 and FIG. 8) was utilized to estimate the initial cell seeding densities for this volume standardization. We fabricated toroid, rod and spheroid microtissues with a similar number of cells per microtissue using initial cell seeding densities of 3.5, 5.8 and 9.3 million cells/ml, respectively. Microtissues were dispersed into single cell suspension after trypsinization, stained with trypan blue and counted by automated cell counter. The result in FIG. 3A confirmed that the average number of cells per microtissue for all 3 geometries was approximately 12000. The average percentage of dead cells was the lowest (11%) for toroid microtissues and the highest (29%) for spheroid microtissues (FIG. 3B). This was in agreement with the optical images (FIG. 3C-E) showing that the dark region at the core of the microtissues was smallest for toroid and largest for spheroid geometry. In addition to characterizing the relative percentage of live and dead cells, monitoring the metabolic health of live cells is also important for understanding the effects of microtissue geometry. In parallel experiments, WST-1 reagent was used to characterize the metabolic activity of live cells of intact microtissues. The tetrazolium salt WST-1 can be cleaved primarily at the external surface of live cells to form a water soluble formazan, whose concentration can be determined colorimetrically [Berridge M. and Tan, A. *Protoplasma* 205 (1-4): 74-82 (1998)]. FIG. 3F showed that toroid microtissues had much higher metabolic activity than rod and spheroid microtissues. FIG. 3F showed that toroid microtissues had a much higher metabolic activity than that of rod or spheroid microtissues. Interestingly, though the percentage of dead cells for spheroid microtissues was higher than that of rod microtissues (FIG. 3B), the metabolic activity of rod microtissues was the same as that of spheroid microtissues (FIG. 3F). Overall, these results (FIG. 3B-F) demonstrated that toroidal shape was a better geometry to maintain the viability and metabolic activity of islet-like microtissues.

Figure 3G:
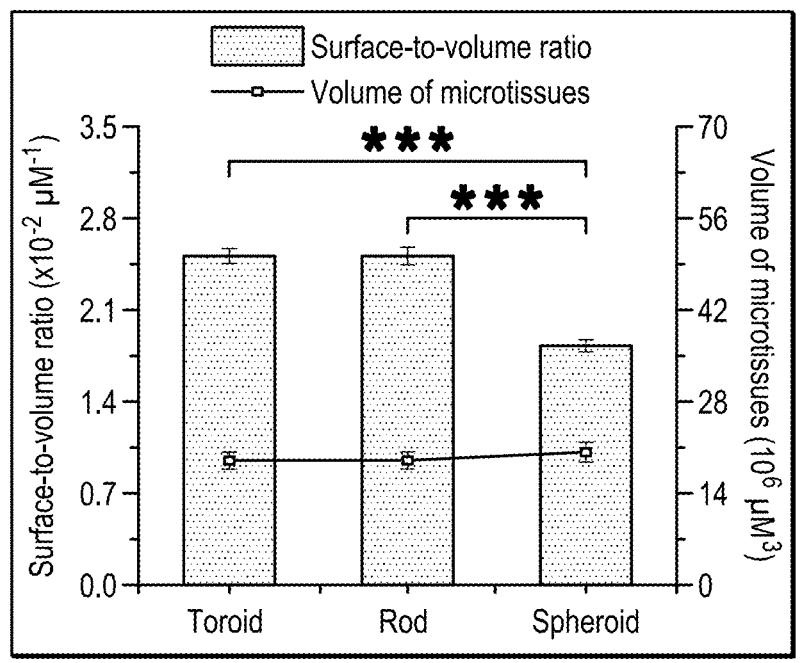
Figure 9:
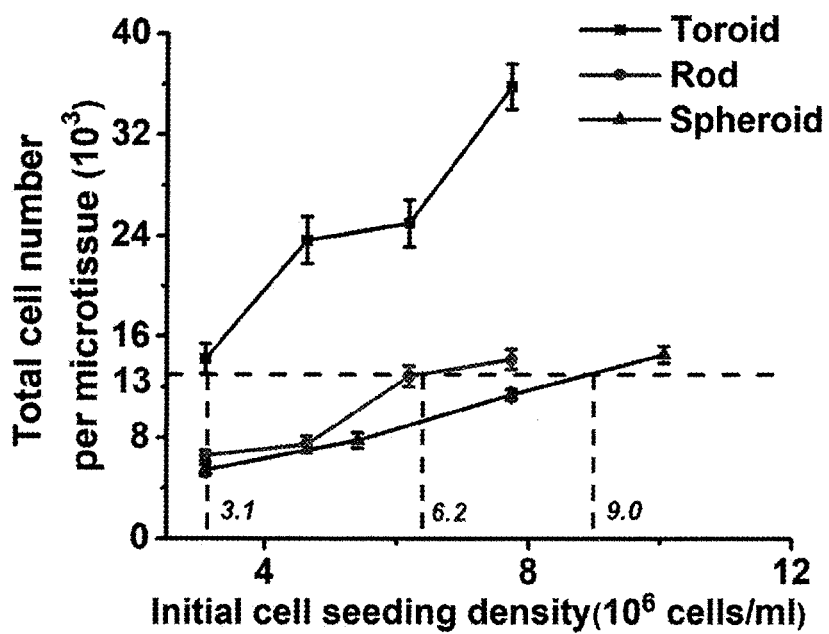
FIG. 9 shows estimated initial cell seeding density for standardization of cell number per microtissues for each geometry using the relationship between initial cell seeding density and cell number per microtissue in FIG. 2. Estimated initial cell seeding densities for toroid, rod and spheroid microtissues to have approximately 13000 cells per microtissue were 3.1, 6.2 and 9.2 million cells/mL respectively.
Figure 10:
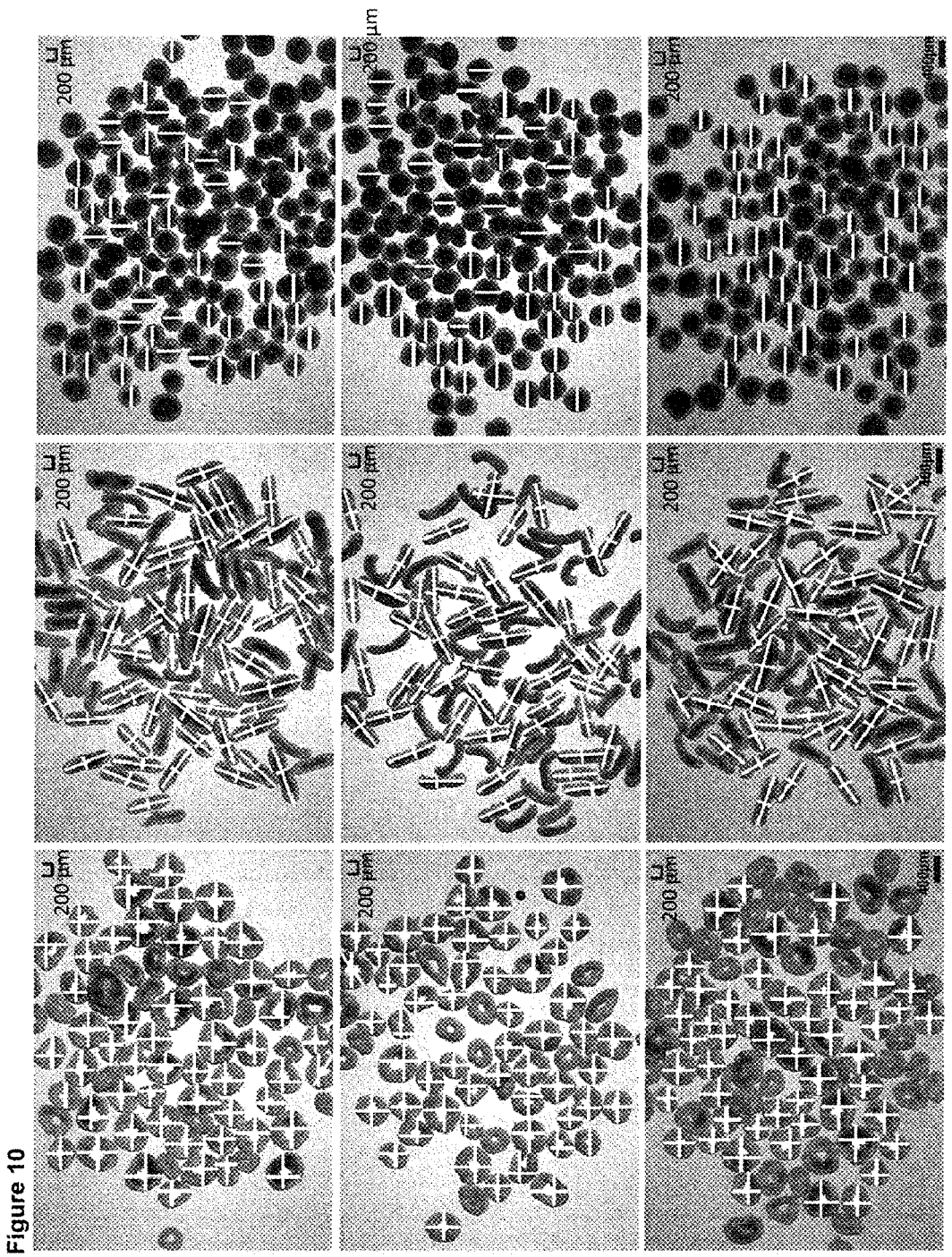
FIG. 10 shows measurement of microtissue dimension for calculation of their surface-to-volume ratio and volume as reported in FIG. 3G. Three images in each row were taken from a single experiment during which microtissues of all three geometries were fabricated from the same batch of cells (n=3 batches of microtissues, 53 microtissues per batch). The white lines on the microtissues were added after image acquisition to indicate the positions where dimension was measured. The scale bars representing 400 μm apply to all images acquired at the same magnification.

To explore the relationship between microtissue geometry and SA/Vol, toroid, rod and spheroid microtissues were approximated to ideal geometries which are torus, cylinder and sphere respectively. The volume of the microtissues were estimated using mathematical formulae for these ideal shapes and the dimensions of microtissues measured from optical images (FIG. 9). FIG. 3G suggested that, for the same standardized volume, toroid and rod microtissues had significantly higher SA/Vol compared to that of spheroid microtissues. This was consistent with the result that that the percentage of dead cells of both toroid and rod microtissues were lower than that of spheroid microtissues (FIG. 3B).

Figure 4A:
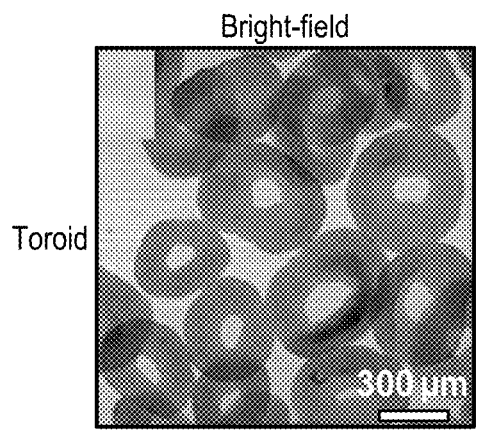
FIG. 4A-L shows assessment of viability of microtissues by live/dead staining and confocal microscopy.
Figure 4D:
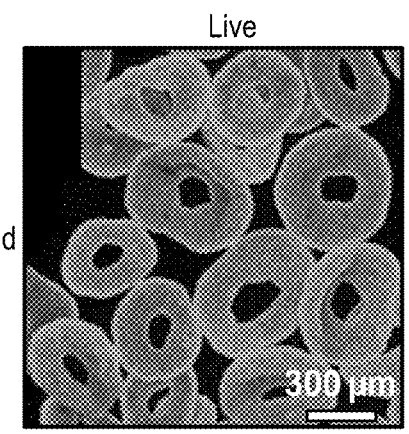
Figure 4B:
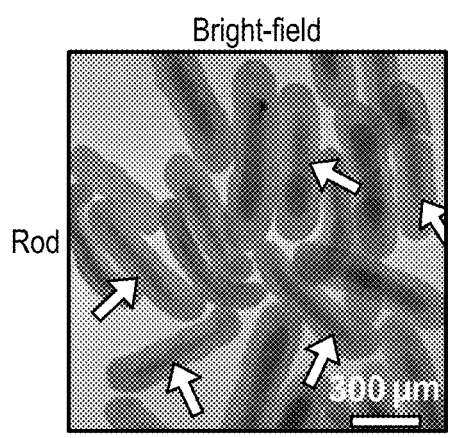
Figure 4E:
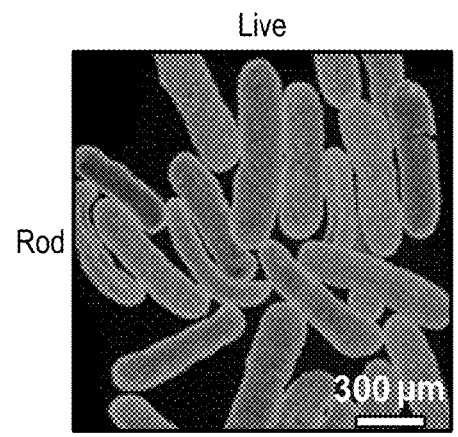
Figure 4C:
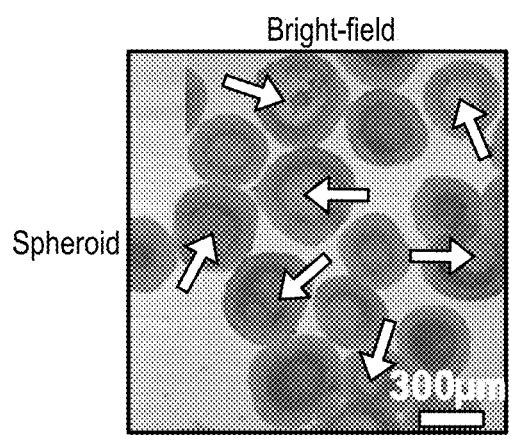
Figure 4F:
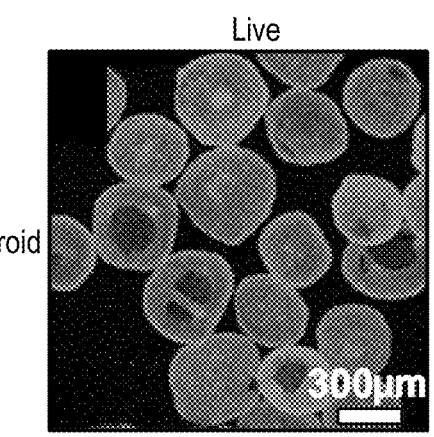
Figure 4G:
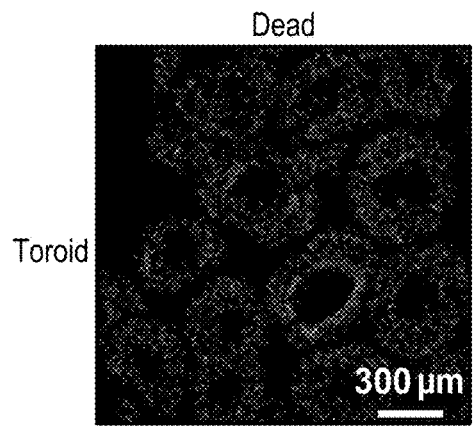
Figure 4J:
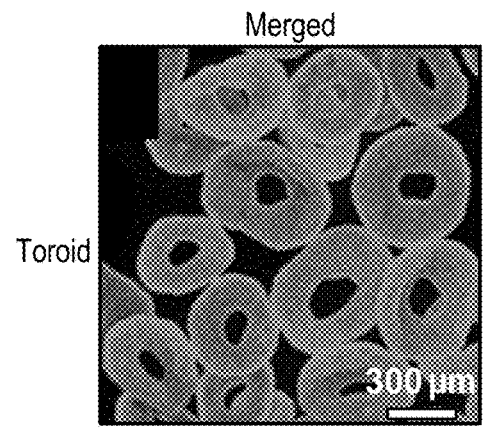
Figure 4H:
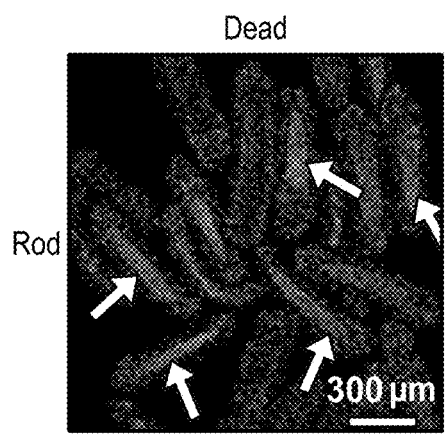
Figure 4K:
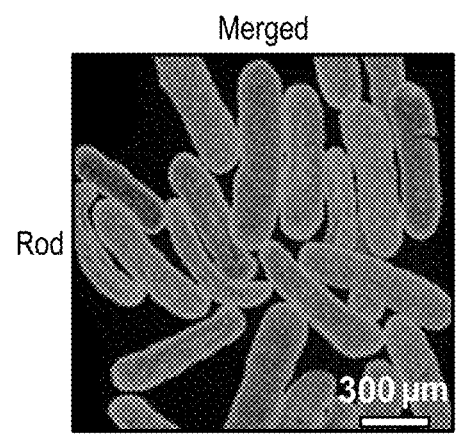
Figure 4I:
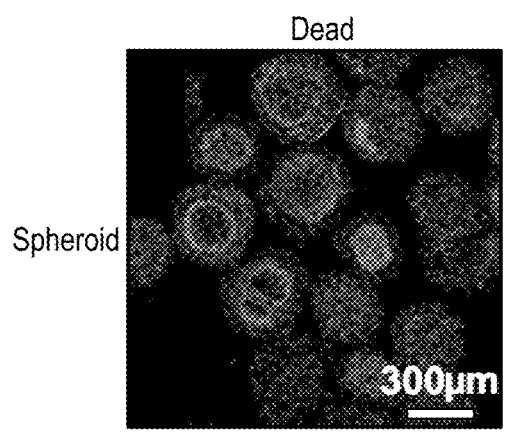
Figure 4L:
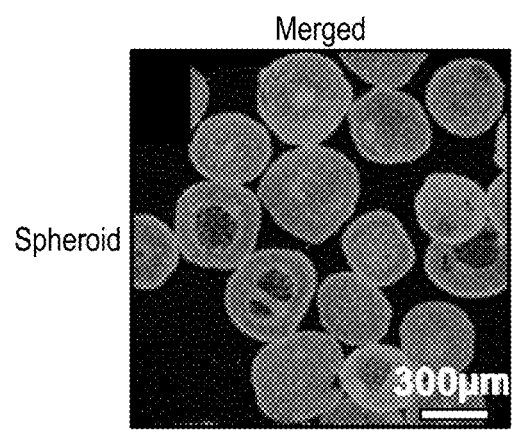

To further visualize the viability of microtissues, the inventors performed a fluorescent staining assay followed by confocal microscopy to visualize the 3D distribution of live and dead cells in the microtissues. In this assay, viable cells were stained by non-fluorescent cell-permeable Calcein-AM which is cleaved by intracellular esterases to produce green fluorescence. Concurrently, dead cells were stained by ethidium homodimer-1 which permeates compromised cell membrane to bind to DNA and produce red fluoresence. FIG. 4A-C are the bright-field images of the stained microtissues while FIG. 4D-L shows the combined projection of multiple images captured at different depths of the same microtissues. The green channel images (FIG. 4D, E, F) confirmed that most cells on the surface of all three types of microtissues were alive. However, the red channel images (FIG. 4G, H, I) revealed interesting differences in the distribution of dead cells in the interior of the microtissues of three geometries. Toroid microtissues have only a few dead cells which spread sporadically throughout the microtissues. On the contrary, more dead cells were detected in the interior of the rod microtissues (FIG. 4H) at the same position as the dark cores in the bright field images (FIG. 4B) of the same microtissues as pointed at by the white arrows. Furthermore, the bright-field images (FIG. 4A, B) also showed that toroid and rod microtissues retained their original appearance and structural integrity after several staining and rinsing steps during the live/dead assay. In contrast, a light grey circular area, as pointed at by the white arrows in FIG. 4C, was observed at the center of each of several stained spheroid microtissues instead of a dark central core comprising of dead cells for unstained spheroids (FIG. 3E). This feature suggested that the dead cells at the core of these spheroid microtissues had been dislodged during the staining and rinsing process, allowing more light to penetrate through the core of the microtissues. The cellular debris from the core was probably discharged through small holes found on the surface of the spheroid microtissues (FIG. 9). A small fraction of dead cells remained adjacent to the outer live cell region, forming the circular black rim surrounding the central light gray region (FIG. 4C). This loss of dead cells from the core of some spheroid microtissues also accounts for a decrease in red fluorescence signal at the center of these microtissues (FIG. 4I), resulting in a red fluorescence signal comparable to that of rod microtissues, which did not suffer from the loss of dead cells during the staining and rinsing steps. The loss of dead cells from the core did not occur for unstained spheroid microtissues (FIG. 3E) which were not subjected to any fluorescent dye or rinsing process prior to the quantification of percentage of dead cells by trypsinzation and cell counting (FIG. 3B). Hence, the dead cells at the core were still accounted for in the higher percentage of dead cells for spheroid microtissues compared to that of rod microtissues as reported in FIG. 3B. Overall, the weaker mechanical properties of spheroid microtissues compared to that of toroid and rod structures correlated with the higher percentage of dead cells in these spheroids.

Example 5

Effect of Microtissue Geometry on Insulin Secretion

Figure 5:
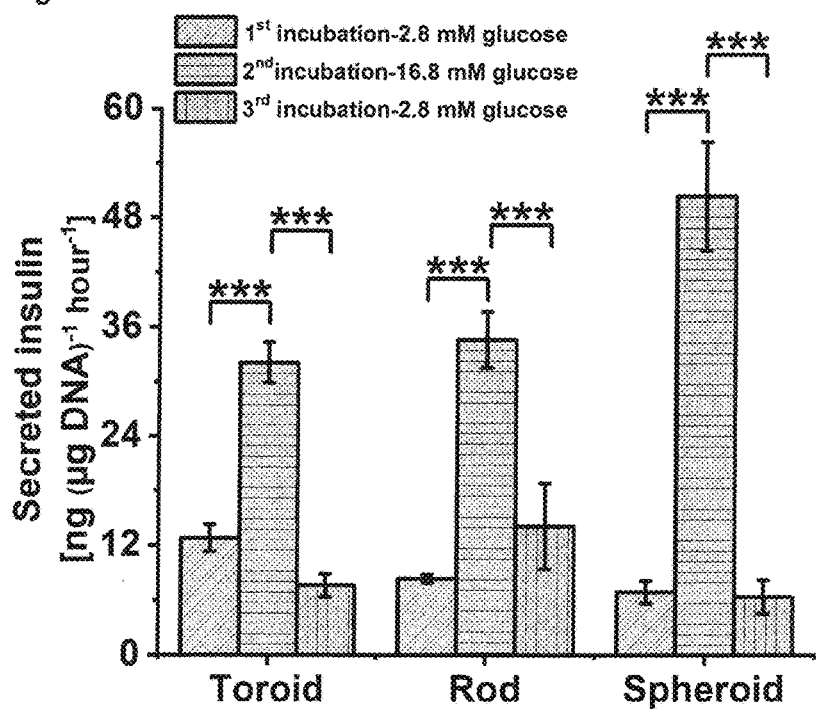
FIG. 5 shows insulin secretion from microtissues in response to static glucose stimulation. Insulin secretion from microtissues in response to static glucose stimulation. Microtissues were consecutively incubated in low glucose (2.8 mM) and high glucose (16.8 mM) followed by low glucose (2.8 mM) for 1 h at each concentration. For each geometry, a higher amount of insulin was secreted in response to the higher glucose level. Data is shown as mean±SEM (n=6 replicate samples). (*) and (***) denote p-values less than 0.05 and 0.005 respectively.
Figure 6A:
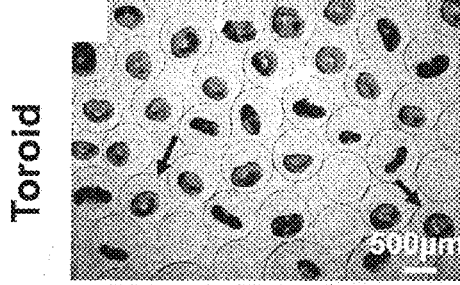
FIG. 6A-F shows optical images of microtissues encapsulated in alginate hydrogel capsules. Optical images of multiple (FIG. 6A-C) and single (FIG. 6D-F) toroid, rod and spheroid microtissues encapsulated in the alginate microcapsules. The black arrows indicate the surface of the uniform spherical alginate microcapsules which were optically transparent. The white arrows indicate the exterior surface of the microtissues. All scale bars represent 500 μm.
Figure 6D:
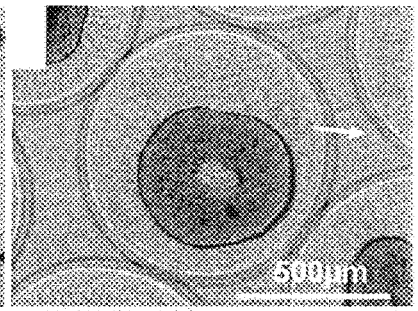
Figure 6B:
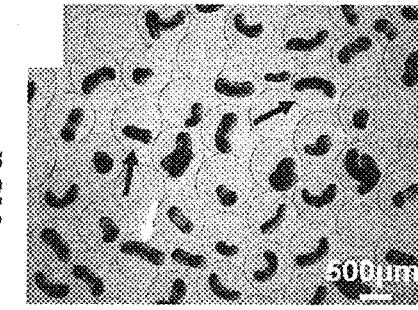
Figure 6E:
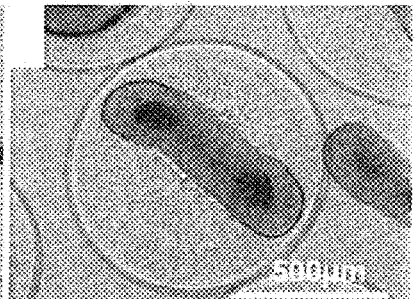
Figure 6C:
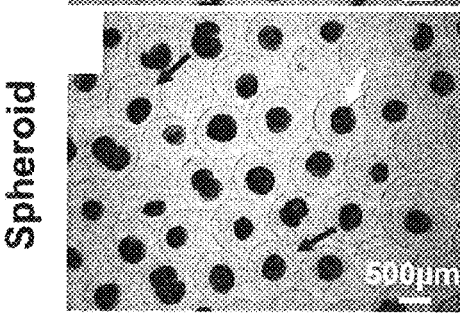
Figure 6F:
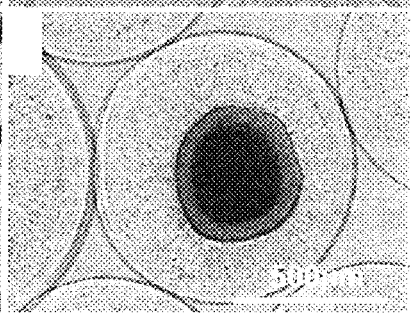

Physiologically appropriate insulin secretion from therapeutic cell transplants is important for maintaining glucose homostasis since excessive secretion led to hypoglycemia and insufficient secretion gave rise to hyperglycemia [Henquin, J. C. *Diabetes* 49 (11): 1751-1760 (2000)]. The inventors performed a glucose-stimulated insulin secretion (GSIS) assay to investigate the effect of microtissue geometry on insulin secretion from the INS-1E microtissues. Microtissues were subjected to three consecutive incubations at glucose levels of 2.8 mM, 16.8 mM and 2.8 mM to mimic alternate exposures to physiologically basal condition, hyperglycemic condition and a return to basal condition in diabetic patients respectively. The result showed that for each geometry, a greater amount of insulin was secreted in response to the higher glucose level during the second incubation compared to insulin secretion during the first exposure to lower glucose level (FIG. 5). The third incubation at the lower glucose level demonstrated a return to basal insulin level after the previous stimulation at the higher glucose level, confirming that the increased insulin secretion during the second incubation at high glucose level was not due to insulin dumping from distressed beta cells. Changing from a low to high glucose concentration led to an increase in insulin secretion within the range of 3.1 to 7.7-fold, comparable to results from a previous study reporting a 6.6-fold glucose stimulation index for INS-1E spheroid clusters [Merglen, A. et al., *Endocrinology* 145 (2): 667-678 (2004)].

Example 6

Figure 7:
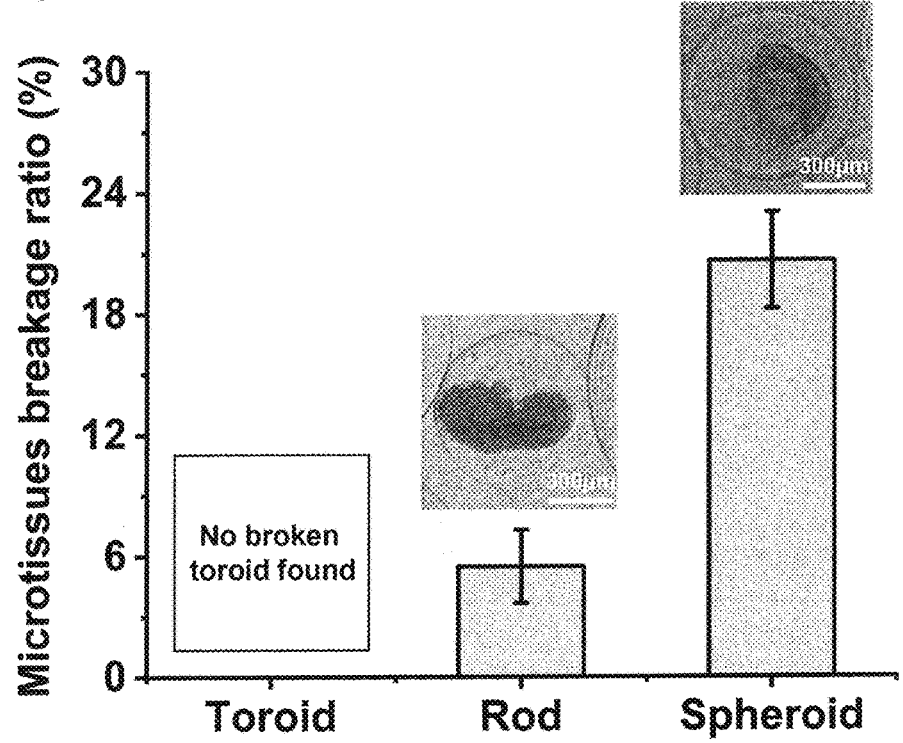
FIG. 7 shows quantification of breakage ratio during microencapsulation of microtissues of toroid, rod and spheroid geometries. Data is shown as mean±SEM from two independent experiments. Approximately 115 to 155 microtissues were examined for each geometry in each independent experiment. (***) denotes p<0.005.

Enhanced Structural Integrity of Toroid Microtissues Encapsulated in Alginate Microcapsules The inventors also investigated the feasibility of forming defect-free alginate microcapsules encapsulating islet-like microtissues and evaluated whether the structural integrity of these microtissues would be compromised by this encapsulation process. In this experiment, a mixture of alginate and microtissues was extruded through a 20 G needle of an electrostatic droplet generator into a solution of $Ba^{2+}$ ions where the microtissue-containing alginate droplets were crosslinked to form hydrogel microcapsules. FIG. 6A-F showed that microtissues of all three geometries could be encapsulated in uniform spherical alginate microcapsules, which were optically transparent and without significant surface deformation or visible irregularities as indicated by the blue arrows. Furthermore, despite their non-spheroidal geometry, toroid (FIGS. 6A and D) and rod (FIGS. 6B and E) microtissues did not result in alginate microcapsules with undesirable irregularities such as tails or deformed hydrogel surface, which might otherwise lead to increased recruitment of immune cells and subsequent fibrotic host response following in vivo transplantation [de Groot, M. et al., *J Surg Res* 121 (1): 141-150 (2004)]. For all three geometries, encapsulated microtissues were covered by the alginate hydrogel membranes without any visible irregular tissue protrusion (FIG. 6A-F), providing adequate immuno-protection for the encapsulated microtissues [Ma, M. et al., *Adv Healthc Mater* 2 (5): 667-672 (2013); Chang, T. M. *Nat Rev Drug Discov* 4 (3): 221-235 (2005)]. Interestingly, a small fraction of encapsulated rod and spheroid microtissues was broken with a microtissue breakage ratio of ~5.5% and ~20.6% respectively (FIG. 7). In contrast, all toroid microtissues in the alginate microcapsules still retained their pre-encapsulation structural appearance with a breakage ratio of ~0% (FIG. 7)

Figure 8A:
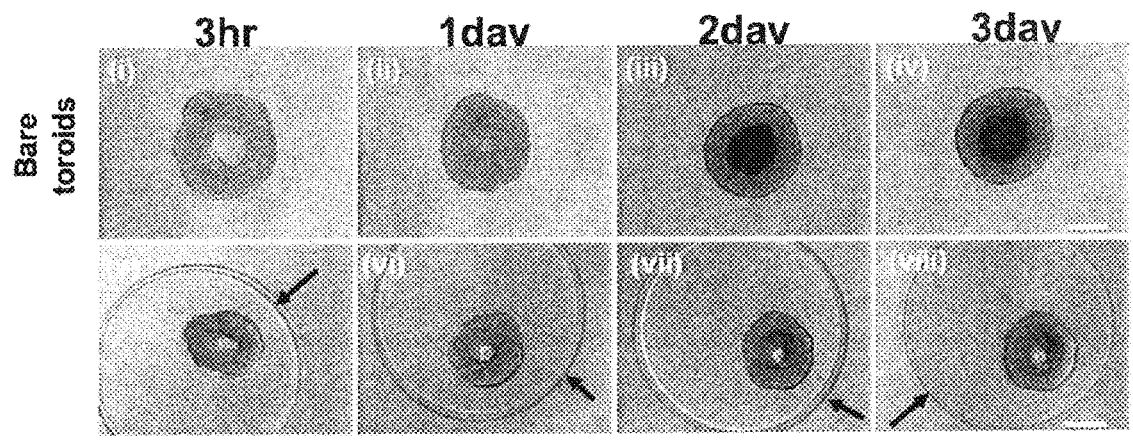
FIG. 8A: Representative optical images of a bare toroid microtissue on tissue culture plate coated with a flat layer of agarose and a toroid microtissue encapsulated in an alginate microcapsule at different time points after microtissue retrieval from the cellular assembly process. The lumen of the bare toroid microtissue closed after 1 day while that of the encapsulated microtissue persisted till day 3. The arrows indicate the surface of the alginate microcapsule.
Figure 8B:
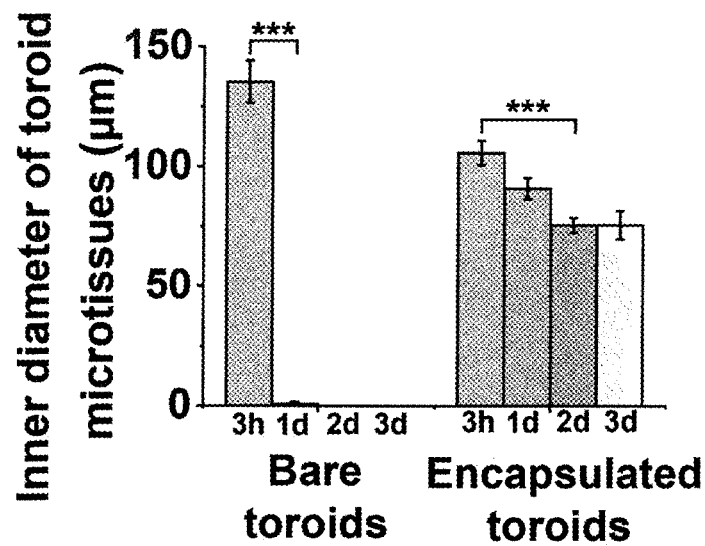
FIG. 8B: Quantitative analysis of the inner diameters of bare and encapsulated microtissues (n=10 replicate samples) at different time points. Data is shown as mean±SEM (***) denotes p<0.005. Scale bars representing 200 μm apply to all images.

The inventors also monitored the appearance of unencapsulated, bare toroid microtissues in comparison with encapsulated toroid microtissues which were cultured for 3 days following microtissue retrieval from micromolded agarose hydrogel and encapsulation in alginate microcapsules. Retrieved bare microtissues were cultured on top of a flat layer of solidified agarose coated on the bottom of a tissue culture plate to prevent their adherence to the treated polystyrene surface of the plate. FIG. 8A shows the optical images of a representative bare toroid microtissues and an encapsulated one at different time points while FIG. 8B summarizes the quantitative analysis of the corresponding changes in the inner diameter of these toroid microtissues. The lumen at the center (FIG. 8A(i)) of bare toroid microtissue quickly closed after one day (FIG. 8A(ii) and FIG. 8B); and the initial toroid geometry of these microtissues changed into a spheroid shape which developed a center core of dead cells from day 2 onwards (FIG. 8A(iii-iv)). In contrast, toroid microtissues encapsulated in alginate hydrogel retained their center lumen till day 3 (FIG. 8A(v-viii)) even though the lumen diameter decreased slightly (FIG. 8B). The data in FIG. 8 demonstrated that encapsulation in crosslinked alginate hydrogel helped to preserve the toroid geometry of the microtissues.

Overall, this study has demonstrated that toroid microtissues fabricated from insulinoma INS-1E cell line exhibited enhanced viability, which should result in a lower number of microtissues required for glycemic correction in each recipient. This leads to an increase in the utilization efficiency of the transplanted islet tissue to potentially compensate for the loss of cell mass during islet dispersion. Furthermore, transplanting less microtissues also decreases the number of encapsulating hydrogel microcapsules and hence reduces the transplant volume. In addition, a lower percentage of dead cells in toroid microtissues also minimizes the formation of cellular debris which would otherwise elicit host immune response post-transplantation. Therefore, the advantage of dissociating islets into single cells and reassembling them into more viable microtissues potentially outweighs the disadvantage of islet mass loss during dispersion. A similar rationale has been adopted to support the dissociation of whole pancreas into individual islets to achieve preclinical success in blood glucose correction despite some islet mass loss [Ballinger W. F. and Lacy, P. E. *Surgery* 72 (2) (1972) 175-186].

Scaling up the fabrication process to mass produce toroid microtissues for clinical application may be achieved by cell passaging and seeding using an automated robotic liquid handling system. Recent studies have shown that interconnected incubators, liquid-handling system, centrifuges and microscopes via two central robotic arms were used for handling induced pluripotent stem cells [Paull, D. et al., *Nat Methods* 12 (9): 885-892 (2015); Conway, M. K. et al., *J Vis Exp* (99): e52755 (2015)]. Cell seeding and microtissue retrieval can be automated by similar robotic platforms with minimal manual intervention to enable high-throughput fabrication of toroid microtissues.

Example 7

Fabrication of Macrodevice with Waffle-Like Structure Containing Microtissues

Figure 13:
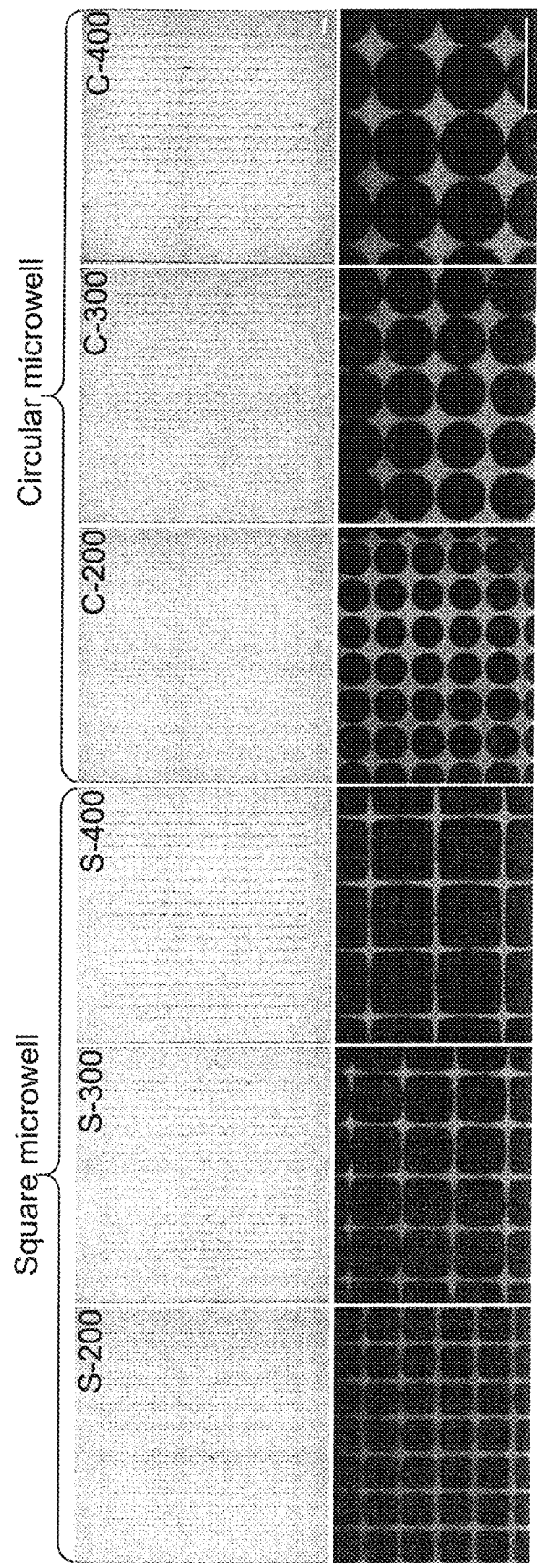
FIG. 13 shows bright field and fluorescent images of GelMA micropatterns with aligned arrays of square or circular microwells with different sizes; 200 μm, 300 μm or 400 μm well width.

The planar hydrogel-based macrodevice of the invention has a waffle-like structure (FIG. 12) which consists of an array of microwells for entrapment of therapeutic microtissues and an interconnected network of sidewall containing vascular endothelial cells. Photolithographic microfabrication techniques were leveraged to design the network of sidewalls that guide the formation of an organized vascular network. Typically, the procedure shown in FIG. 12 was used to fabricate the device. First, gelatin methacryloyl (GeIMA) was patterned to form a waffle-inspired hydrogel network interspersing square or circular microwells of defined dimension. Briefly, a volume of 45 µL of GeIMA prepolymer solution with 12959 photoinitiatior (0.5% w/v) was pipetted onto the surface of the lid of a Petri dish in between two spacers, each consisting of two stacked coverslips. To introduce vascular-inductive cells into the GeIMA network of the macrodevice, human umbilical vascular endothelial cells (HUVECs) could be mixed with the GeIMA prepolymer before this mixture was dispensed on the petri dish. Afterwards, a glass slide (22 mm×50 mm) was gently placed onto the GeIMA solution in between the spacers. The 300 µm thickness of the spacer controls the height of the confined GeIMA prepolymer film. Subsequently, a photomask with array of holes or transparent features with specified dimension and geometry was placed on the top of the glass slide. After 19 seconds of exposure to ultraviolet light (360-480 nm; 7.9 mW cm$^{-2}$), the UV-exposed portion of the GeIMA film was cross-linked to form the micropatterned network of sidewall. Afterwards, the glass slide bearing the UV-cross-linked GeIMA pattern was rinsed with buffer solution to remove the uncross-linked GeIMA residue that was not exposed to UV light, leaving behind microwells. By changing the design of the photomasks, various micropatterns with aligned arrays of either square or circular microwells could be fabricated as shown in FIG. 13.

To encapsulate therapeutic microtissues into this device, a mixture of microtissues and alginate was dispensed onto the UV-cross-linked GeIMA micropattern. For example, microtissues consisting of INS-1E cells were fabricated ex situ using micromolded non-adhesive agarose hydrogel (described in Example 2). After microtissues seeding, 20 mM $BaCl_2$ solution was added on top of the alginate-microtissue layer to crosslink the alginate for 10 minutes. Following alginate gelation, the whole macrodevice (1 cm×1 cm) was gently detached from the glass slide with a surgical blade.

Alternatively, to induce in situ aggregation of monodispersed cells into microtissues (FIG. 14), 80 µL of monodispersed INS-1E cells suspension with a desired density were dispensed onto the UV-cross-linked GeIMA micropattern. The seeded cells, which were evenly distributed in microwells of the GeIMA micropattern, were incubated for 4 hours in 37° C. and 5% $CO_2$ atmosphere. Next, excess media was added and the sample was incubated for another 20 hours until the cells aggregated into spherical or toroid microtissues depending on the chosen GeIMA micropattern. For example, by designing a peg-like structure in each microwell (FIG. 14), a toroidal microtissue can be assembled in each microwell of the final device. Subsequently, the culture medium was removed and alginate solution was added on the microtissue-containing GeIMA micropattern and cross-linked with barium chloride solution to form an immuno-isolating hydrogel layer.

Example 8

Figure 15A:
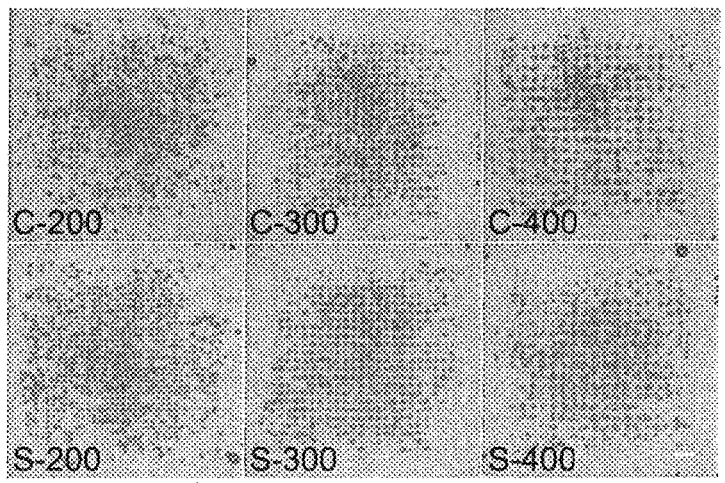
FIG. 15A-D show microtissue distribution in macrodevices with different micropattern designs of GelMA hydrogel networks.
Figure 15B:
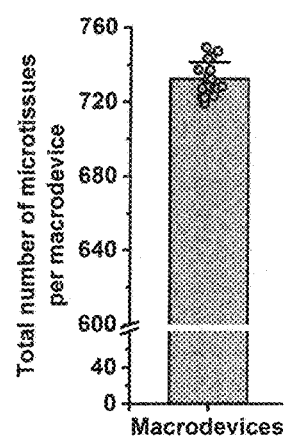
Figure 15C:
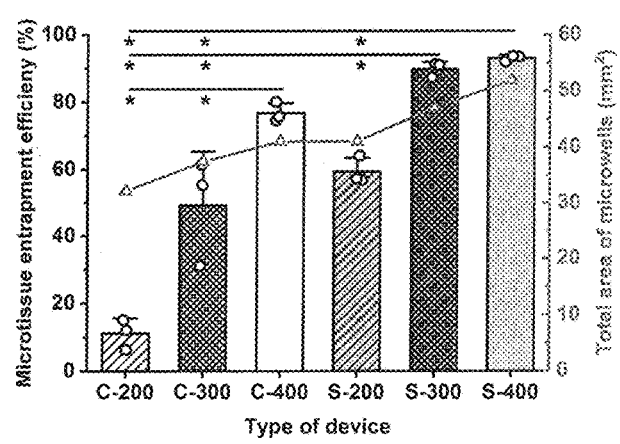

Efficient and Homogenous Spatial Distribution of Microtissues by Waffle-Like Macrodevice Six macrodevices with different designs of GeIMA network were evaluated for their performance in efficiently trapping and homogenously distributing microtissues (FIG. 15A). After seeding and encapsulating the microtissues, all macrodevices maintained their structural integrity (FIG. 15A). The number of microtissues encapsulated into each device was manually counted from optical images acquired post-encapsulation and was determined to be consistent at about approximately 730 per device (FIG. 15B). Two parameters were quantified and compared to select the device design with optimal performance. First, microtissue dwelling ratio, defined as the ratio of microtissues entrapped in the microwells to the total number of microtissues encapsulated in the entire device. A higher dwelling ratio indicates more efficient entrapment of microtissues inside the microwells as less microtissues stay on the GeIMA sidewall. From FIG. 15C, S-400, S-300 and C-400 macrodevices had significantly higher microtissue dwelling ratios of 91%, 89% and 76% respectively compared to other device designs.

Figure 15D:
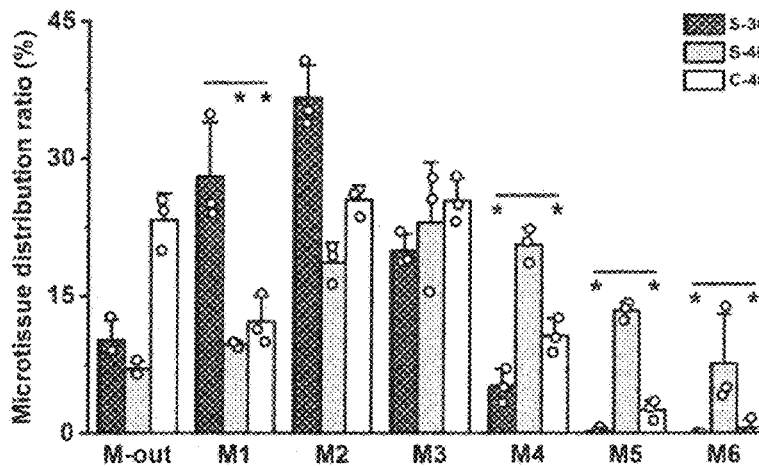

Second, microtissue distribution ratio, defined as the ratio of the combined number of microtissues in all microwells of type Mn, where n is the number of microtissue(s) per microwell, to the total number of microtissues encapsulated in the entire device. Entrapping only one microtissue per microwell is optimal to avoid aggregation of multiple microtissues and allowing perfusing of individual microtissues by the surrounding vascularized network. Therefore, a higher distribution ratio for M1 microwells indicates a more homogenous microtissue distribution. Among the three device designs with the highest dwelling ratios, S-300 macrodevice had a significantly higher microtissue distribution ratio for M1 microwells as shown in FIG. 15D, indicating that S-300 design achieved the most homogenous distribution of microtissues.

Figure 16A:
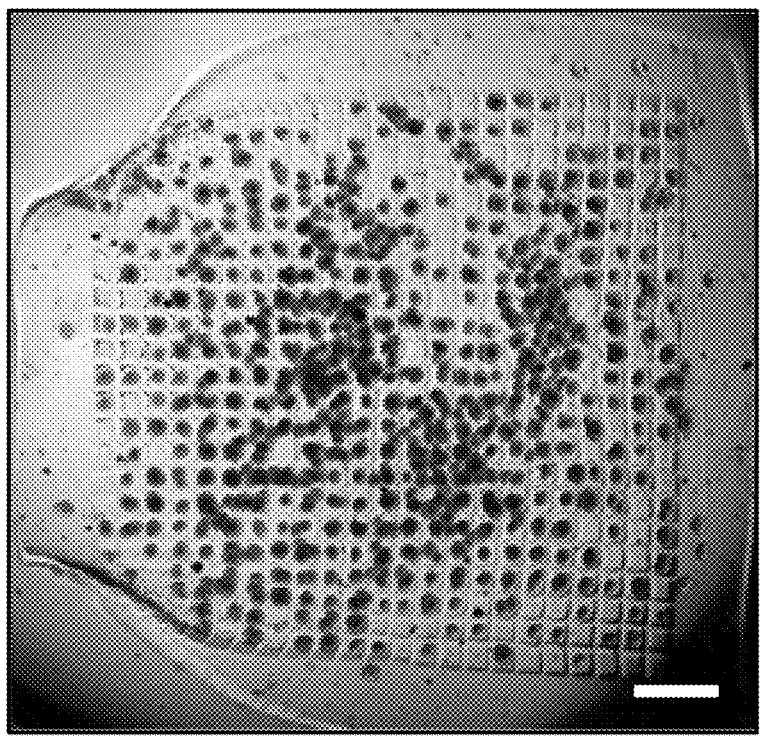
FIG. 16A-B show bright filed images of detached microtissue-loaded device with GelMA micropattern (FIG. 16A) and control microtissue-loaded device without GelMA micropattern (FIG. 16B).
Figure 16B:
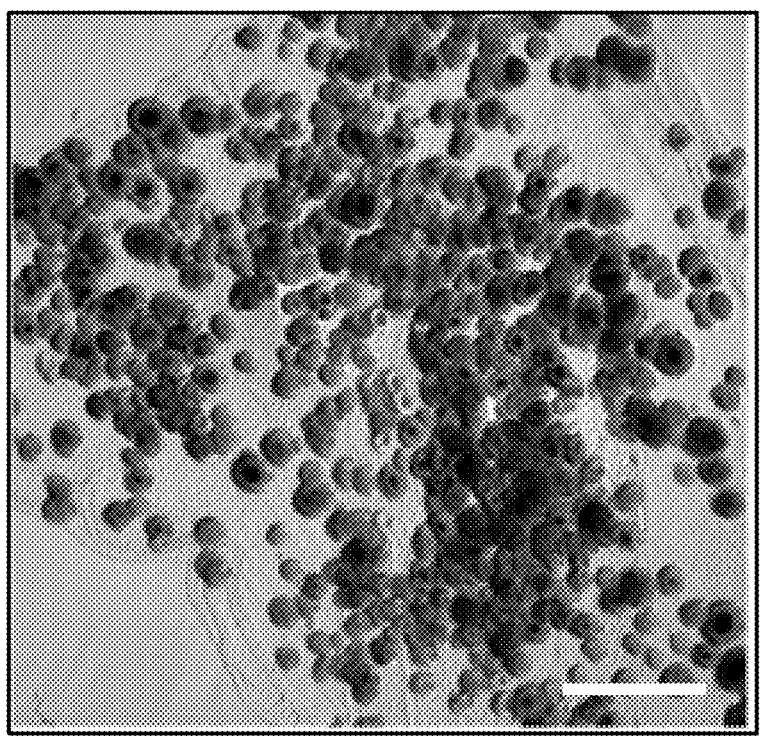

The optimal device S-300 was easily detached from the glass slide without structural compromise as demonstrated in FIG. 16A. This S-300 device achieved a more homogenous spatial distribution of microtissues with much less clumping compared to the random aggregation of microtissues in a control device without any micropatterned design (FIG. 16B).

Example 9

Figure 17A:
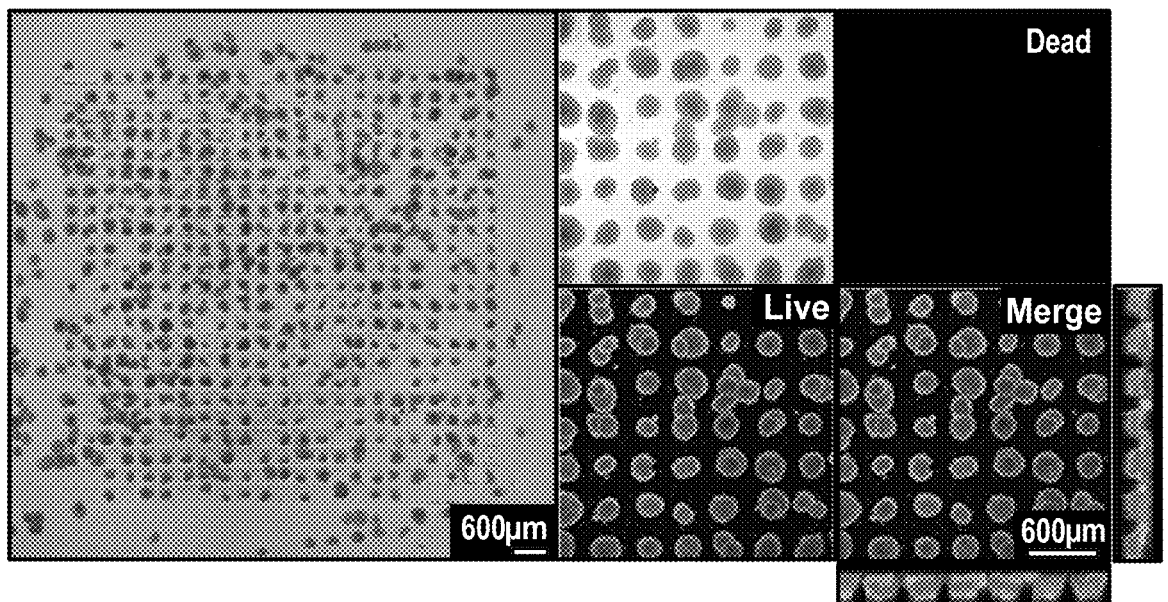
FIG. 17A-B show characterization of viability and insulin secretion function of therapeutic microtissue in macrodevice.
Figure 17B:
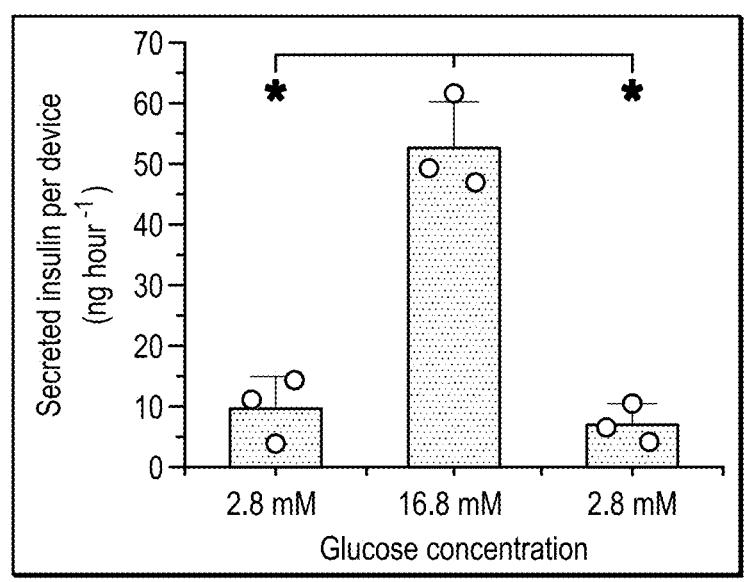
Figure 18A:
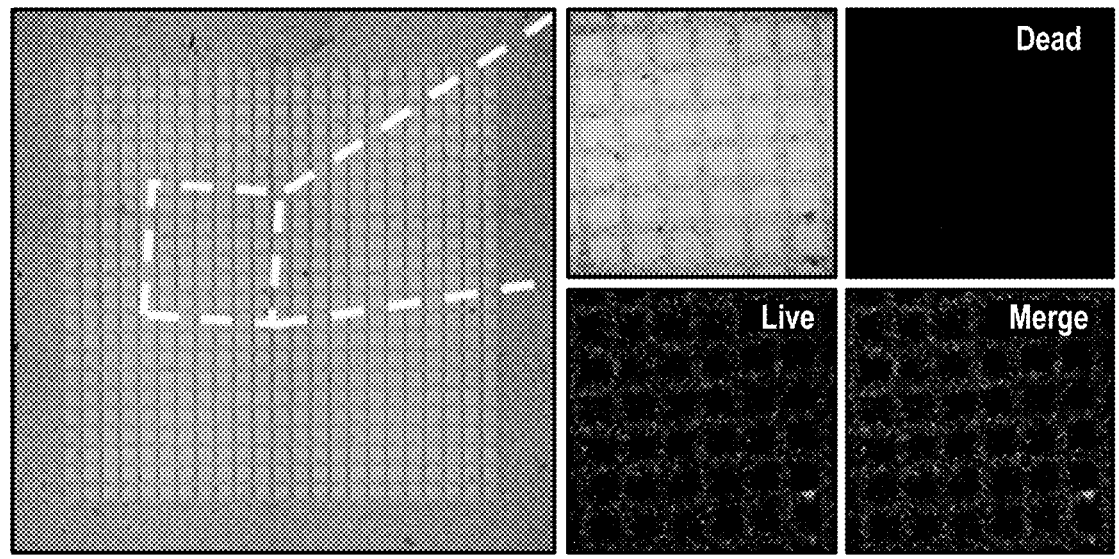
FIG. 18A-D show functional characterizations of macrodevices containing HUVECs.
Figure 18B:
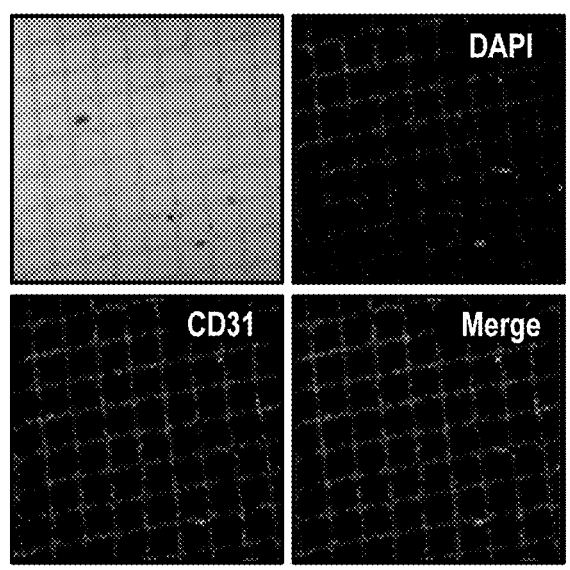
Figure 18C:
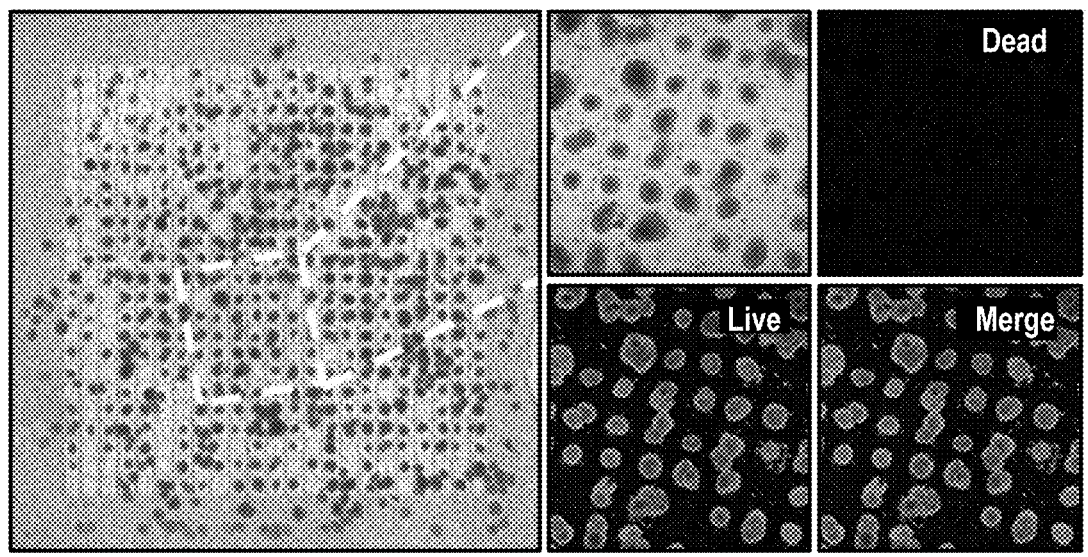
Figure 18D:
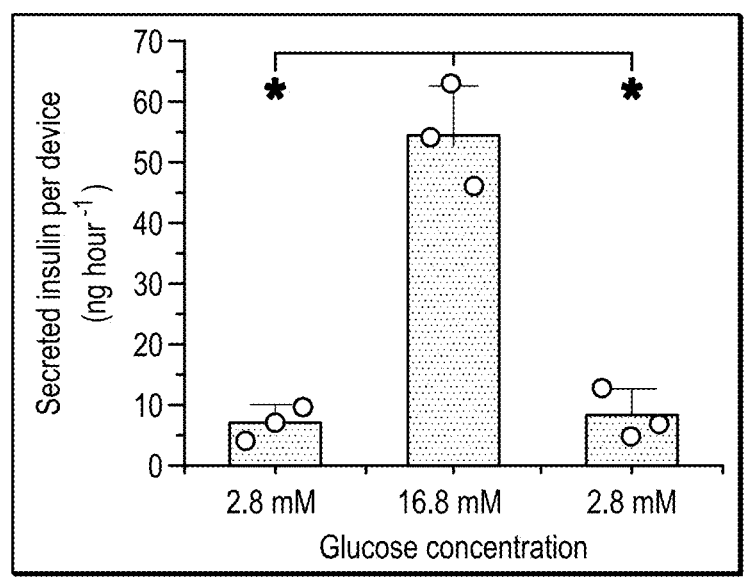

Viability and Functional Performance of Encapsulated Therapeutic Microtissues in Waffle-Like Macrodevice The viability of encapsulated microtissues in the waffle-like macrodevice was assessed by fluorescent live/dead staining. FIG. 17A showed that most microtissues were stained green (light grey cells in lower right panels) demonstrating their viability post-encapsulation in our S-300 device. Both horizontal and vertical projection of the confocal image stacks verified the uniform arrangement of microtissues in regular arrays with equal spacing between adjacent microtissues. Subsequently, static glucose-stimulated insulin secretion test was performed by three consecutive incubations of the microtissue-containing macrodevice in KRBH containing 2.8 mM and then 16.8 mM glucose followed by 2.8 mM glucose at 37° C. for 2 hour per incubation and the amount of insulin secreted was quantified with insulin ELISA assay to evaluate their glucose-responsivity. The encapsulated microtissue in the S-300 device demonstrated a 5-fold increase in insulin secretion after stimulation with high glucose concentration in the second incubation and the ability return to basal insulin secretion during the third incubation at low glucose concentration (FIG. 17B). This insulin secretion data confirmed that our design of waffle-inspired macrodevice could support the key therapeutic function of the encapsulated microtissues.

Example 10

Formation of Intra-Device Vasculature with Spatially Controlled Pattern in Waffle-Like Macrodevice Our S-300 device was able to support formation of spatially controlled vascular network. Human vascular endothelial cells (HUVECs) incorporated in the micropatterned GeIMA network demonstrated good viability after 7 days of culture (FIG. 18A), confirming that the use of photoinitiator and short UV exposure time did not significantly affect cell viability. HUVECs was also examined by immunofluorecent staining of CD31, which is a platelet endothelial cell adhesion molecule 1 (PECAM-1) constituting endothelial cell intercellular junctions and is often localized to the lumen-facing surface blood vessels [Albelda, S M. et al., *The Journal of cell biology;* 114(5): 1059-1068 (1991); DeLisser, HM. et al., *Am J Pathol.* 151(3): 671-677 (1997)]. Positive staining of CD31 (FIG. 18B) demonstrated the vascular-inductive potential of the incorporated HUVECs in our S-300 device.

Example 11

Viability and Function of Co-Loaded Therapeutic Microtissues and Vascular-Inductive Cells in Waffle-Like Macrodevice When both vascular-inductive HUVECs and therapeutic insulin-secreting microtissues were incorporated in the S-300 device, both cell types maintained desirable viability as verified by live/dead fluorescence assay (FIG. 18C) after the microtissue-loaded device was placed in culture medium overnight. The result from GSIS assay in FIG. 18D demonstrated 6-fold increase in insulin secretion when the microtissue-loaded device was exposed to 16.8 mM glucose solution compared to the secretion level at 2.8 mM glucose solution. The insulin secretion form encapsulated microtissue was also able to return to basal level during the third incubation after glucose stimulation. The observed glucose stimulation index was characteristic of unencapsulated INS-1E spheroids and was similar to the index for the device without HUVECs in Example 9, confirming that the encapsulated microtissues were able to maintain their therapeutic function when concurrently with vascular-inductive cells in the waffle-like macrodevice.

Example 12

Figure 20:
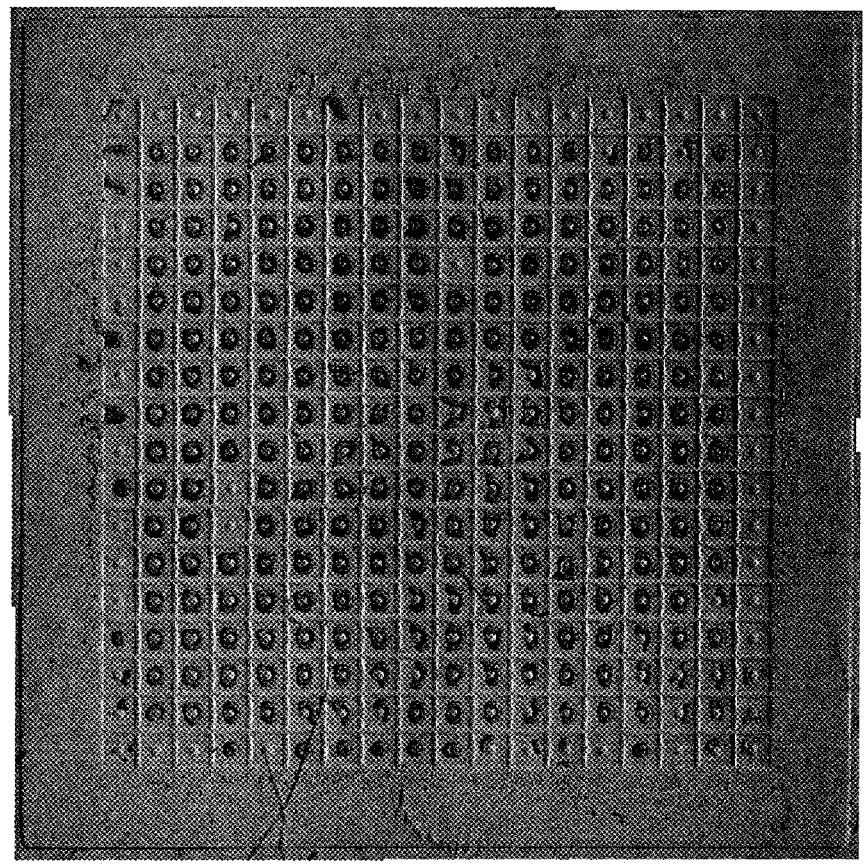
FIG. 20 shows a bright field image of toroid microtissues formed by guided assembly of 0.4 million seeded cells on GelMA hydrogel micropattern with a peg at the center of each microwell. The micropattern used in this experiment was S-400 which consisted of array of square microwells with 400 μm side width dimension and the diameter of the peg-like structure in each microwell was 100 μm.

Inducing Assembly of Monodispersed Cells for In Situ Formation of Spatially Distributed Microtissues in Waffle-Like Macrodevice While the S-300 macrodevice was able to achieve a high microtissue dwelling ratio of about 89%, a fraction of about 11% of all microtissues dispensed onto the device during fabrication ended up on the GeIMA sidewall. To maximize the dwelling ratio and ensuring that each microwell contain one microtissue, the inventors adopted an alternative approach to induce assembly of monodispersed cells for in situ formation of microtissues in individual microwells. Suspension of monodispersed cells, instead of microtissues, was dispensed onto the micropatterned GeIMA network and the individual cells easily fell into the depression of the microwells or migrated into the microwells. After about 24 hours of self-assembly, a multicellular cluster were formed in each microwell with no cluster falling outside of the microwell onto the GeIMA sidewall (FIG. 19). With this approach, the ultimate microtissue dwelling ratio and the microtissue distribution ratio for M1 microwell both reached their theoretical limits of almost 100%. When a micropattern was re-designed to include a peg in the center of each microwell, the monodispersed cells self-assemble around the peg to form a toroid microtissue in each well as shown in FIG. 20. These results demonstrate the versatility of the waffle-inspired macrodevice design to facilitate in situ assembly of monodispersed cells to form microtissues with desired geometry.

An advantage of our invention compared to existing methods is the ability to improve spatial distribution of the encapsulated microtissues while providing endothelial cells for facilitating vascularization in an interconnected network which perfuses individual microtissues. Homogenous distribution of the microtissues encapsulated in our device prevents their clumping to potentially facilitate nutrients and oxygen transportation and enhance cell survival [Bochenek, M A. et al., *Nature Biomedical Engineering.* 2(11): 810 (2018); O'sullivan, E S. et al., *Endocrine reviews.* 32(6): 827-844 (2011)]. Encapsulating the therapeutic microtissues in alginate hydrogel also reduces the risk of excessive protrusion, which might otherwise elicit severe inflammatory responses followed by fibrosis of the implanted device and subsequent tissue death [De Vos, P. et al., *Transplantation.* 62(7): 893-899 (1996); Bhujbal, S V. et al., *Scientific reports.* 4: 6856 (2014)].

Example 13

Figure 21:
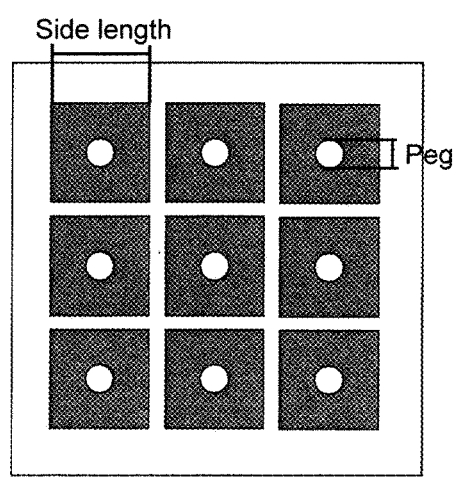
FIG. 21 is a schematic diagram of a waffle-inspired macroencapsulation device similar to that shown in FIG. 20, with square microwells (clear region) and circular pegs (dark circles).

Optimal Design Parameters of Waffle-Like Macrodevice to Facilitate In Situ Formation of Toroid Microtissues To facilitate microtissue formation in waffle-inspired macrodevice, which comprises of multiple square microwells each with a cylindrical peg at its center, key design parameters include microwell width dimension and peg diameter (FIG. 21). Various combinations of peg diameters between 50 µm and 150 µm and microwell side width dimensions between 400 µm and 600 µm were investigated.

Figure 22:
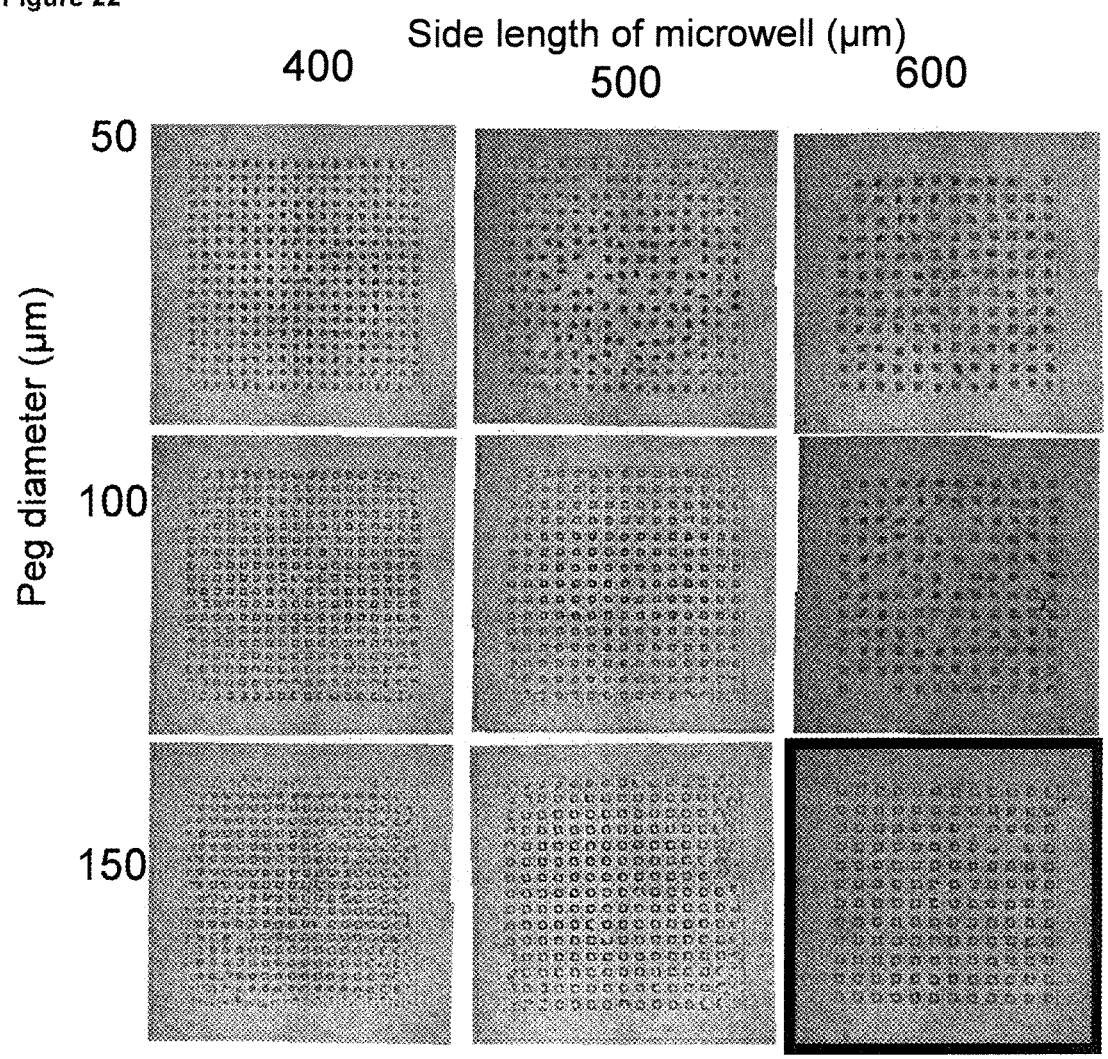
FIG. 22 shows bright field images of toroid-loaded waffle-inspired microencapsulation device to compare the effects of peg diameter and microwell side width dimension on toroid morphology.

The inventors observed that microtissues can be formed with the most uniform, complete toroid geometry and good viability in the macrodevice with wells having a width dimension or diameter of 600 µm and peg width or diameter of 150 µm (FIG. 22). In contrast, small peg diameters of 50 µm caused seeded cells to settle on the upper surface of the peg and resulted in formation of disc-shaped microtissues without the central lumens instead of the desired toroid shape.

Example 14

Figure 23:
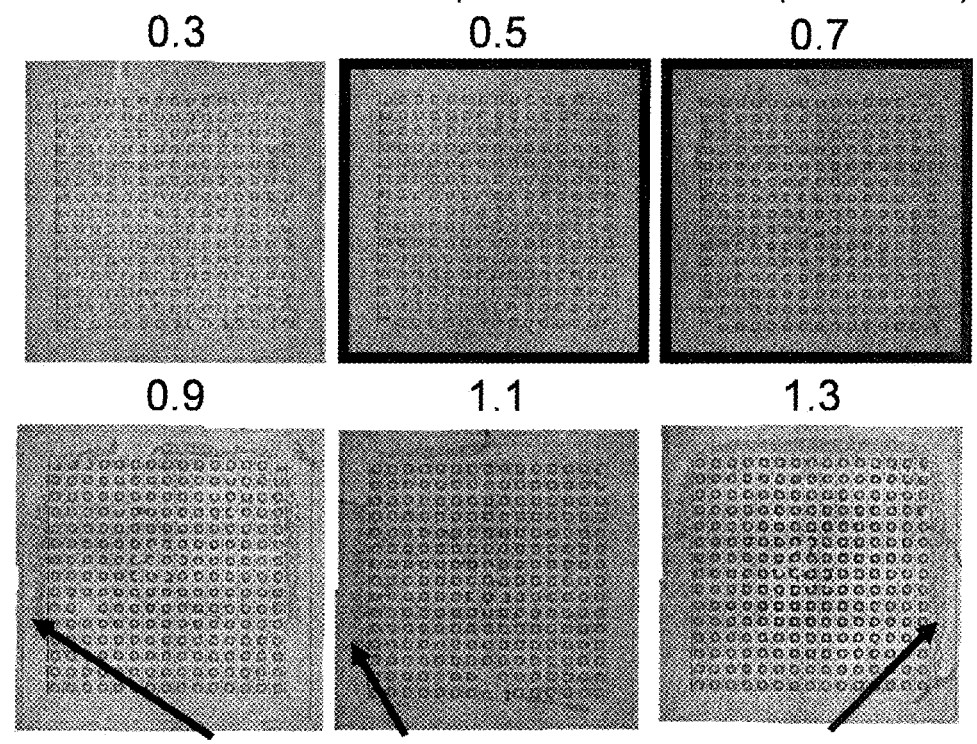
FIG. 23 shows bright field images of toroid-loaded waffle-inspired macroencapsulation device to compare the effects of initial cell loading on in situ formation of toroid microtissue. Arrows indicate cell sheet formation on the edge of the device due to excessive initial cell loading.

Optimal Initial Cell Loading to Maintain Viability of Toroid Microtissues in Waffle-Like Macrodevice Various amounts of cells were seeded into the same micropatterned GelMA hydrogel network (1 cm×1 cm) comprising of multiple microwells each with a side-width dimension of 500 µm and peg diameter of 150 µm. Initial cell loading or initial numbers of live cells seeded into each micropatterned GelMA hydrogel ranged from 0.3 to 1.3 million cells per cm$^2$ were investigated (FIG. 23). Twenty-four hours after cell seeding, the microtissue-containing GelMA hydrogel was gently detached from the glass slide with a surgical blade after removal of culture media. The detached GelMA hydrogel and associated microtissues were trypsinized to release monodispersed cells for quantification and viability assessment of the amount of retrieved cells by trypan blue staining.

Figure 24A:
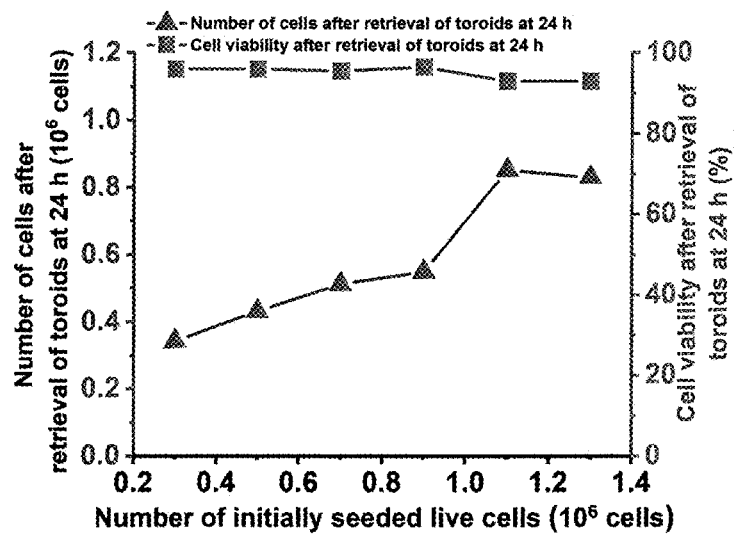
FIG. 24A: Cell viability was maintained at above 90% at all initial cell loadings.
Figure 24B:
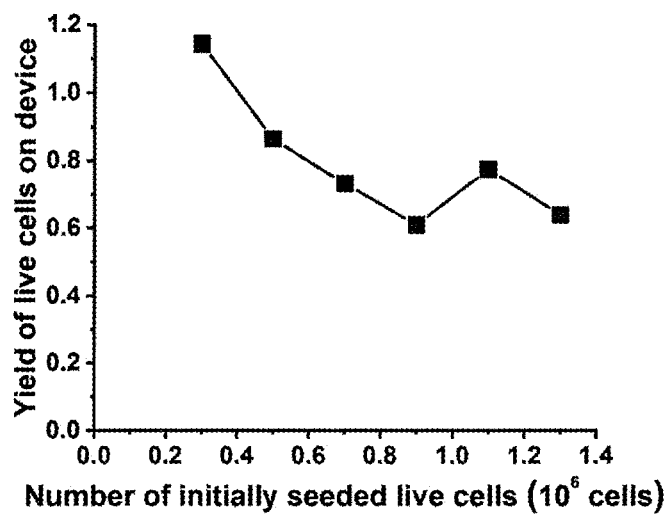
FIG. 24B: Live cell yield was highest in the lower range of initial cell loadings.

The inventors found that cell viability can be maintained at more than 90% for all initial cell loading numbers (FIG. 24A). Cell usage yield or efficiency, calculated as the ratio of retrieved live cells to the initial cell seeding number, was optimal at an initial seeding density of 0.3 to 0.7 million (FIG. 24B) due to minimal formation of cell sheet at the edge of the device. Excessive cell loading caused loss of cells from the device due to the formation of cell sheets on the edges of macrodevices when 0.9 to 1.3 million cells were initially seeded per cm$^2$ (FIG. 24A)

Example 15

Static Glucose-Stimulated Insulin Secretion Assay from Waffle-Like Macrodevice Encapsulating Toroid Microtissues A glucose-stimulated insulin secretion (GSIS) assay was performed to evaluate the function of the toroid microtissues assembled in situ and encapsulated in waffle-like macrodevice (as described in Example 7). After the removal of all culture medium, waffle-like macrodevice containing toroid microtissues was rinsed with glucose-free medium twice to remove residual insulin. The device was preincubated with Krebs Ringer buffer HEPES (KRBH) (135 mM NaCl, 5 mM NaHCO$_3$, 0.5 mM NaH$_2$PO$_4$, 3.6 mM KCl, 1.5 mM CaCl$_2$, 0.5 mM MgCl$_2$, and 10 mM HEPES, pH 7.4. BSA (0.1%)) containing 2.8 mM glucose for 2 hours at 37° C. Afterwards, the in vitro insulin secretion was evaluated by consecutive incubations of the microtissue-containing macrodevice in containing 2.8 mM, 16.8 mM and 2.8 mM glucose at 37° C. for 2 hours to mimic alternate exposures to physiologically basal condition, hyperglycemic condition and a return to basal condition in diabetic patients respectively. After each incubation, the residual insulin was removed by rinsing samples twice with glucose-free KRBH buffer between consecutive incubations. At the end of each incubation, 100 µL of the supernatant was removed and stored at –20° C. for subsequent analysis. The insulin concentrations was measured by Ultrasensive Insulin ELISA (ALPCO Diagnostics, USA).

Figure 25:
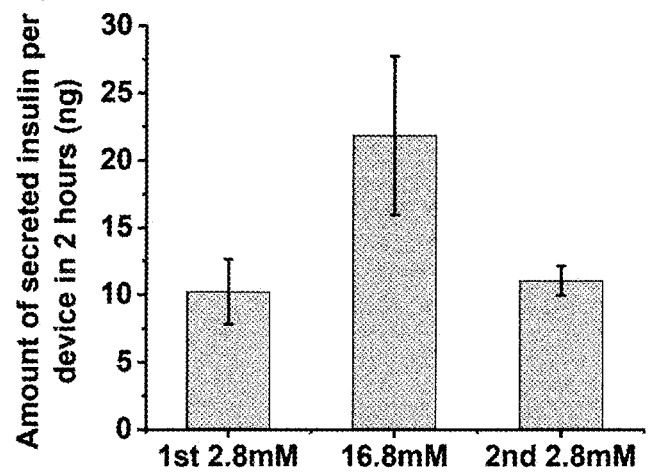
FIG. 25 shows insulin secretion from toroid microtissues in waffle-like macrodevice in response to static glucose stimulation. Microtissue-containing waffle-like macrodevices were consecutively incubated in low glucose (2.8 mM) and high glucose (16.8 mM) followed by low glucose (2.8 mM) for 2 hours at each concentration. A higher average amount of insulin was secreted in response to the higher glucose level. Data is shown as mean±SEM (n=3 devices, error bar represents SD).

The result showed that a higher average amount of insulin was secreted during the second incubation at high glucose concentration compared to insulin secretion during the first and third incubations at lower glucose concentration (FIG. 25). This result illustrated that toroid microtissues assembled and encapsulated in the macrodevice retained the ability to respond to glucose concentration in vitro, demonstrating a 4.3-fold increase in insulin secretion after glucose stimulation.

Example 16

Mechanical and Structural Stability Achieved by Interlocking Modular Components of Waffle-Like Macrodevice The macrodevice can be fabricated with strong mechanical property to sustain handling with tweezers. Minimal deformation of the waffle arrangement is observed (FIG. 26A-B). As illustrated in (FIG. 27), the "lock" component consisted of an interconnected micropatterned GelMA hydrogel network, which served as dividing sidewalls separating evenly spaced microwells. The "key" component consisted of therapeutic microtissues encapsulated in an immuno-isolatory alginate hydrogel that fitted into the microwells of the lock component. The interlocking design of our waffle-inspired device minimized the risk of the two components detaching (FIG. 31B) to ensure the proximity of the vascular-inductive cells in the lock component and the encapsulated therapeutic microtissues in the key component.

Example 17

Mechanical and Structural Stability of Toroid-Loaded Macrodevice after Subcutaneous Transplantation into Diabetic Mice As per known methods [Dang, T. T et al., *Biomaterials* 34 (23): 5792-5801(2013)], diabetic C57BL/6J mice were generated from healthy mice by multiple low-dose daily injections of Streptozotocin (STZ) to induce damage to their pancreatic beta cells (FIG. 28). The waffle-like macrodevice containing microtissues assembled in situ from insulinoma (INS1E) cells was subcutaneously transplanted into these diabetic mice to evaluate whether the cells embedded in the macrodevice can secrete insulin to correct blood glucose level. It was observed that the macrodevice can be transplanted into the mice and retrieved after 9 days without compromising its mechanical properties or fusion of microtissues (FIG. 29).

Example 18

Effect of Toroid Microtissues Assembled and Encapsulated in Waffle-Like Macrodevice on Blood Glucose Level in Diabetic Mice Using the method in Example 17, the inventors have established a chemically induced diabetic mouse model to evaluate the therapeutic function of INS-1E toroid microtissues assembled and encapsulated in waffle-like macrodevices. These microtissue-containing waffle-like macrodevices, which were fabricated as described in Example 7, were subcutaneously transplanted onto the dorsal side of diabetic C57/B6 mice to establish a marginal/minimal cell mass model, which corresponds to the minimum amount of cells required to correct blood sugar level in 50% of the mice.

Figure 30:
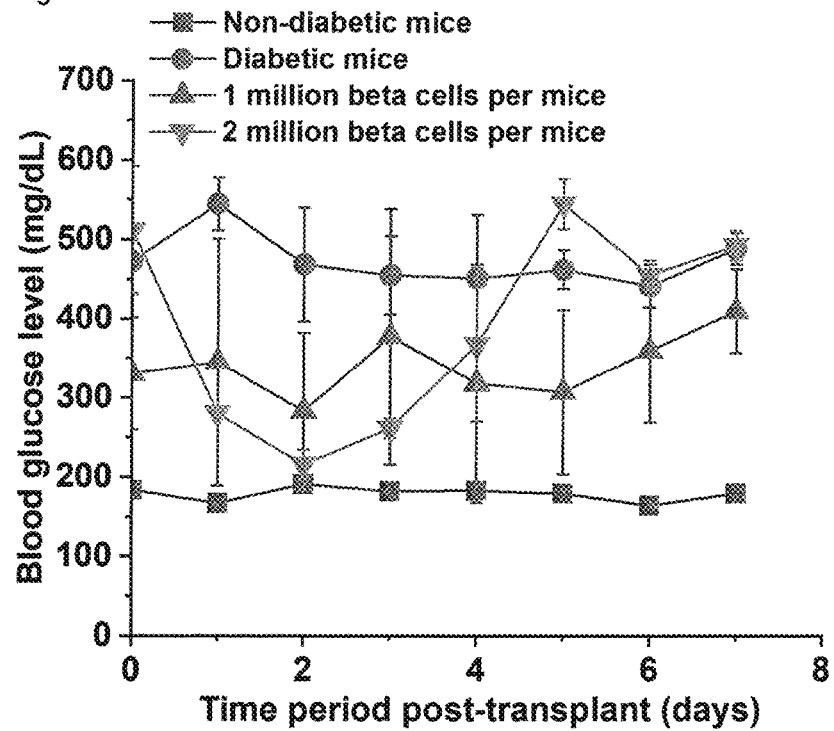
FIG. 30 shows a graph of daily non-fasting blood glucose level against time for non-diabetic mice, control STZ-induced diabetic mice, STZ-induced diabetic mice subcutaneously transplanted with waffle-like macrodevices containing toroid microtissue at therapeutic doses of 1 million or 2 million beta cells per mouse. Diabetic mice receiving the toroid-loaded waffle-like macrodevice at a therapeutic dose of 2 million cells per mouse lowered blood glucose level of diabetic mice just 1 day post-transplantation.

The results show that an initial cell seeding number of just 1 to 2 million of INS-1E cells per waffle-like macrodevice was sufficient to lower the blood glucose level of diabetic mice after 1 day (FIG. 30). This was superior compared to the method of Coronel, M M. et al., *Biomaterials* 210: 1-11 (2019), which required 2.5 million MIN6 cells per mouse to lower blood glucose below 300 mg/dL after 17 days post-transplantation using a disk-shaped macrodevice.

Example 19

Figure 31:
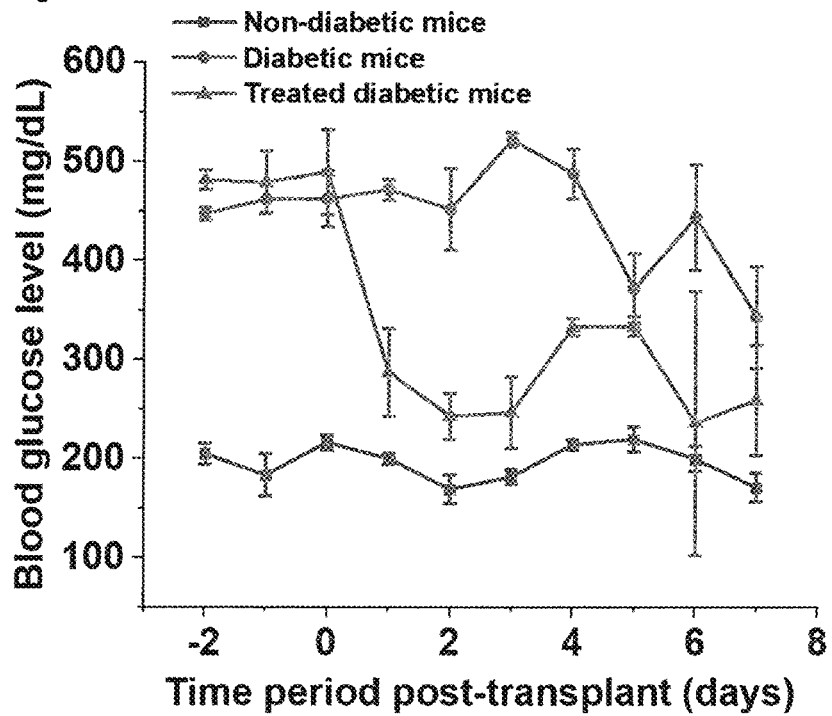
FIG. 31 shows a graph of daily non-fasting blood glucose level against time for non-diabetic mice, diabetic mice, and control STZ-induced diabetic mice, treated STZ-induced diabetic mice intraperitoneally transplanted with toroid microtissues encapsulated in alginate microcapsules. Diabetic mice treated with microencapsulated toroid microtissues could lower blood glucose level of diabetic mice to below 300 mg/dL just 1 day post-transplantation

Effect of Toroid Microtissues Encapsulated in Alginate Microcapsules on Blood Glucose Level in Diabetic Mice Marginal cell mass (about 2.4 million INS-1E cells) of 200 toroid microtissues, which were fabricated and encapsulated in alginate microcapsules as described in Example 1, were transplanted to the intraperitoneal space of each diabetic mouse established as described in Example 17. Results show that the toroid microtissues can lower blood glucose level of diabetic mice to below 300 mg/dL just 1 day post-transplantation (FIG. 31).

Example 20

Fabrication of Waffle-Like Macrodevice Encapsulating Primary Rat Islet Microtissues Primary rat islets were isolated from Sprague-Dawley rats by collagenase digestion and purification with Ficoll gradient as per known methods [O'Sullivan, E. et al., *Diabetologia* 53 (5): 937-945] (2010)]. These primary rat islets were mixed with alginate and the alginate-islet mixture was dispensed on micropatterned GelMA hydrogel network. The array of microwells of the GelMA hydrogel network facilitated homogenous distribution of the therapeutic microtissues by entrapping each islet per microwell for the majority of the islets (FIG. 32A). The islet-containing waffle-like macrodevice was further coated with an external alginate hydrogel layer followed by crosslinking in barium chloride solution. The macrodevice maintained the homogenous distribution of islets after its detachment from the glass slide by a surgical blade (FIG. 32B).

SUMMARY

We demonstrated that the geometry of microtissues plays a significant role in microtissue viability. Compared with rod and spheroid microtissue, toroid microtissues exhibited enhanced cell viability and metabolic activity. In addition, this microtissue geometry did not affect the insulin secretion of INS-1E cell lines. Furthermore, toroid microtissues retained their intact structure following encapsulation in immuno-isolatory hydrogel and reduced blood glucose levels when implanted intraperitoneally in STZ-induced diabetic mice.

In addition, the disclosed waffle-shaped hybrid hydrogel macrodevice has several advantages, including (1) improving spatial distribution of microtissues, (2) supporting vascularization of human-derived endothelial cells encapsulated in waffle-inspired interconnected network, (3) consisting of interlocking components to enable stability and proximity of the vascular-inducing network and the immuno-isolatory hydrogel component with therapeutic microtissues and (4) inducing in situ aggregation of monodispersed cells into homogenously distributed microtissues of desired geometry. We showed that the planar biocompatible hydrogel-based macrodevice comprising an array of microwells, each containing single islet toroid, and an interconnected network of sidewalls containing vascular endothelial cells reduced blood glucose levels when implanted intraperitoneally in STZ-induced diabetic mice.

REFERENCES

Any listing or discussion of an apparently prior-published document in this specification should not necessarily be taken as an acknowledgement that such document is part of the state of the art or is common general knowledge.

Albelda S M, Muller W A, Buck C A, Newman P J. Molecular and cellular properties of PECAM-1 (endoCAM/CD31): a novel vascular cell-cell adhesion molecule. *The Journal of cell biology.* September 1991; 114(5): 1059-1068.

Avgoustiniatos E S, Colton C K. Effect of External Oxygen Mass Transfer Resistances on Viability of Immunoisolated Tissue a. *Annals of the New York Academy of Sciences.* 1997; 831 (1 Bioartificial Organs: Science, Medicine, and Technology): 145-166.

Ballinger, W F. Lacy, P E. Transplantation of intact pancreatic islets in rats. *Surgery* 72 (2): (1972) 175-186.

Baranski J D, Chaturvedi R R, Stevens K R, et al. Geometric control of vascular networks to enhance engineered tissue integration and function. *Proceedings of the National Academy of Sciences.* 2013; 110(19): 7586-7591.

Barkai, U. Weir, G C. et al., Enhanced oxygen supply improves islet viability in a new bioartificial pancreas. *Cell Transplant* 22 (8): (2013) 1463-1476.

Berridge, M. Tan, A. Trans-plasma membrane electron transport: a cellular assay for NADH-and NADPH-oxidase based on extracellular, superoxide-mediated reduction of the sulfonated tetrazolium salt WST-1. *Protoplasma* 205 (1-4): (1998) 74-82.

Bertuzzi, F. Marzorati, S. et al., Tissue factor and CCL2/monocyte chemoattractant protein-1 released by human islets affect islet engraftment in type 1 diabetic recipients. *J Clin Endocrinol Metab* 89 (11): (2004) 5724-5728.

Bhujbal S V, De Haan B, et al., A novel multilayer immunoisolating encapsulation system overcoming protrusion of cells. *Scientific reports.* 2014; 4: 6856.

Bochenek M A, Veiseh 0, et al. Alginate encapsulation as long-term immune protection of allogeneic pancreatic islet cells transplanted into the omental bursa of macaques. *Nature Biomedical Engineering.* 2018; 2(11): 810.

Boettler T, Schneider D, Cheng Y, et al. Pancreatic Tissue Transplanted in TheraCyte Encapsulation Devices Is Protected and Prevents Hyperglycemia in a Mouse Model of Immune-Mediated Diabetes. *Cell Transplant.* 2016; 25(3): 609-614.

Bosco, D. Orci, L. Meda, P. Homologous but not heterologous contact increases the insulin secretion of individual pancreatic B-cells. *Exp Cell Res* 184 (1): (1989) 72-80.

Bruni A, Gala-Lopez B, et al., Islet cell transplantation for the treatment of type 1 diabetes: recent advances and future challenges. *Diabetes, metabolic syndrome and obesity: targets and therapy.* 2014; 7: 211.

Chang, $T_M$. Therapeutic applications of polymeric artificial cells. *Nat Rev Drug Discov* 4 (3): (2005) 221-235.

Chen X, Aledia A S, Ghajar C M, et al. Prevascularization of a fibrin-based tissue construct accelerates the formation of functional anastomosis with host vasculature. *Tissue Engineering Part A.* 2008; 15(6): 1363-1371.

Colton C K. Oxygen supply to encapsulated therapeutic cells. *Advanced drug delivery reviews.* 2014; 67: 93-110.

Conway, M K. Gerger, M J. Balay, E E. et al., Scalable 96-well plate based iPSC culture and production using a robotic liquid handling system. *J Vis Exp* (99): e52755 (2015).

Coronel, M M. et al., Oxygen generating biomaterial improves the function and efficacy of beta cells within a macroencapsulation device *Biomaterials* 210: (2019) 1-11.

Dahl, U. Sjodin, A. Semb, H. Cadherins regulate aggregation of pancreatic beta-cells in vivo. *Development* 122 (9): (1996) 2895-2902.

Dang, T T. Thai, A V. Cohen, J. et al., Enhanced function of immuno-isolated islets in diabetes therapy by co-encapsulation with an anti-inflammatory drug. *Biomaterials* 34 (23): (2013) 5792-5801.

Dean, D. M. Napolitano, A. P. et al., Rods, tori, and honeycombs: the directed self-assembly of microtissues with prescribed microscale geometries. *FASEB J* 21 (14): (2007) 4005-4012.

DeLisser H M, Christofidou-Solomidou M, Strieter R M, et al. Involvement of endothelial PECAM-1/CD31 in angiogenesis. *Am J Pathol.* September 1997; 151(3): 671-677.

Glicklis, R. Merchuk, J C. Cohen, S. Modeling mass transfer in hepatocyte spheroids via cell viability, spheroid size, and hepatocellular functions. *Biotechnol Bioeng* 86 (6): (2004) 672-680.

de Groot, M. Schuurs, T A. van Schilfgaarde, R. Causes of limited survival of microencapsulated pancreatic islet grafts, *J Surg Res* 121 (1) (2004) 141-150.

Desai, T. Shea, L. D. Advances in islet encapsulation technologies. *Nat Rev Drug Discov* 16 (5): (2017) 338-350.

De Vos, P. De Haan, et al., Association between capsule diameter, adequacy of encapsulation, and survival of microencapsulated rat islet allografts1. *Transplantation.* 1996; 62(7): 893-899.

Elliott, R. B. Escobar, L. et al., *Live encapsulated porcine islets from a type 1 diabetic patient 9.5 yr after xenotransplantation*, *Xenotransplantation* 14 (2): (2007) 157-161.

Enmon Jr, R M. O'Connor, K C. Et al., Dynamics of spheroid self-assembly in liquid-overlay culture of DU 145 human prostate cancer cells. *Biotechnol Bioeng* 72 (6): (2001) 579-591.

Gao, K. Kumar, P. Cortez-Toledo, E. et al. Potential long-term treatment of hemophilia A by neonatal co-transplantation of cord blood-derived endothelial colony-forming cells and placental mesenchymal stromal cells. *Stem cell research & therapy.* Jan. 22, 2019; 10(1): 34.

Gionet-Gonzales, M A. Leach, J K. Engineering principles for guiding spheroid function in the regeneration of bone, cartilage, and skin. *Biomedical materials.* Mar. 21, 2018; 13(3): 034109.

Glicklis, R. Merchuk, J C. Cohen, S. Modeling mass transfer in hepatocyte spheroids via cell viability, spheroid size, and hepatocellular functions. *Biotechnol Bioeng.* Jun. 20, 2004; 86(6): 672-680.

Grigoryan, B. et al., Multivascular networks and functional intravascular topologies within biocompatible hydrogels. *Science* 2019, 364: 458.

Henquin, J. C. Triggering and amplifying pathways of regulation of insulin secretion by glucose. *Diabetes* 49 (11): (2000) 1751-1760.

Hering, B J. Clarke, W R. et al., Clinical Islet Transplantation, Phase 3 Trial of Transplantation of Human Islets in Type 1 Diabetes Complicated by Severe Hypoglycemia. *Diabetes Care* 39 (7): (2016) 1230-1240.

Hilderink, J. Spijker, S. et al., Controlled aggregation of primary human pancreatic islet cells leads to glucose-responsive pseudoislets comparable to native islets. *J Cell Mol Med* 19 (8): (2015) 1836-1846.

Ionescu-Tirgoviste, C. Gagniuc, P A. et al., A 3D map of the islet routes throughout the healthy human pancreas, *Sci Rep* 5: (2015) 14634.

Jansson, L. Hellerstrom, C. Glucose-induced changes in pancreatic islet blood flow mediated by central nervous system. *Am J Physiol* 251 (6 Pt 1): (1986) E644-647.

Kilimnik, G. Jo, J. et al., Quantification of islet size and architecture. *Islets* 4 (2): (2012) 167-172.

Kim, A. Miller, K. et al., Islet architecture: A comparative study. *Islets* 1 (2): (2009) 129-136.

Köllmer, M. Appel, A A. et al., Long-term function of alginate-encapsulated islets. *Tissue Eng Part B Rev* 22 (1): (2015) 34-46.

Komatsu, H. Cook, C. et al., Oxygen environment and islet size are the primary limiting factors of isolated pancreatic islet survival. *PloS one* 12 (8): (2017) e0183780.

Lee B R, Hwang J W, Choi Y Y, et al., In situ formation and collagen-alginate composite encapsulation of pancreatic islet spheroids. *Biomaterials.* 2012; 33(3): 837-845.

Levenberg S, Rouwkema J, Macdonald M, et al., Engineering vascularized skeletal muscle tissue. *Nature biotechnology.* 2005; 23(7): 879.

Lim, F. Sun, A. M. Microencapsulated Islets as Bioartificial Endocrine Pancreas. *Science* 210 (4472): (1980) 908-910.

Livoti, C M. Morgan, J R. Self-assembly and tissue fusion of toroid-shaped minimal building units. *Tissue Eng Part A* 16 (6): (2010) 2051-2061.

Ma, M. Chiu, A. et al., Core-shell hydrogel microcapsules for improved islets encapsulation. *Adv Healthc Mater* 2 (5): (2013) 667-672.

Mendelsohn, A. D. Nyitray, C. Sena, M. Desai, T. A. Size-controlled insulin-secreting cell clusters. *Acta Biomater* 8 (12): (2012) 4278-4284.

Merglen, A. Theander, S. et al., Glucose sensitivity and metabolism-secretion coupling studied during two-year continuous culture in INS-1E insulinoma cells. *Endocrinology* 145 (2) (2004) 667-678.

Napolitano, A P. Dean, D M. et al., Scaffold-free three-dimensional cell culture utilizing micromolded nonadhesive hydrogels. *Biotechniques* 43 (4): (2007) 494-500.

Napolitano, A P. Chai, P. Dean, D M. Morgan, J R. Dynamics of the self-assembly of complex cellular aggregates on micromolded nonadhesive hydrogels. *Tissue Eng* 13 (8): (2007) 2087-2094.

O'Sullivan, E. Johnson, A. et al., Rat islet cell aggregates are superior to islets for transplantation in microcapsules. *Diabetologia* 53 (5): (2010) 937-945.

O'sullivan E S, Vegas A, Anderson D G, Weir G C. Islets transplanted in immunoisolation devices: a review of the progress and the challenges that remain. *Endocrine reviews*. 2011; 32(6): 827-844.

Paull, D. Sevilla, A. et al., Automated, high-throughput derivation, characterization and differentiation of induced pluripotent stem cells. *Nat Methods* 12 (9): (2015) 885-892.

Pellegrini, S. Cantarelli, E. et al., The state of the art of islet transplantation and cell therapy in type 1 diabetes. *Acta Diabetol* 53 (5): (2016) 683-691.

Rago, A P. Chai, P R. Morgan, J R. Encapsulated arrays of self-assembled microtissues: an alternative to spherical microcapsules. *Tissue Eng Part A* 15 (2): (2008) 387-395.

Ramachandran, K. Williams, S J. et al., Engineering islets for improved performance by optimized reaggregation in a micromold. *Tissue Eng Part A* 19 (5-6): (2012) 604-612.

Reynolds, T D. Mitchell, S A. Balwinski, KM. Investigation of the effect of tablet surface area/volume on drug release from hydroxypropylmethylcellulose controlled-release matrix tablets. *Drug Dev Ind Pharm* 28 (4): (2002) 457-466.

Rouiller, D G. Cirulli, V. Halban, P A. Uvomorulin mediates calcium-dependent aggregation of islet cells, whereas calcium-independent cell adhesion molecules distinguish between islet cell types. *Dev Biol* 148 (1): (1991) 233-242.

Rouwkema J, Khademhosseini A. Vascularization and Angiogenesis in Tissue Engineering: Beyond Creating Static Networks. *Trends Biotechnol*. September 2016; 34(9): 733-745.

Saelens, X. Festjens, N. et al., Toxic proteins released from mitochondria in cell death. *Oncogene* 23 (16): (2004) 2861-2874.

Saisho, Y. Pancreas volume and fat deposition in diabetes and normal physiology: consideration of the interplay between endocrine and exocrine pancreas. *Rev Diabet Stud* 13 (2-3): (2016) 132.

Schell, J Y. Wilks, B T. et al., Harnessing cellular-derived forces in self-assembled microtissues to control the synthesis and alignment of ECM. *Biomaterials* 77: (2016) 120-129.

Shapiro, A M. Pokrywczynska, M. Ricordi, C. Clinical pancreatic islet transplantation. *Nat Rev Endocrinol* 13 (5): (2017) 268-277.

Sigmundsson, K. Ojala, J R M. et al., Culturing functional pancreatic islets on alpha5-laminins and curative transplantation to diabetic mice. *Matrix Biol* 70: (2018) 5-19.

Song, S. Roy, S. Progress and challenges in macroencapsulation approaches for type 1 diabetes (T1D) treatment: Cells, biomaterials, and devices. *Biotechnol Bioeng*. July 2016; 113(7): 1381-1402.

Tuch, B E. Keogh, G W. et al., Safety and viability of microencapsulated human islets transplanted into diabetic humans. *Diabetes care* 32 (10): (2009) 1887-1889.

Ungphaiboon, S. Attia, D. et al., Materials for microencapsulation: what toroidal particles ("doughnuts") can do better than spherical beads. *Soft Matter* 6 (17): (2010) 4070-4083.

Veiseh, O. Doloff, J C. et al., Size- and shape-dependent foreign body immune response to materials implanted in rodents and non-human primates. *Nat Mater* 14 (6): (2015) 643-651.

Wilson, J T. Chaikof, E L. Challenges and emerging technologies in the immunoisolation of cells and tissues. *Adv Drug Del Rev* 60 (2): (2008) 124-145.

The invention claimed is:

1. A planar biocompatible hydrogel-based macrodevice comprising an array of microwells and a therapeutic microtissue within each of a plurality of said microwells, wherein;
   a) said macrodevice comprises a component comprising an interconnected network of cross-linked hydrogel, which serves as dividing sidewalls separating evenly spaced microwells, wherein each microwell in the array comprises at least one side wall and is configured to encapsulate a single therapeutic microtissue; and
   b) said macrodevice comprises a component comprising therapeutic microtissues in an immuno-isolatory hydrogel that, when cross-linked, are entrapped in the microwells, and
   wherein said immuno-isolatory hydrogel component of b) interlocks with the interconnected hydrogel network component of a),
   wherein the planar biocompatible hydrogel-based macrodevice further comprises a coating of an immuno-isolatory hydrogel that encapsulates the macrodevice.

2. The planar biocompatible hydrogel-based macrodevice of claim 1, wherein the at least one side wall of each of a plurality of said microwells further comprise vascular endothelial cells.

3. The planar biocompatible hydrogel-based macrodevice of claim 1, wherein each of said microwells further comprises a peg arranged to guide the formation of a toroid-shaped microtissue.

4. The planar biocompatible hydrogel-based macrodevice of claim 1, wherein the therapeutic microtissue is toroid-shaped, and/or wherein the microtissue comprises secretory, structural or metabolic cells.

5. The planar biocompatible hydrogel-based macrodevice of claim 1, wherein the microtissues comprise cells selected from the group comprising islets of Langerhans cells, hepatocytes, bone marrow mononuclear cells, mesenchymal stem cells, mobilized peripheral blood mononuclear cells, endothelial progenitor cells, follicular cells, Leydig cells, ovarian cells, neural stem cells, human embryonic stem cells, pluripotent stem cells, induced pluripotent stem cells (iPSCs), skeletal myoblasts, cardiomyoblasts, and genetically engineered cells for growth hormone deficiency or haemophilia.

6. The planar biocompatible hydrogel-based macrodevice of claim 1, wherein the cross-linked hydrogel in a) is GelMA and/or the immuno-isolatory hydrogel in b) is alginate.

7. The planar biocompatible hydrogel-based macrodevice of claim 1, wherein each of said microwells has a width dimension in a range of 100 µm to 1000 µm.

8. The planar biocompatible hydrogel-based macrodevice of claim 4, wherein the peg has a width dimension in a range of 50 µm to 150 µm.

9. The planar biocompatible hydrogel-based macrodevice of claim 8, wherein the peg has a width dimension of 100 µm and the width dimension of each of said microwells is 500 µm.

10. The planar biocompatible hydrogel-based macrodevice of claim 1, wherein each of the said therapeutic microtissues:
a) was added to the said microwells, or
b) was generated within the said microwells from a cell suspension.

11. A method of manufacturing a planar biocompatible hydrogel-based macrodevice of claim 1, comprising the steps;
a) hydrogel prepolymer is dispensed onto a surface;
  i) a photomask with an array of holes or transparent features of specified geometry and dimensions is placed over the dispensed mixture, and
  ii) the mixture is exposed to UV light or solution containing cross-linker to cross-link an exposed portion of the hydrogel prepolymer, to form a micropatterned network of sidewalls, and
  iii) the crosslinked hydrogel pattern is rinsed to remove non-crosslinked hydrogel residue, leaving behind microwells; or
b) hydrogel prepolymer is dispensed onto a surface using 3D printing and cross-linked to form a micropatterned network of sidewalls defining microwells;
c) adding a mixture of microtissues and cross-linkable immuno-isolating hydrogel onto the crosslinked hydrogel micropattern of a) or b), and crosslinking the immuno-isolating hydrogel; or
d) adding a suspension of cells to the microwells and culturing the cells under suitable conditions until the cells aggregate into desired microtissue shape depending on the chosen cross-linked hydrogel micropattern, and
  (i) adding cross-linkable immuno-isolating hydrogel onto the cross-linked hydrogel micropattern, and
  (ii) crosslinking the immuno-isolating hydrogel,
wherein the planar biocompatible hydrogel-based macrodevice comprises a single microtissue per microwell.

12. The method of claim 11, further comprising a step e) encapsulating the macrodevice and microtissues in a biocompatible hydrogel layer, such as an alginate hydrogel layer.

13. The method of claim 11, wherein the cells are seeded onto the macrodevice at about 0.3 to 1.5 million cells per cm2 of macrodevice.

14. The method of claim 11, wherein the microtissue and/or cell suspension are selected from the group comprising islets of Langerhans cells, hepatocytes, bone marrow mononuclear cells, mesenchymal stem cells, mobilized peripheral blood mononuclear cells, endothelial progenitor cells, follicular cells, Leydig cells, ovarian cells, neural stem cells, human embryonic stem cells, pluripotent stem cells, induced pluripotent stem cells (iPSCs), skeletal myoblasts, cardiomyoblasts and genetically engineered cells for growth hormone deficiency or haemophilia.

15. The method of claim 11, wherein in step a) or b) a mixture of hydrogel prepolymer and vascular endothelial cells is dispensed onto said surface and wherein said vascular endothelial cells are embedded in the microwell side walls, and/or wherein the hydrogel prepolymer in step a) or b) is GelMA and/or the cross-linkable immuno-isolating hydrogel in step c) or d) i) is alginate.

16. A method of treatment comprising implanting into a subject in need of such treatment a planar biocompatible hydrogel-based macrodevice of claim 1.

17. The method of claim 16, wherein the planar biocompatible hydrogel-based macrodevice or the composition comprises microtissues that secrete insulin to treat diabetes.

18. The method of claim 17, wherein the microtissues comprise islet cells.

19. A kit comprising a planar biocompatible hydrogel-based macrodevice of claim 1.

20. The planar biocompatible hydrogel-based macrodevice of claim 1, wherein the coating of an immuno-isolatory hydrogel is an alginate hydrogel.

21. The planar biocompatible hydrogel-based macrodevice of claim 7, wherein each of said microwells has a width dimension of 500 µm.

22. The planar biocompatible hydrogel-based macrodevice of claim 8, wherein the peg has a width dimension of 100 µm.

23. The planar biocompatible hydrogel-based macrodevice of claim 10, wherein the cell suspension comprises about 0.5 to 1.5 million cells per $cm^2$ of macrodevice.

* * * * *